(12) United States Patent
Kodama

(10) Patent No.: US 7,323,286 B2
(45) Date of Patent: Jan. 29, 2008

(54) PHOTOSENSITIVE COMPOSITION, COMPOUND USED IN THE SAME, AND PATTERNING METHOD USING THE SAME

(75) Inventor: Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 147 days.

(21) Appl. No.: 11/108,798

(22) Filed: Apr. 19, 2005

(65) Prior Publication Data

US 2005/0238992 A1    Oct. 27, 2005

(30) Foreign Application Priority Data

Apr. 20, 2004  (JP)  ............ P. 2004-124124

(51) Int. Cl.
G03F 7/004 (2006.01)
G03F 7/30 (2006.01)

(52) U.S. Cl. .............. 430/270.1; 430/326; 430/905; 430/910

(58) Field of Classification Search .......... 430/270.1, 430/905, 910, 921, 326
See application file for complete search history.

(56) References Cited

U.S. PATENT DOCUMENTS

| 6,395,340 | B1 * | 5/2002 | Wada et al. ......... 427/410 |
| 2005/0095532 | A1 * | 5/2005 | Kodama et al. ....... 430/270.1 |
| 2006/0040203 | A1 * | 2/2006 | Kodama et al. ....... 430/270.1 |

FOREIGN PATENT DOCUMENTS

| EP | 1 406 122 A2 | 4/2004 |
| FR | 2 285 423 A1 | 4/1976 |
| JP | 10-48814 A | 2/1998 |
| JP | 2000-275845 A | 10/2000 |
| JP | 2003-302754 A | 10/2003 |
| WO | WO 02/19033 A2 | 3/2002 |
| WO | WO 03/003120 A1 | 1/2003 |
| WO | WO 03/064387 A2 | 8/2003 |

OTHER PUBLICATIONS

N.E. Shevchenko, et al., Synthesis of Methylthio-Substituted Heterocycles Using the Complex of Trifluoromethanesulfonic Anhydride with Methyl Sulfide, Chemistry of Heterocyclic Compounds, vol. 36, No. 2, 2000, pp. 137-143.

Jiri Srogl, et al., Sulfonium Salts. Participants pat Excellence in Metal-Catalyzed Carbon-Carbon Bond-Forming Reactions, J. Am. Chem. Soc., 1997, 119, pp. 12376-12377.

Klaus Hartke, et al., Sulfonioindolides and Sulfoniopyrrolides, Heterocycles, vol. 24, No. 9, 1986, pp. 2399-2402.

Klaus Hartke, et al., Indole- and Pyrrole-Sulfonium Ylides, Tetrahedron, vol. 44, No. 11, pp. 3261-3270, 1988.

Franco Bellesia, et al., The Reaction of Pyrroles with Trimethylhalosilanes-Dialkyl Sulfoxides, J. Heterocyclic Chem., vol. 30, pp. 617-621, 1993.

Hans Henning Wendebourg, et al., 3-Pyrrolylsulfonium Salts and 3-Pyrrolylsulfonium Ylides, Synthesis, No. 4, pp. 329-331, Apr. 1989.

Database CAPLUS Chemical Abstracts Service, Kuniyuki Tomita, et al., Reaction of Indoles with Succinimido-Sulfonium Salts, Database accession No. 1976: 405444, Hukusokan Kagaku Torankai Koen Yoshishu, 8th, pp. 59-63, 1975.

* cited by examiner

Primary Examiner—John S. Chu
(74) Attorney, Agent, or Firm—Sughrue Mion, PLLC

(57) ABSTRACT

A photosensitive composition, comprises (A) a sulfonium salt represented by formula (I);

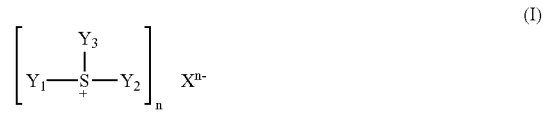

wherein $Y_1$, $Y_2$ and $Y_3$ each independently represents a nitrogen-containing heteroaryl group, an alkyl group, a cycloalkyl group, an aryl group or an alkenyl group, at least one of $Y_1$, $Y_2$ and $Y_3$ represents a nitrogen-containing heteroaryl group, and at least two of $Y_1$, $Y_2$ and $Y_3$ may combine with each other to form a ring; $X^{n-}$ represents an n-valent non-nucleophilic anion; and n represents an integer of 1 to 3.

21 Claims, No Drawings

PHOTOSENSITIVE COMPOSITION, COMPOUND USED IN THE SAME, AND PATTERNING METHOD USING THE SAME

BACKGROUND OF THE INVENTION

1. Field of the Invention

The present invention relates to a photosensitive composition that can cause reaction and change a property thereof when irradiated with an actinic ray or radiation, to a compound used in such a photosensitive composition, and to a patterning method using such a photosensitive composition. More specifically, the invention is concerned with a photosensitive comp osition usable in a process of manufacturing semiconductors such as ICs, in production of circuit boards for liquid crystal displays or thermal heads, and what is more, in other photofabrication processes, lithographic printing plates and acid-curable compositions. And the invention further relates to a compound used in the aforesaid photosensitive composition, and to a patterning method using the aforesaid photosensitive composition.

2. Description of the Related Art

A chemical amplification resist composition is a patterning material that, when irradiated with radiation, such as far-ultraviolet light, produces an acid in the areas irradiated, utilizes the acid as a catalyst to cause reaction and makes a difference in developer solubility between irradiated and unirradiated areas, thereby enabling formation of patterns on a substrate.

When KrF excimer laser is used as an exposure light source, such a chemical amplification resist composition uses as a main component a resin whose basic skeleton is poly(hydroxystyrene) principally having small absorption in the region of 248 nm; as a result, patterns of good quality are formed at high sensitivity and high resolution. Therefore, this composition forms a good system compared with the traditional naphthoquinone diazide/novolak resin system.

When a light source of shorter wavelengths, e.g., ArF excimer laser (193 nm), is used as an exposure light source, on the other hand, even the foregoing chemical amplification system is not satisfactory because compounds having aromatic groups substantially exhibit great absorption in the region of 193 nm.

Therefore, resists containing resins of alicyclic hydrocarbon structures are being developed specifically for ArF excimer laser.

As to the acid generator as another main component of a chemical amplification resist composition, a wide variety of compounds have been found, and triarylsulfonium salts, arylalkylsulfonium salts (See, e.g., JP-A-2000-275845 and JP-A-10-48814), and sulfonium salts having thiophenine structures (See, e.g., WO 02/19033 pamphlet and WO 03/3120 pamphlet) are disclosed.

However, the chemical amplification resist compositions hitherto developed are still insufficient in many respects, and it is hoped that exposure latitude and line-edge roughness will be improved.

SUMMARY OF THE INVENTION

Therefore, an object of the invention is to provide a photosensitive composition improved in exposure latitude and line-edge roughness, a compound used in such a photosensitive composition and a patterning method using such a photosensitive composition.

The aforementioned problems are solved by photosensitive compositions having constitutions described below, compounds used in these photosensitive compositions, and a patterning method using any of these photosensitive compositions.

(1) A photosensitive composition, containing (A) a sulfonium salt represented by the following formula (I);

wherein $Y_1$, $Y_2$ and $Y_3$ each independently represents a nitrogen-containing heteroaryl group, an alkyl group, a cycloalkyl group, an aryl group or an alkenyl group, at least one of $Y_1$, $Y_2$ and $Y_3$ represents a nitrogen-containing heteroaryl group, and at least two of $Y_1$, $Y_2$ and $Y_3$ may combine with each other to form a ring; $X^{n-}$ represents an n-valent non-nucleophilic anion; and n represents an integer of 1 to 3.

(2) A photosensitive composition as described in (1), wherein the nitrogen-containing heteroaryl group represented by $Y_1$, $Y_2$ or $Y_3$ is a group selected from a pyrrolyl group, an indolyl group and a carbazolyl group.

(3) A photosensitive composition as described in (1), wherein the sulfonium salt (A) represented by formula (I) is a sulfonium salt represented by the following formula (ID) or (IE);

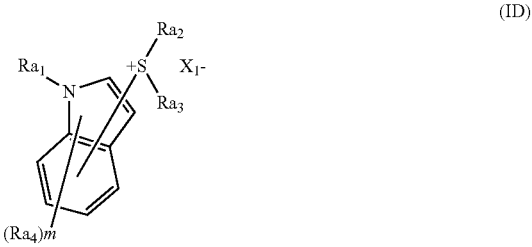

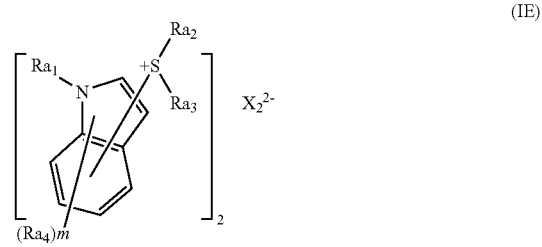

wherein $Ra_1$ represents a hydrogen atom, an alkyl group, a cycloalkyl group, an aryl group or an acyl group; $Ra_2$ and $Ra_3$ each independently represents an alkyl group, a cycloalkyl group, an aryl group or an alkenyl group, and $Ra_2$ and $Ra_3$ may combine with each other to form a ring; $Ra_4$, or each of $Ra_4$'s when m is a plural number, independently represents an organic group; $X_1^-$ represents a univalent non-nucleophilic anion; $X_2^{2-}$ represents a divalent non-nucleophilic anion; and m represents an integer of 0 to 3.

(4) A compound (A), represented by formula (I);

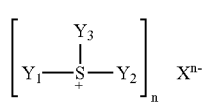

wherein $Y_1$, $Y_2$ and $Y_3$ each independently represents a nitrogen-containing heteroaryl group, an alkyl group, a cycloalkyl group, an aryl group or an alkenyl group, at least one of $Y_1$, $Y_2$ and $Y_3$ represents a nitrogen-containing heteroaryl group, and at least two of $Y_1$, $Y_2$ and $Y_3$ may combine with each other to form a ring; $X^{n-}$ represents an n-valent non-nucleophilic anion; and n represents an integer of 1 to 3.

(5) A patterning method, comprising: forming a photosensitive film with a photosensitive composition as described in any of (1) to (3); exposing the photosensitive film to light, so as to form a exposed photosensitive film; and developing the exposed photosensitive film.

In addition, the following are preferred embodiments of the invention.

(6) A compound as a sulfonium salt (A), being represented by the following formula (ID) or (IE);

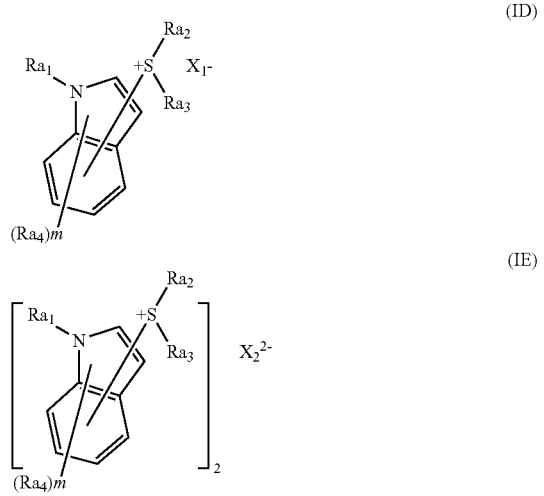

wherein $Ra_1$ represents a hydrogen atom, an alkyl group, a cycloalkyl group, an aryl group or an acyl group; $Ra_2$ and $Ra_3$ each independently represents an alkyl group, a cycloalkyl group, an aryl group or an alkenyl group, and $Ra_2$ and $Ra_3$ may combine with each other to form a ring; $Ra_4$, or each of $Ra_4$'s when m is a plural number, independently represents an organic group; $X_1^-$ represents a univalent non-nucleophilic anion; $X_2^{2-}$ represents a divalent non-nucleophilic anion; and m represents an integer of 0 to 3.

(7) A positive photosensitive composition as described in any of (1) to (3), further comprising (B) a resin capable of decomposing under action of an acid to increase its solubility in an alkali developer.

(8) A negative photosensitive composition as described in any of (1) to (3), further comprising: (D) a resin soluble in an alkali developer; and (E) an acid cross-linking agent capable of forming cross-links between molecules of the alkali developer-soluble resin under action of an acid.

(9) A positive photosensitive composition as described in (7), wherein the resin capable of decomposing under action of an acid to increase solubility in an alkali developer comprises hydroxystyrene structural units.

(10) A positive photosensitive composition as described in (7), wherein the resin capable of decomposing under action of an acid to increase solubility in an alkali developer comprises repeating units having monocyclic or polycyclic hydrocarbon structures.

(11) A positive photosensitive composition as described in (7), wherein the resin capable of decomposing under action of an acid to increase solubility in an alkali developer comprises repeating units having alcoholic hydroxyl groups.

(12) A positive photosensitive composition as described in (11), wherein the repeating units having alcoholic hydroxyl groups are repeating units which each contain at least one structure selected from monohydroxyadamantane structures, dihydroxyadamantane structures and trihydroxyadamantane structures.

(13) A positive photosensitive composition as described in (7), wherein the resin capable of decomposing under action of an acid to increase solubility in an alkali developer is a resin containing repeating units having lactone structures.

(14) A positive photosensitive composition as described in (7), wherein the resin capable of decomposing under action of an acid to increase solubility in an alkali developer is a resin having repeating units derived from methacrylic acid esters of at least one kind and repeating units derived from acrylic acid esters of at least one kind.

(15) A positive photosensitive composition as described in (7), wherein the resin capable of decomposing under action of an acid to increase solubility in an alkali developer comprises fluorine atoms in at least either of main and side chains.

(16) A positive photosensitive composition as described in (15), wherein the resin containing fluorine atoms in at least either of main and side chains has a hexafluoro-2-propanol structure.

(17) A positive photosensitive composition as described in (7) or any of (9) to (16), further containing (C) a dissolution-inhibiting compound having a molecular weight of 3,000 or below which can decompose under action of an acid to increase its solubility in an alkali developer.

(18) A positive photosensitive composition as described in (7) or any of (9) to (17), further comprising a compound selected from: (F) a basic compound; and (G) a surfactant containing at least one of a fluorine atom and a silicon atom.

(19) A positive photosensitive composition as described in any of (7), (17) and (18), wherein the resin capable of decomposing under action of an acid to increase solubility in an alkali developer has repeating units of at least one kind selected from 2-alkyl-2-adamantyl (meth)acrylates and dialkyl(1-adamantyl)methyl (meta)acrylates; lactone structure-containing repeating units of at least one kind; and repeating units of at least one kind which contain at least two hydroxyl groups per unit.

(20) A positive photosensitive composition as described in (7) or any of (9) to (19), wherein the resin capable of decomposing under action of an acid to increase solubility in an alkali developer has repeating units containing carboxyl groups.

(21) A positive photosensitive composition as described in any of (7), (17), (18) and (20), wherein the resin capable of decomposing under action of an acid to increase solubility in an alkali developer comprises: repeating units of at least one kind selected from 2-alkyl-2-adamantyl (meth)acrylates and dialkyl(1-adamantyl)methyl (meta)acrylates; and hydroxystyrene structure-containing repeating units of at least one kind.

DETAILED DESCRIPTION OF THE INVENTION

The invention is described below in detail.

Incidentally, as to the terms used for representing radicals (atomic groups) in the present specification, those without the word "substituted" or "unsubstituted" are intended to include both substituted and unsubstituted radicals. For instance, the term "an alkyl group" is intended to include not only an alkyl group having no substituent (an unsubstituted alkyl group) but also an alkyl group having a substituent (a substituted alkyl group).

The compounds represented by formula (I) are compounds capable of generating acids upon irradiation with an actinic ray or radiation, and can be used as acid generators in chemical amplification resist compositions.

A positive photosensitive composition, preferably a positive resist composition, according to the invention contains a sulfonium salt (A) represented by formula (I) and a resin (B) capable of decomposing under action of an acid to increase solubility in an alkali developer, and further, if needed, a dissolution-inhibiting compound (C) having a molecular weight of 3,000 or below and being capable of decomposing under action of an acid to increase solubility in an alkali developer.

A negative photosensitive composition, preferably a negative resist composition, according to the invention contains a sulfonium salt (A) represented by formula (I), a resin (D) that is soluble in an alkali developer, and an acid cross-linking agent (E) that can form cross-links between molecules of the alkali-developer-soluble resin under action of an acid.

[1] (A) Sulfonium Salt Represented by Formula (I)

A photosensitive composition according to the invention contains a sulfonium salt represented by the following formula (I) (hereinafter referred to as "a compound (A)", too):

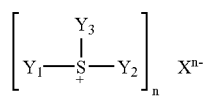

In formula (I), $Y_1$, $Y_2$ and $Y_3$ independently represent a nitrogen-containing heteroaryl group, an alkyl group, a cycloalkyl group, an aryl group or an alkenyl group, provided that at least one of $Y_1$, $Y_2$ and $Y_3$ represents a nitrogen-containing heteroaryl group.

Alternatively, at least two of $Y_1$, $Y_2$ and $Y_3$ may combine with each other to form a ring.

$X^{n-}$ represents an n-valent non-nucleophilic anion.

n represents an integer of 1 to 3.

In formula (I), it is appropriate that the nitrogen-containing heteroaryl group represented by $Y_1$, $Y_2$ or $Y_3$ be free of a nitrogen atom having an unshared electron pair that does not participate in n-conjugation. Examples of a nitrogen atom having an unshared electron pair that does not participate in j-conjugation include nitrogen atoms having partial structures represented by the following formulae:

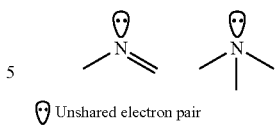

⊖ Unshared electron pair

The partial structures as illustrated above show basic character, so if compounds (A) contain such partial structures, they will neutralize an acid generated by irradiation with an actinic ray or radiation to cause a reduction in sensitivity. Conversely, compounds (A) free of such nitrogen atoms can support high sensitivity.

In the nitrogen-containing heteroaryl group represented by $Y_1$, $Y_2$ or $Y_3$, it is appropriate that one to three nitrogen atoms, preferably one or two nitrogen atoms, particularly preferably one nitrogen atom, be contained.

The nitrogen-containing heteroaryl group represented by $Y_1$, $Y_2$ or $Y_3$ is preferably a heteroaryl group having an indole structure, a pyrrole structure or a fused ring structure formed of pyrrole and an aromatic ring, far preferably a pyrrolyl group, an indolyl group or a carbazolyl group, particularly preferably an indolyl group.

The alkyl group represented by $Y_1$, $Y_2$ or $Y_3$ is preferably a 1-20C linear or branched alkyl group, with examples including a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group.

The cycloalkyl group represented by $Y_1$, $Y_2$ or $Y_3$ is preferably a 3-20C cycloalkyl group, with examples including a cyclopropyl group, a cyclobutyl group, a cyclopentyl group, a cyclohexyl group, a cyclooctyl group, an adamantyl group, a norbornyl group, an isobornyl group, a camphanyl group, a dicyclopentyl group, an α-pinyl group, a tricyclodecanyl group, a tetracyclododecyl group and an androstanyl group.

The aryl group represented by $Y_1$, $Y_2$ or $Y_3$ is preferably a 6-14C aryl group, such as a phenyl group or a naphthyl group.

The alkenyl group represented by $Y_1$, $Y_2$ or $Y_3$ is preferably a 2-15C alkenyl group, with examples including a vinyl group, an allyl group, a butenyl group and a cyclohexenyl group.

At least two of $Y_1$, $Y_2$ and $Y_3$ may combine with each other to form a ring. An example of a group formed by combining those groups is a 3-8C alkylene group. In this alkylene chain, an oxygen atom or a sulfur atom may be contained.

The nitrogen-containing heteroaryl group, the alkyl group, the cycloalkyl group, the aryl group and the alkenyl group, which $Y_1$, $Y_2$ and $Y_3$ each can represent, may further have substituents. As examples of substituents the nitrogen-containing heteroaryl group, the alkyl group, the cycloalkyl group, the aryl group and the alkenyl group may have, mention may be made of an alkyl group, a cycloalkyl group, an aryl group, an alkoxy group, an acyl group, an acyloxy group, a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group and an alkenylcarbonyl group.

Examples of a non-nucleophilic anion represented by $X^{n-}$ include a sulfonic acid anion, a carboxylic acid anion, a bis(alkylsulfonyl)amide anion, a tris(alkylsulfonyl)methide anion, $BF_4^-$, $PF_6^-$ and $SbF_6^-$, preferably organic anions containing carbon atoms, far preferably univalent or divalent organic anions.

The sulfonium salts represented by formula (I) are preferably represented by the following formula (IB) or (IC);

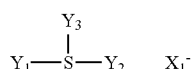
(IB)

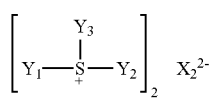
(IC)

wherein $Y_1$, $Y_2$ and $Y_3$ have the same meanings as in formula (I), respectively; $X_1^-$ represents a univalent non-nucleophilic anion; and $X_2^{2-}$ represents a divalent non-nucleophilic anion.

Examples of a univalent non-nucleophilic anion suitable as $X_1^-$ include the non-nucleophilic organic anions represented by the following structural formulae;

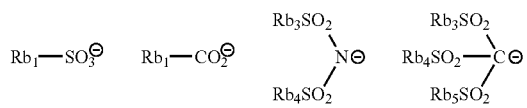

In the above structural formulae, $Rb_1$ represents an organic group. The organic group of $Rb_1$ is preferably a 1-30C organic group, with examples including an alkyl group, a cycloalkyl group, an aryl group and a group formed by combining two or more of those groups via a linkage group, such as a single bond, —O—, —CO$_2$—, —S—, —SO$_3$— or —SO$_2$N(Rc$_1$)-. Herein, Rc$_1$ represents a hydrogen atom or an alkyl group.

$Rb_3$, $Rb_4$ and $Rb_5$ each represent an organic group independently. The organic groups of $Rb_3$, $Rb_4$ and $Rb_5$ include the same groups as included in examples of $Rb_1$. Of such groups, 1-4C perfluoroalkyl groups are preferred over the others.

$Rb_3$ and $Rb_4$ may combine with each other to form a ring. The group formed by combining $Rb_3$ and $Rb_4$ is an alkylene group or an arylene group, preferably a 2-4C perfluoroalkylene group.

Examples of organic groups suitable as $Rb_1$, $Rb_3$, $Rb_4$ and $Rb_5$ include alkyl groups substituted with fluorine atoms or fluoroalkyl groups at their respective 1-positions and phenyl groups substituted with fluorine atoms or fluoroalkyl groups. By the presence of a fluorine atom or a fluoroalkyl group in the sulfonium salt, the acidity of the acid generated by irradiation with light is heightened to result in increased sensitivity.

Examples of a divalent non-nucleophilic anion suitable as $X_2^{2-}$ include the non-nucleophilic organic anions represented by the following structural formulae;

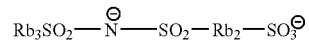

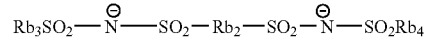

$Rb_3$ and $Rb_4$ in the above structural formulae have the same meanings as $Rb_3$ and $Rb_4$ in the univalent non-nucleophilic organic anions.

$Rb_2$ represents a divalent linkage group. Examples of a divalent linkage group suitable as $Rb_2$ include divalent linkage groups formed by abstracting one hydrogen atom each from the organic groups recited as examples of $Rb_1$.

Examples of suitable anions are illustrated below, but these examples should not be construed as limiting the scope of the invention.

$CF_3SO_3$-  $C_2F_5SO_3$-  $C_3F_7SO_3$-  $C_4F_9SO_3$-

$C_6F_{13}SO_3$-  $C_8F_{17}SO_3$-  $C_2F_5OC_2F_4SO_3$-

$C_4H_9OC_4F_8SO_3$-  $PhOC_4F_8SO_3$-

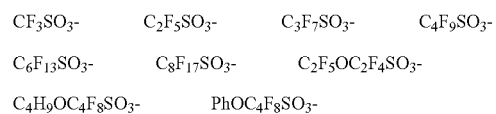

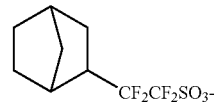

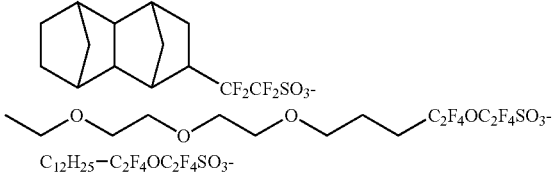

$C_{12}H_{25}$-$C_2F_4OC_2F_4SO_3$-

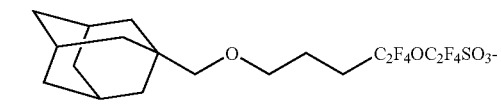

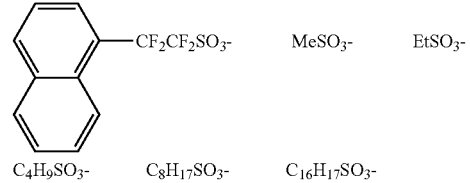

MeSO$_3$-  EtSO$_3$-

$C_4H_9SO_3$-  $C_8H_{17}SO_3$-  $C_{16}H_{17}SO_3$-

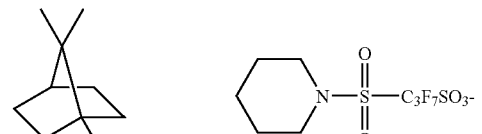

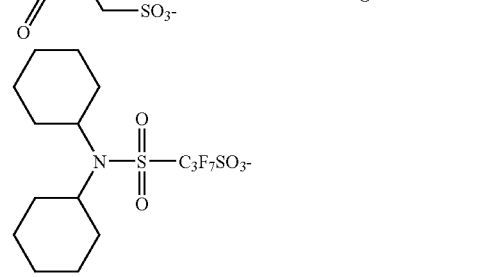

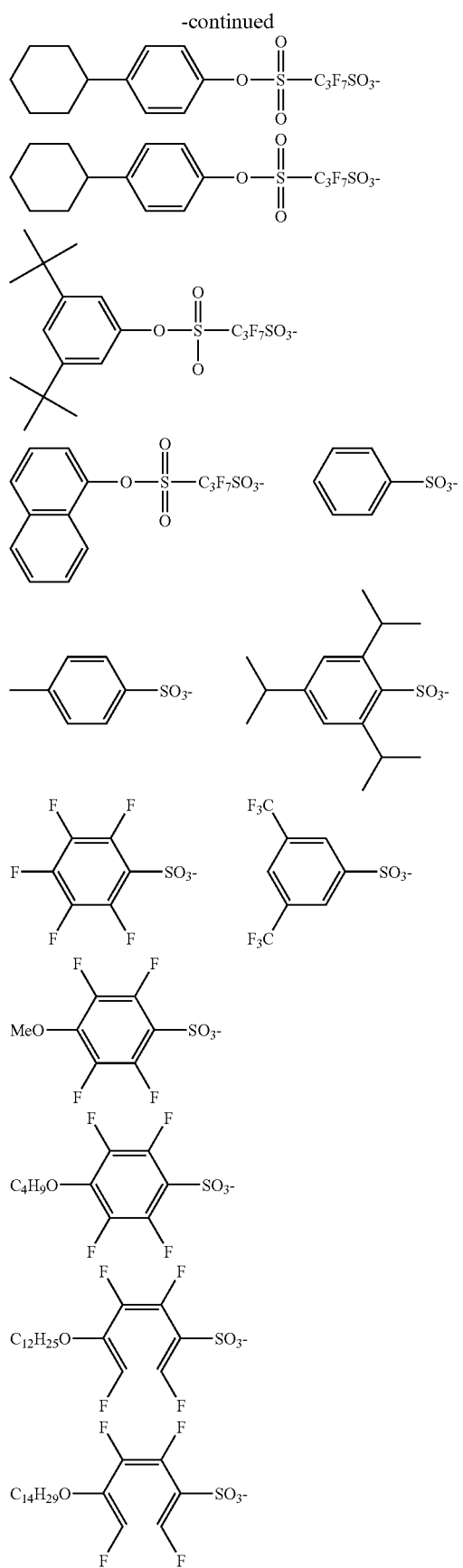

-continued

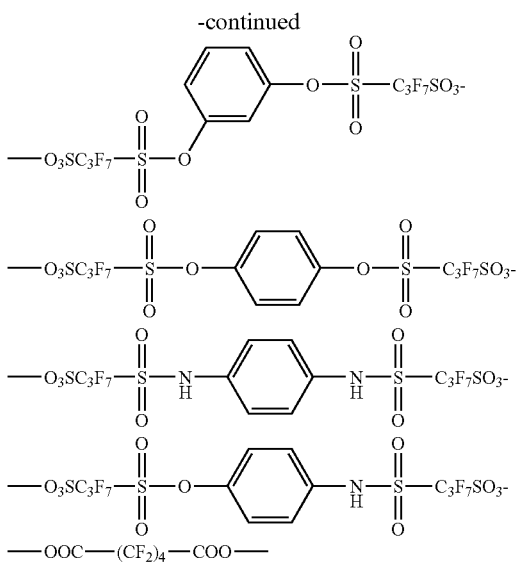

It is preferable by far that the sulfonium salts represented by formula (I) are represented by the following formula (ID) or (IE);

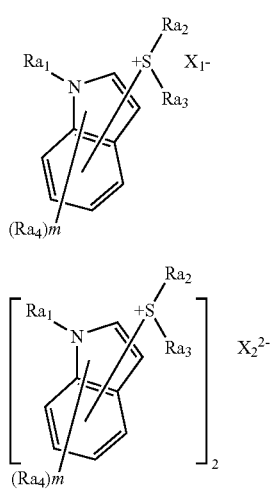

wherein $Ra_1$ represents a hydrogen atom, an alkyl group, a cycloalkyl group, an aryl group or an acyl group; $Ra_2$ and $Ra_3$ each represent an alkyl group, a cycloalkyl group, an aryl group or an alkenyl group independently, or $Ra_2$ and $Ra_3$ may combine with each other to form a ring; $Ra_4$, or each of $Ra_4$s when m is a plural number, represents an organic group; $X_1^-$ represents a univalent non-nucleophilic anion; $X_2^{2-}$ represents a divalent non-nucleophilic anion; and m represents an integer of 0 to 3.

In formulae (ID) and (IE), $X_1^-$ has the same meaning as $X_1^-$ in formula (IB).

And $X_2^{2-}$ has the same meaning as $X_2^{2-}$ in formula (IC).

Examples of an alkyl group, a cycloalkyl group, an aryl group and an alkenyl group $Ra_2$ and $Ra_3$ each can represent are the same as examples of an alkyl group, a cycloalkyl group, an aryl group and an alkenyl group $Y_1$ to $Y_3$ each can represent in formula (I).

An example of a group formed by combining $Ra_2$ and $Ra_3$ is a 3-8C alkylene group. In this alkylene chain, an oxygen atom or a sulfur atom may be contained.

The alkyl group represented by $Ra_1$ is preferably a 1-20C linear or branched alkyl group, with examples including a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group.

The cycloalkyl group represented by $Ra_1$ is preferably a 3-20C cycloalkyl group, with examples including a cyclopropyl group, a cyclobutyl group, a cyclopentyl group, a cyclohexyl group, a cyclooctyl group, an adamantyl group, a norbornyl group, an isobornyl group, a camphanyl group, a dicyclopentyl group, an α-pinyl group, a tricyclodecanyl group, a tetracyclododecyl group and an androstanyl group.

The aryl group represented by $Ra_1$ is preferably a 6-10C aryl group, such as a phenyl group or a naphthyl group.

The acyl group represented by $Ra_1$ is preferably a 2-20C acyl group, with examples including a formyl group, an acetyl group, a propanoyl group, a butanoyl group, a pivaroyl group and a benzoyl group.

Examples of an organic group of $Ra_4$ include an alkyl group (preferably containing 1 to 20 carbon atoms), a cycloalkyl group (preferably containing 3 to 20 carbon atoms), an aryl group (preferably containing 6 to 10 carbon atoms), an alkoxy group (preferably containing 1 to 20 carbon atoms), an acyl group (preferably containing 2 to 20 carbon atoms), an acyloxy group (preferably containing 2 to 20 carbon atoms), a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group and alkenylcarbonyl group.

It is especially preferable that the sulfonium salts represented by formula (I) are represented by the following formula (IF) or (IG):

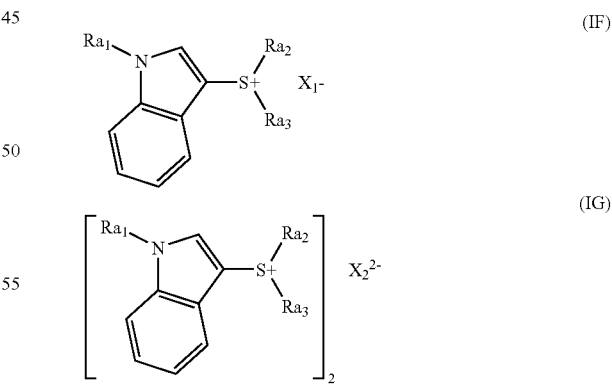

In the above formulae (IF) and (IG), $Ra_1$ represents a hydrogen atom, all alkyl group, a cycloalkyl group, an aryl group or an acyl group.

$Ra_2$ and $Ra_3$ each represent an alkyl group, a cycloalkyl group, an aryl group or an alkenyl group independently. Alternatively, $Ra_2$ and $Ra_3$ may combine with each other to form a ring.

$X_1^-$ represents a univalent non-nucleophilic anion.

And $X_2^{2-}$ represents a divalent non-nucleophilic anion.

$Ra_1$, $Ra_2$, $Ra_3$, $X_1^-$ and $X_2^{2-}$ in formulae (IF) and (IG) each have the same meanings as $Ra_1$, $Ra_2$, $Ra_3$, $X_1^-$ and $X_2^{2-}$ in formulae (ID) and (IE) each, respectively.

The nitrogen-containing heteroaryl group in each of formulae (IF) and (IG) may further have a substituent. As examples of a substituent the nitrogen-containing heteroaryl group can have, mention may be made of an alkyl group, an aryl group, a halogen atom, an alkoxy group, a hydroxyl group, an acyl group, a nitro group, a carboxyl group, an acyloxy group, alkoxycarbonyl group, a cyano group, an an alkylsulfonyl group and an arylsulfonyl group.

Suitable examples of a compound (A) are illustrated below, but these examples should not be construed as limiting the scope of the invention.

I-1
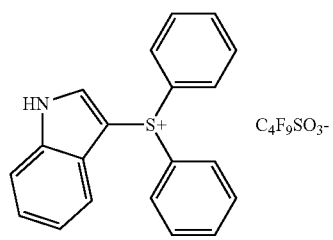

I-2
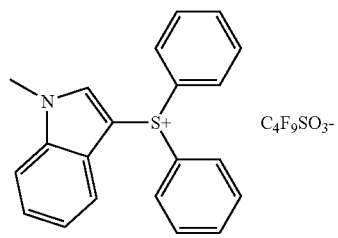

I-3
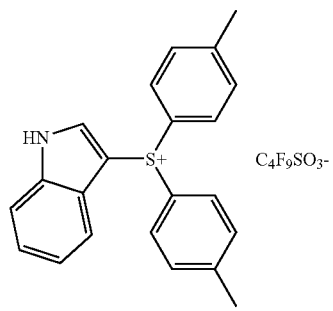

I-4
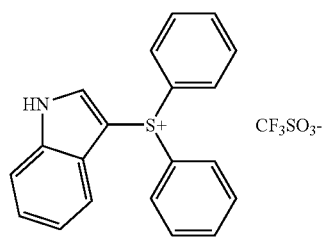

I-5
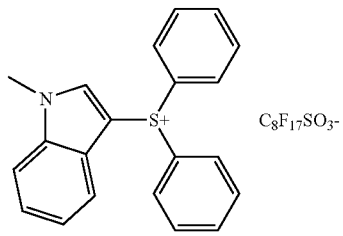

I-6
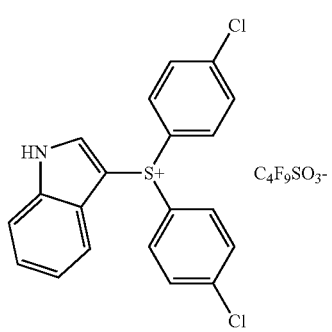

I-7
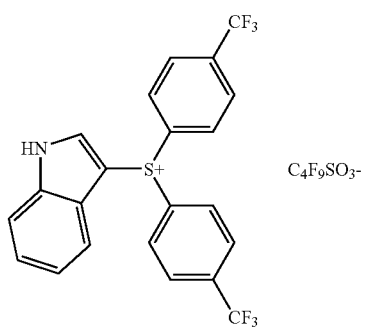

I-8
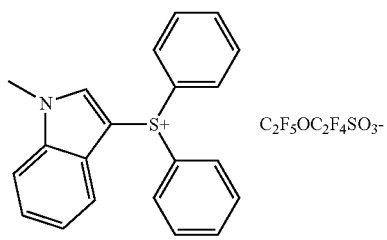

I-9
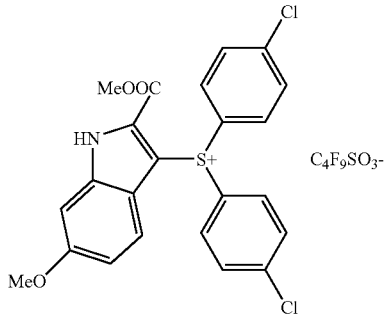

I-10
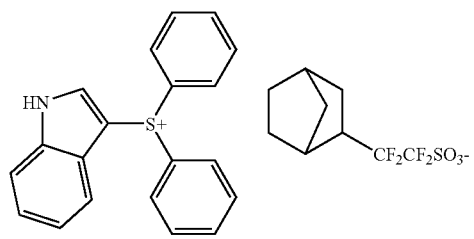
I-11
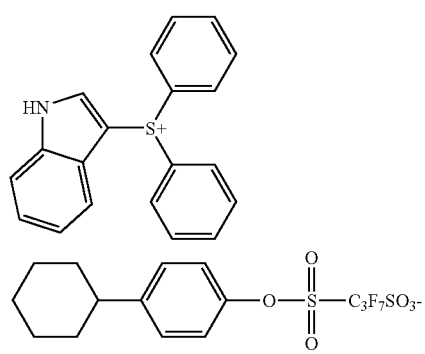
I-12
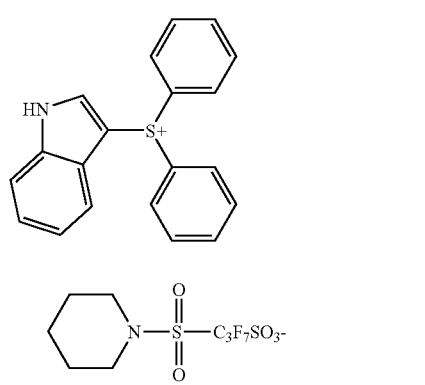
I-13
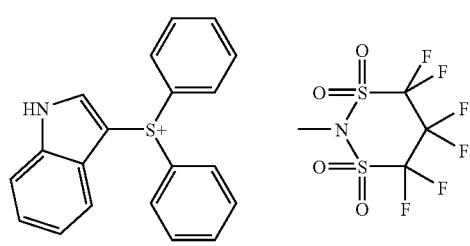
I-14
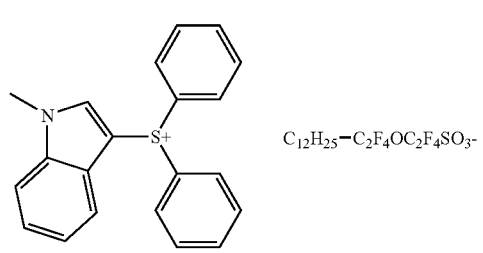
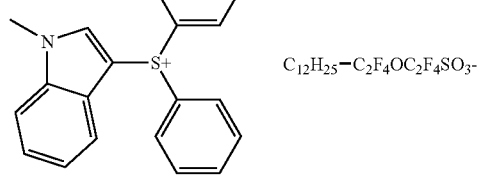
I-15
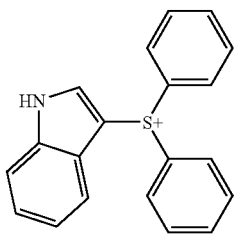
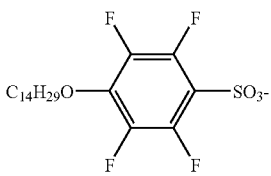
I-16
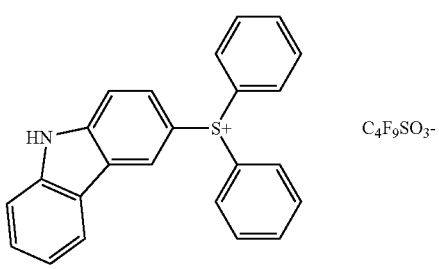
I-17
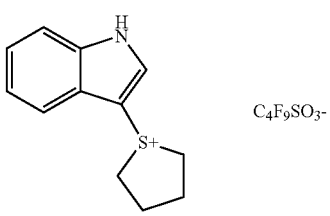
I-18
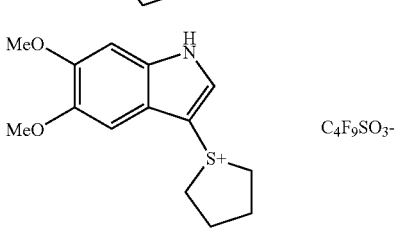
I-19
I-20
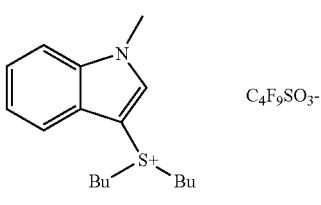

-continued
I-21 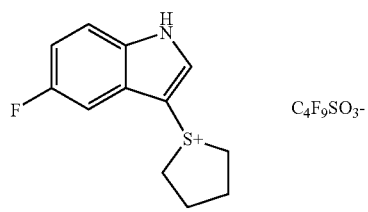 C₄F₉SO₃⁻
I-22 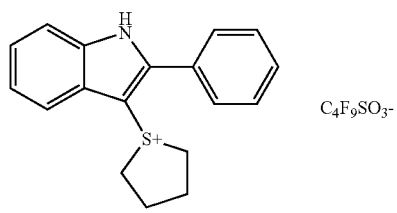 C₄F₉SO₃⁻
I-23 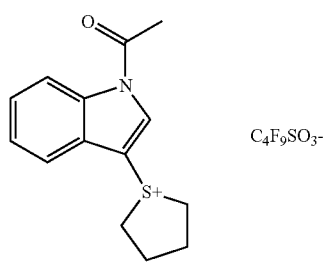 C₄F₉SO₃⁻
I-24 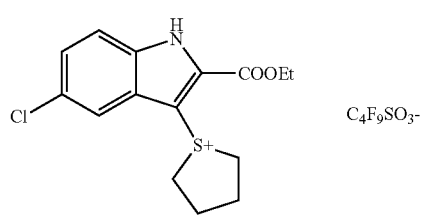 C₄F₉SO₃⁻
I-25 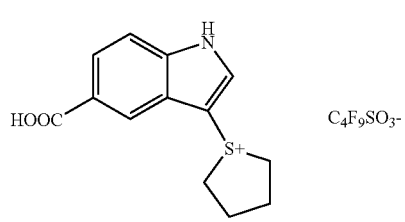 C₄F₉SO₃⁻
I-26 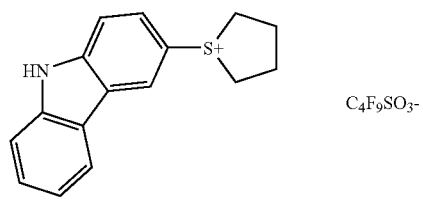 C₄F₉SO₃⁻
I-27 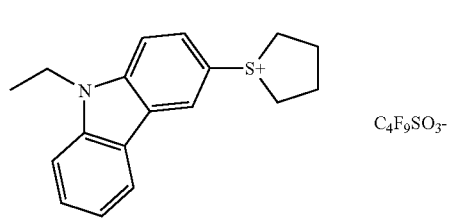 C₄F₉SO₃⁻
-continued
I-28 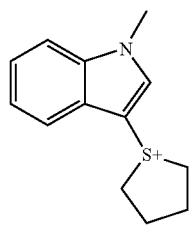
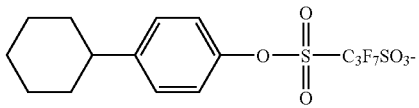
I-29 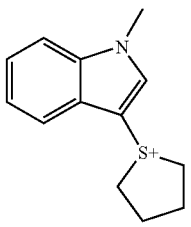
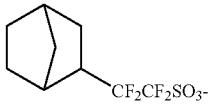
I-30 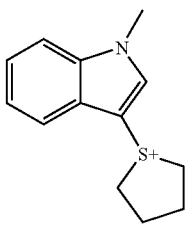 C₂F₅OC₂F₄SO₃⁻
I-31 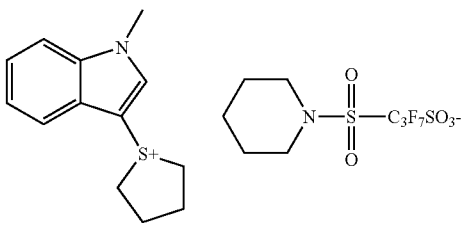
I-32 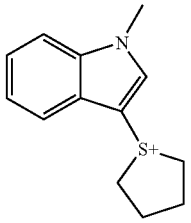

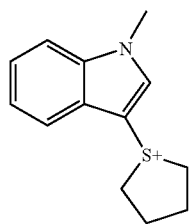 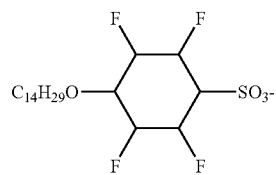 I-33
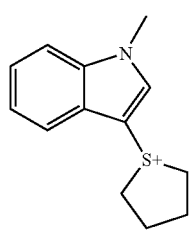 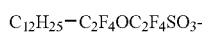 I-34
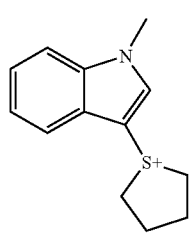  I-35
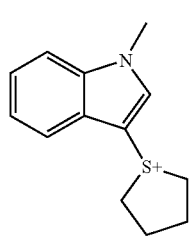  I-36
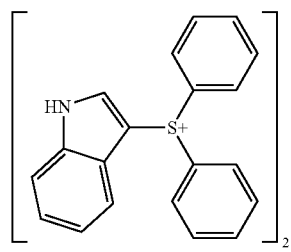 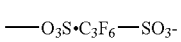 I-37
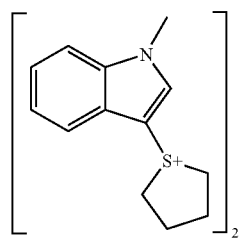 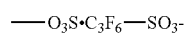 I-38
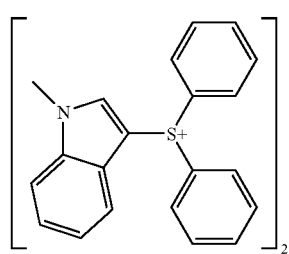 I-39
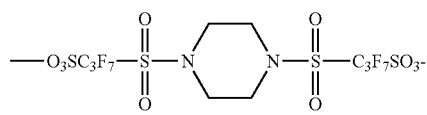
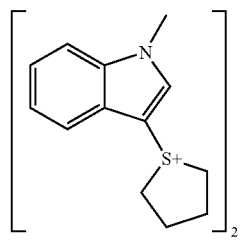 I-40
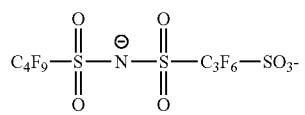
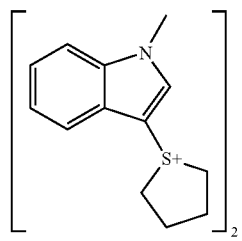 I-41
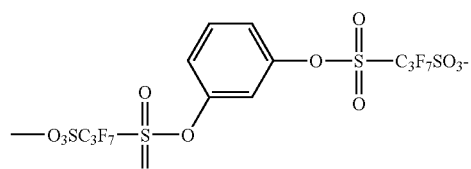
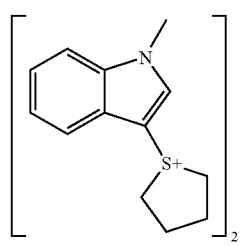 I-42
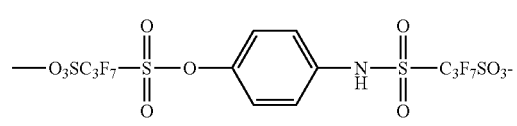

-continued
I-43
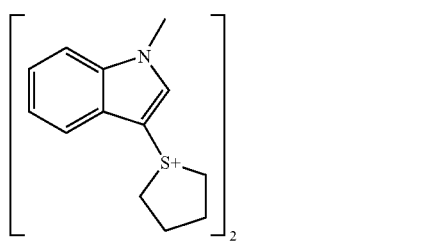
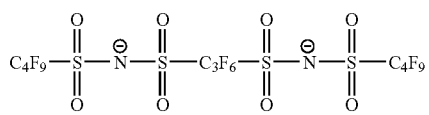
I-44
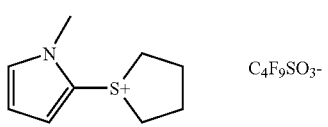 C₄F₉SO₃⁻
I-45
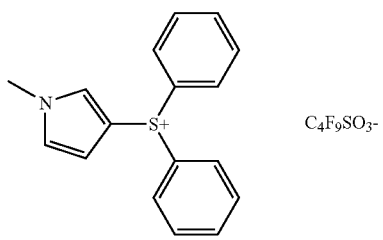 C₄F₉SO₃⁻
I-46
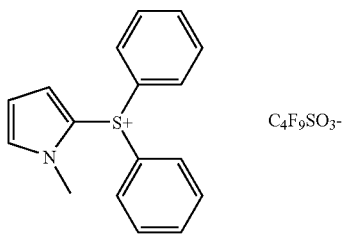 C₄F₉SO₃⁻
I-47
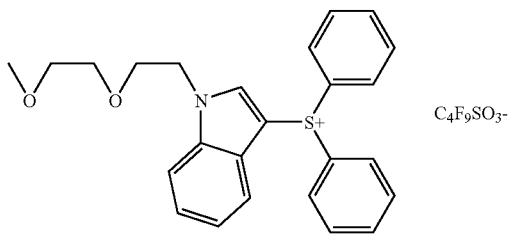 C₄F₉SO₃⁻
I-48
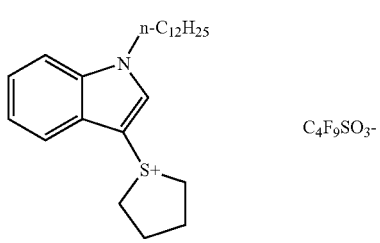 C₄F₉SO₃⁻
-continued
I-49
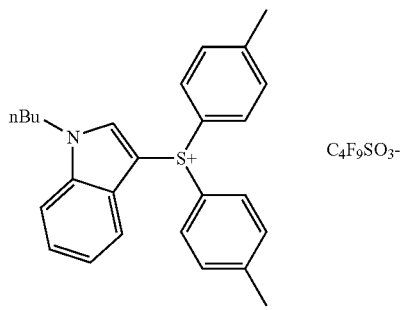 C₄F₉SO₃⁻
I-50
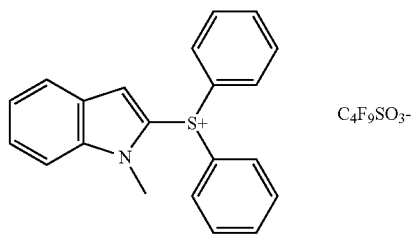 C₄F₉SO₃⁻
I-51
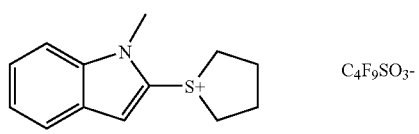 C₄F₉SO₃⁻
I-52
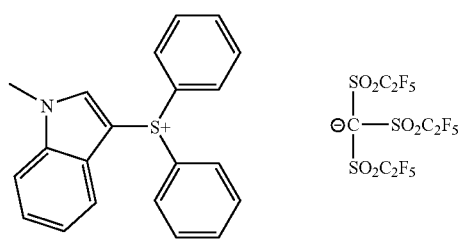
I-53
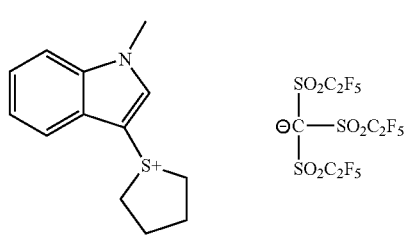
I-54
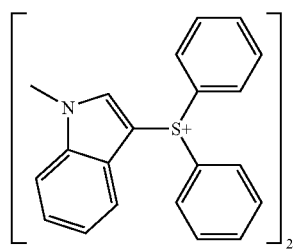
—OOC—(CF₂)₄—COO—

-continued

I-55 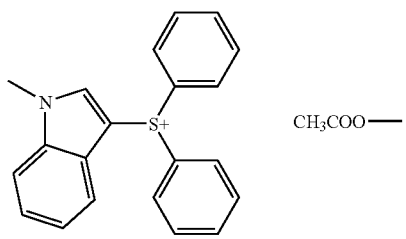 CH₃COO—

I-56 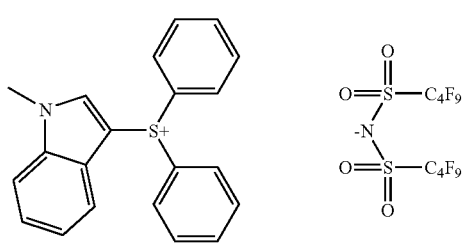

I-57 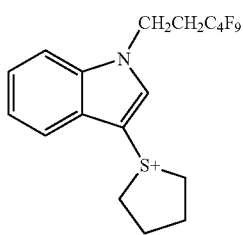 C₄F₉SO₃-

I-58 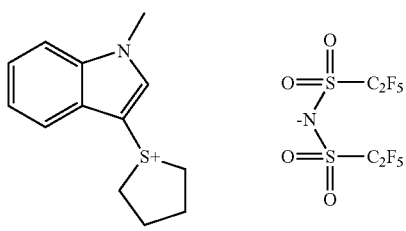

I-59 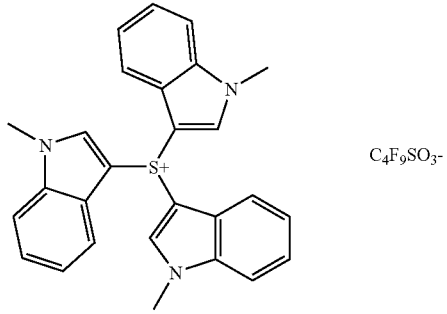 C₄F₉SO₃-

I-60 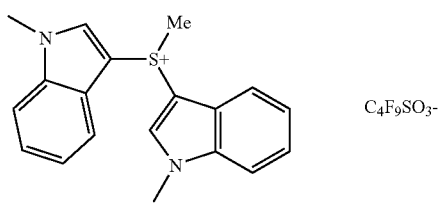 C₄F₉SO₃-

-continued

I-61 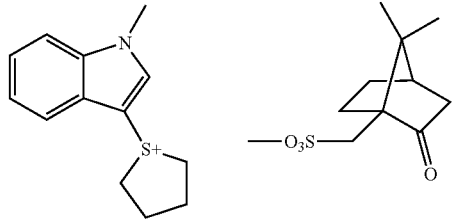

I-62 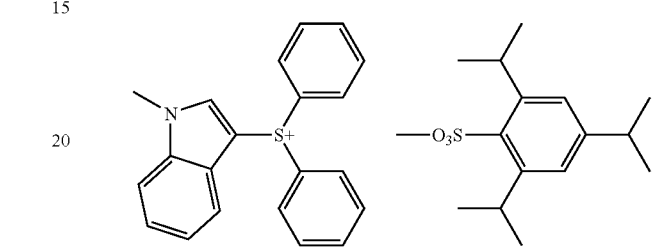

I-63 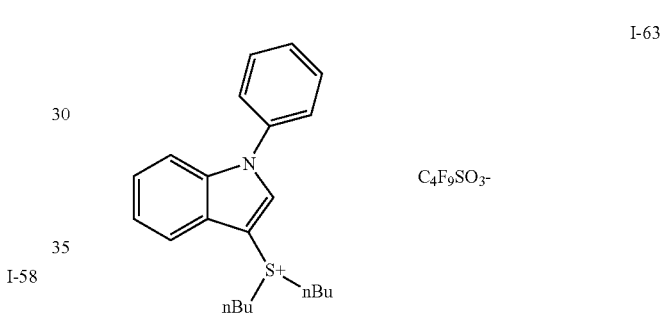 C₄F₉SO₃-

I-64 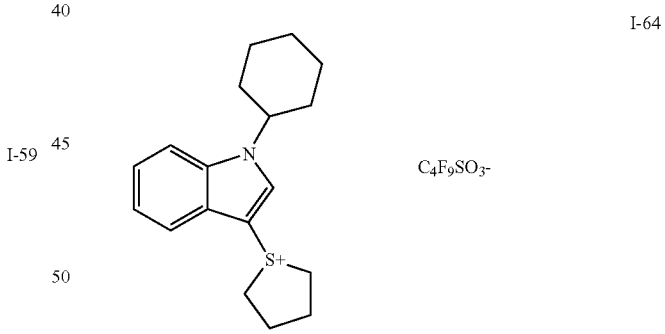 C₄F₉SO₃-

The compound (A) can be synthesized by reacting a heteroarene compound, such as indole, with a sulfoxide compound, such as diphenyl sulfoxide or tetramethylene sulfoxide, under an acid condition or in the presence of an activating reagent, such as acid anhydride, to form a sulfonium skeleton, and then by causing salt exchange with a desired anion in the resulting salt.

The suitable compound (A) content in the present photosensitive composition is from 0.1 to 20 mass %, preferably from 0.5 to 10 mass %, far preferably from 1 to 7 mass %, on a solids basis. Mass % means weight % in this specification.

(Acid Generator Used in Combination)

In addition to the compounds (A), other compounds capable of decomposing upon irradiation with an actinic ray or radiation to generate acids (acid generators) may further be used in combination.

As to the amount of other acid generators used in combination with the compound (A), the mole ratio of the compound (A) to other acid generators is generally from 100/0 to 20/80, preferably from 100/0 to 40/60, far preferably from 100/0 to 50/50.

Acid generators usable in combination with the compound (A) can be selected appropriately from photo-initiators for cationic photo-polymerization, photo-initiators for radical photo-polymerization, photo-decoloring agents for dyes, photo-discoloring agents, known compounds that can generate acids upon irradiation with an actinic ray or radiation and are used in microresist, or mixtures of two or more thereof.

Examples of such acid generators include diazonium salts, phosphonium salts, iodonium salts, imide sulfonate, oxime sulfonate, diazodisulfone, disulfone and o-nitrobenzyl sulfonate.

In addition, it is also possible to use polymers having main or side chains in which are incorporated the groups or compounds capable of generating acids when irradiated with an actinic ray or radiation. Examples of such polymers include the compounds disclosed in U.S. Pat. No. 3,849,137, German Patent No. 3,914,407, JP-A-63-26653, JP-A-55-164824, JP-A-62-69263, JP-A-63-146038, JP-A-63-163452, JP-A-62-153853 and JP-A-63-146029.

Further, the compounds capable of generating acids upon exposure to light as disclosed in U.S. Pat. No. 3,779,778 and European Patent No. 126,712 can also be used.

Of the acid generators usable in combination with the compound (A), the compounds represented by the following formulae (ZI), (ZII) and (ZIII) are preferred over the others:

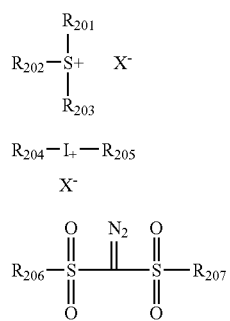

In the above formula (ZI), $R_{201}$, $R_{202}$ and $R_{203}$ each represent an organic group independently.

The number of carbon atoms in the organic group as $R_{201}$, $R_{202}$ and $R_{203}$ each is generally from 1 to 30, preferably from 1 to 20.

Alternatively, two of $R_{201}$, $R_{202}$ and $R_{203}$ may combine with each other to form a ring structure, and the ring formed may contain an oxygen atom, a sulfur atom, an ester linkage, an amide linkage or a carbonyl group.

Examples of a group formed by combining any two of $R_{201}$, $R_{202}$ and $R_{203}$ include alkylene groups (e.g., a butylene group, a pentylene group).

$X^-$ represents a non-nucleophilic anion.

Examples of a non-nucleophilic anion as $X^-$ include a sulfonic acid anion, a carboxylic acid anion, a sulfonylimide anion, a bis(alkylsulfonyl)imide anion and a tris(alkylsulfonyl)methyl anion.

The term "non-nucleophilic anion" signifies an anion whose ability to cause nucleophilic reaction is markedly low, and this anion is an anion capable of retarding the age decomposition by intramolecular nucleophilic reaction. By the presence of such anions, storage stability of the resulting resist can be enhanced.

Examples of a sulfonic acid anion usable therein include aliphatic sulfonic acid anions, aromatic sulfonic acid anions and camphor sulfonic acid anions.

Examples of a carboxylic acid anion usable therein include aliphatic carboxylic acid anions, aromatic carboxylic acid anions and aralkylcarboxylic acid anions.

The aliphatic moieties in aliphatic sulfonic acid anions may be alkyl groups or cycloalkyl groups, preferably 1-30C alkyl groups or 3-30C cycloalkyl groups. Examples of such groups include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aryl groups in aromatic sulfonic acid anions are preferably 6-14C aryl groups, with examples including a phenyl group, a tolyl group and a naphthyl group.

Examples of radicals by which the alkyl or cycloalkyl groups and the aryl groups in the aliphatic and aromatic sulfonic acid anions may be substituted include a nitro group, halogen atoms (fluorine, chlorine, bromine and iodine atoms), a carboxyl group, a hydroxyl group, an amino group, a cyano group, alkoxy groups (preferably containing 1 to 5 carbon atoms), cycloalkyl groups (preferably containing 3 to 15 carbon atoms), aryl groups (preferably containing 6 to 14 carbon atoms), alkoxycarbonyl groups (preferably containing 2 to 7 carbon atoms), acyl groups (preferably containing 2 to 12 carbon atoms) and alkoxycarbonyloxy groups (preferably containing 2 to 7 carbon atoms). The alkyl moiety or the ring structure contained in each of the groups recited above may further have an alkyl substituent (preferably containing 1 to 5 carbon atoms).

Examples of aliphatic moieties in the aliphatic carboxylic acid anions include the same alkyl and cycloalkyl groups as included in the examples of aliphatic moieties in the aliphatic sulofnic acid anions.

Examples of aryl groups in the aromatic carboxylic acid anions include the same aryl groups as included in the examples of aryl groups in the aromatic sulofilic acid anions.

The aralkyl groups in the aralkylcarboxylic acid anions are preferably 6-12C aralkyl groups, with examples including a benzyl group, a phenethyl group, a naphthylmethyl group, a naphthylethyl group and a naphthylbutyl group.

Examples of radicals by which the alkyl or cycloalkyl groups, the aryl groups and the aralkyl groups in the aliphatic carboxylic acid anions, the aromatic carboxylic acid anions and the aralkylcarboxylic acid anions may be substituted include halogen atoms, alkyl groups, cycloalkyl groups, alkoxy groups and alkylthio groups as in the case of the aromatic sulfonic acid anions.

As to the sulfonylimide anions, a saccharin anion is one example thereof.

The alkyl groups in the bis(alkylsulfonyl)imide anions and the tris(alkylsulfonyl)methyl anions are preferably 1-5C alkyl groups, with examples including a methyl group, an ethyl group, a propyl group, an isopropyl group, an n-butyl group, an isobutyl group, a sec-butyl group, a pentyl group and a neopentyl group. As examples of substituents those alkyl groups can have, mention may be made of halogen atoms, halogen-substituted alkyl groups, alkoxy groups and alkylthio groups. Of these substituents, fluoroalkyl groups are preferred over the others.

Examples of other non-nucleophilic anions include a fluorophosphate ion, a fluoroborate ion and a fluoroantimonate ion.

The non-nucleophilic anions suitable as $X^-$ include aliphatic sulfonic acid anions having fluorine substituents at the α-positions of their respective sulfonic acid moieties, aromatic sulfonic acid anions having fluorine atoms or fluorinated groups as their respective substituents, bis(alkylsulfonyl)imide anions whose alkyl moieties are substituted by fluorine atoms, and tris(alkylsulfonyl)methide anions whose alkyl moieties are substituted by fluorine atoms. Of these anions, 4-8C perfluoroaliphatic sulfonic acid anions and benzenesulfonic acid anions having fluorine atoms are preferred over the others. And the most suitable anions among them are nonafluorobutanesulfonic acid anion, perfluorooctanesulfonic acid anion, pentafluorobenzenesulfonic acid anion and 3,5-bis(trifluoromethyl)benzenesulfonic acid anion.

Examples of organic groups as $R_{201}$, $R_{202}$ and $R_{203}$ include the groups corresponding to organic groups in compounds (Z1-1), (Z1-2) and (Z1-3) described below.

The acid generator represented by formula (Z1) may be a compound having two or more of structures as represented by formula (Z1). For instance, the compound may be a compound having such a structure that at least one of $R_{201}$ to $R_{203}$ in a compound represented by formula (Z1) and at least one of $R_{201}$ to $R_{203}$ in another compound represented by formula (Z1) combine with each other.

Preferred as the component (Z1) are compounds (Z1-1), (Z1-2) and (Z1-3) described below.

The compound (Z1-1) is an arylsulfonium compound in which at least one of $R_{201}$ to $R_{203}$ in formula (Z1) is an aryl group, namely a compound containing an arylsulfonium as a cation.

In the arylsulfonium compound, all of $R_{201}$ to $R_{203}$ may be aryl groups, or at least one of $R_{201}$ to $R_{203}$ is an aryl group and the rest may be alkyl or cycloalkyl groups.

Examples of such an arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl moiety of an arylsulfonium compound is preferably a phenyl group or a naphthyl group, especially a phenyl group. When the arylsulfonium compound has two or more aryl groups, these aryl groups may be the same or different.

The alkyl or cycloalkyl group or groups the arylsulfonium compound has on an as needed basis are preferably 1-15C linear or branched alkyl groups or 3-15C cycloalkyl groups, with examples including a methyl group, an ethyl group, a propyl group, an n-butyl group, a sec-butyl group, a t-butyl group, a cyclopropyl group, a cyclobutyl group and a cyclohexyl group.

The aryl, alkyl or cycloalkyl group each of $R_{201}$ to $R_{203}$ represents may have as a substituent an alkyl group (containing, e.g., 1 to 15 carbon atoms), a cycloalkyl group (containing, e.g., 3 to 15 carbon atoms), an aryl group (containing, e.g., 6 to 14 carbon atoms), an alkoxy group (containing, e.g., 1 to 15 carbon atoms), a halogen atom, a hydroxyl group or a phenylthio group. Of these substituents, 1-12C linear and branched alkyl groups, 3-12C cycloalkyl groups and 1-12C linear, branched and cyclic alkoxy groups, especially 1-4C alkyl groups and 1-4C alkoxy groups, are preferred over the others. Any one of the three groups $R_{201}$, $R_{202}$ and $R_{203}$ may have a substituent as recited above, or all of $R_{201}$, $R_{202}$ and $R_{203}$ may have substituents as recited above. In the case where $R_{201}$, $R_{202}$ or $R_{203}$ represents an aryl group, it is preferable that such a substituent as recited above is present at the p-position of the aryl group.

Next the compounds (Z1-2) are described below.

The compounds (Z1-2) correspond to compounds of formula (Z1) wherein $R_{201}$ to $R_{203}$ each represent an organic group containing no aromatic ring. The term "aromatic ring" as used herein is intended to include aromatic rings in which hetero atoms are contained.

As to $R_{201}$ to $R_{203}$, the number of carbon atoms in an organic group containing no aromatic ring is generally from 1 to 30, preferably from 1 to 20.

Each of $R_{201}$ to $R_{203}$ is preferably an alkyl group, a cycloalkyl group, an allyl group or a vinyl group, far preferably a linear or branched 2-oxoalkyl group, a 2-oxocycloalkyl group or an alkoxycarbonylmethyl group, particularly preferably a linear or branched 2-oxoalkyl group.

Examples of alkyl and cycloalkyl groups suitable as each of $R_{201}$ to $R_{203}$ include 1-10C linear or branched alkyl groups (such as a methyl group, an ethyl group, a propyl group, a butyl group and a pentyl group) and 3-10C cycloalkyl groups (such as a cyclopentyl group, a cyclohexyl group and a norbornyl group). Of these groups, 2-oxoalkyl groups and alkoxycarbonylmethyl groups are more suitable as the alkyl group. And 2-oxocycloalkyl groups are more suitable as the cycloalkyl group.

The 2-oxoalkyl groups may be linear or branched groups, preferably having >C=O at the 2-positions of their respective alkyl moieties.

The 2-oxocycloalkyl groups preferably have >C=O at the 2-positions of their respective cycloalkyl moieties.

Suitable examples of an alkoxy moiety in the alkoxycarbonylmethyl group include 1-5C alkoxy groups (such as a methoxy group, an ethoxy group, a propoxy group, a butoxy group and a pentyloxy group).

$R_{201}$, $R_{202}$ and $R_{203}$ each may be further substituted with a halogen atom, an alkoxy group (containing, e.g., 1 to 5 carbon atoms), a hydroxyl group, a cyano group or a nitro group.

The compounds (Z1-3) are compounds represented by the following formula (Z1-3), and have phenacylsulfonium salt structures:

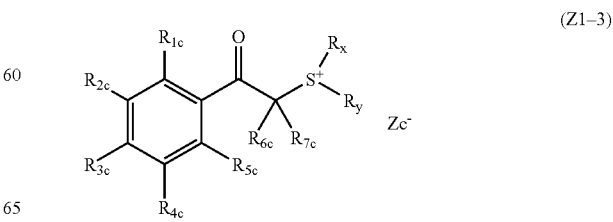

(Z1-3)

$R_{1c}$ to $R_{5c}$ independently represent a hydrogen atom, an alkyl group, a cycloalkyl group, an alkoxy group or a halogen atom.

$R_{6c}$ and $R_{7c}$ each represent a hydrogen atom, an alkyl group or a cycloalkyl group.

$R_x$ and $R_y$ independently represent an alkyl group, a cycloalkyl group, an allyl group or a vinyl group.

Any two or more of $R_{1c}$ to $R_{5c}$, $R_{6c}$ and $R_{7c}$, or $R_x$ and $R_y$ may combine with each other to form a ring structure. The group formed by combining those radicals is, e.g., a butylene group or a pentylene group. The ring structure formed may contain an oxygen atom, a sulfur atom, an ester linkage or an amide linkage.

$Z_c^-$ represents a non-nucleophilic anion, and examples thereof include the same non-nucleophilic anions as included in examples of $X^-$ in formula (Z1).

The alkyl group as each of $R_{1c}$ to $R_{7c}$ may have a linear or branched form, and examples thereof include 1-20C alkyl groups, preferably 1-12C linear and branched alkyl groups (such as a methyl group, an ethyl group, a linear or branched propyl group, a linear or branched butyl group and a linear or branched pentyl group). The cycloalkyl group as each of $R_{1c}$ to $R_{7c}$ is, e.g., a 3-8C cycloalkyl group (including a cyclopentyl group and a cyclohexyl group).

The alkoxy group as each of $R_{1c}$ to $R_{5c}$ may have a linear, branched or cyclic form, and examples thereof include 1-10C alkoxy groups, preferably 1-5C linear and branched alkoxy groups (such as a methoxy group, an ethoxy group, a linear or branched propoxy group, a linear or branched butoxy group and a linear or branched pentyloxy group), and 3-8C cyclic alkoxy groups (including a cyclopentyloxy group and a cyclohexyloxy group).

It is preferable that any of $R_{1c}$ to $R_{5c}$ is a linear or branched alkyl group, a cycloalkyl group, or a linear, branched or cyclic alkoxy group, and it is far preferable that the total number of carbon atoms in $R_{1c}$ to $R_{5c}$ is from 2 to 15. By having such radicals, the resulting compound can contribute to enhancement of solvent solubility and reduction in development of particles during storage.

Examples of an alkyl group and a cycloalkyl group $R_x$ and $R_y$ each can represent include the same groups as included in examples of an alkyl group and a cycloalkyl group $R_{1c}$ to $R_{7c}$ each can represent. Of such groups, $R_x$ and $R_y$ each prefer a 2-oxoalkyl group, a 2-oxocycloalkyl group and an alkoxycarbonylmethyl group to the others.

Examples of the 2-oxoalkyl group and the 2-oxocycloalkyl group include groups having >C=O at the 2-positions of alkyl groups and cycloalkyl groups as examples of $R_{1c}$ to $R_{7c}$ each.

Examples of the alkoxy moiety in the alkoxycarbonylmethyl group include the same alkoxy groups as $R_{1c}$ to $R_{5c}$ each can represent.

$R_x$ and $R_y$ are preferably alkyl or cycloalkyl groups that contain at least 4 carbon atoms each, preferably at least 6 carbon atoms each, far preferably at least 8 carbon atoms each.

In formulae (ZII) and (ZIII), $R_{204}$ to $R_{207}$ each represent an aryl group, an alkyl group or a cycloalkyl group independently.

The aryl group suitable as each of $R_{204}$ to $R_{207}$ is a phenyl group or a naphthyl group, preferably a phenyl group.

Suitable examples of alkyl and cycloalkyl groups each of $R_{204}$ to $R_{207}$ can represent include 1-10C linear or branched alkyl groups (such as a methyl group, an ethyl group, a propyl group, a butyl group and a pentyl group) and 3-10C cycloalkyl groups (such as a cyclopentyl group, a cyclohexyl group and a norbornyl group).

Examples of a substituent $R_{204}$ to $R_{207}$ each may have are an alkyl group (containing, e.g., 1 to 15 carbon atoms), a cycloalkyl group (containing, e.g., 3 to 15 carbon atoms), an aryl group (containing, e.g., 6 to 15 carbon atoms), an alkoxy group (containing, e.g., 1 to 15 carbon atoms), a halogen atom, a hydroxyl group and a phenylthio group.

$X^-$ represents a non-nucleophilic anion, and examples thereof include the same ones as included in examples of a non-nucleophilic anion as $X^-$ in formula (Z1).

Examples of an acid generator suitable for use in combination with the present sulfonium salts can further include compounds represented by the following formulae (ZIV), (ZV) and (ZVI):

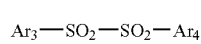

ZIV

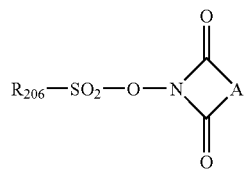

ZV

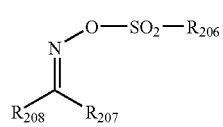

ZVI

In formula (ZIV), $Ar_3$ and $Ar_4$ each represent an aryl group independently.

In formulae (ZV) and (ZVI), $R_{206}$, $R_{207}$ and $R_{208}$ each represent an alkyl group, a cycloalkyl group or an aryl group independently.

A represents an alkylene group, an alkenylene group or an arylene group.

Of the acid generators that may be used in combination with the present sulfonium salts, the compounds represented by formulae (ZI) to (ZIII) are preferred over the others.

In addition, the acid generators suitable for the combined use are sulfonic acid-generating compounds that contain one sulfonic acid group each, preferably compounds that can generate univalent perfluoroalkanesulfonic acids or aromatic sulfonic acid-generating compounds substituted by fluorine atoms or fluorinated groups, particularly preferably sulfonium salts of univalent perfluoroalkanesulfonate ions.

Especially suitable examples of acid generators that may be used in combination with the present sulfonium salts are illustrated below.

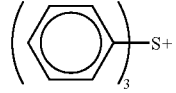 

(z1)

 

(z2)

-continued
(z3) 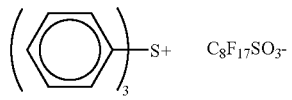 $C_8F_{17}SO_3-$
(z4) 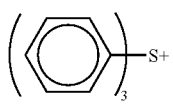 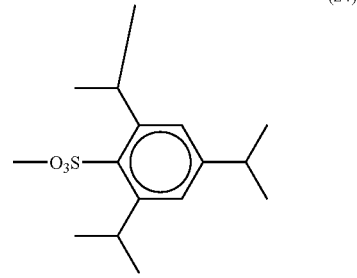
(z5) 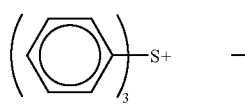 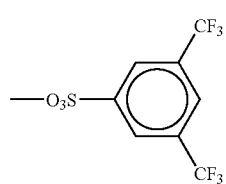
(z6) 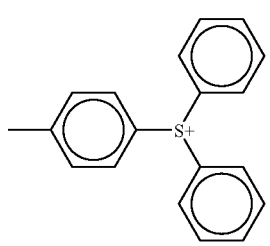 $C_8F_{17}SO_3-$
(z7) 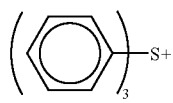 $C_{11}F_{23}COO-$
(z8) 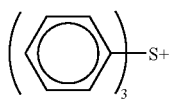 $C_2F_5-O-C_2F_4SO_3-$
(z9) 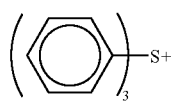 $CH_3COO-$
(z10) 
(z11) 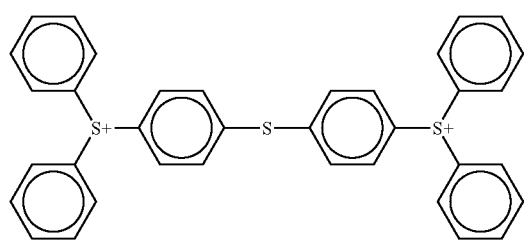 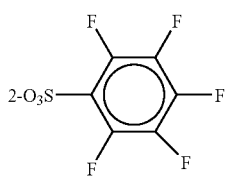
(z12) 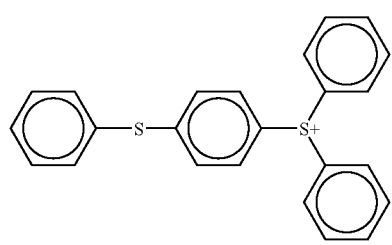 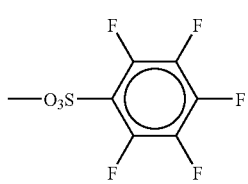
(z13) 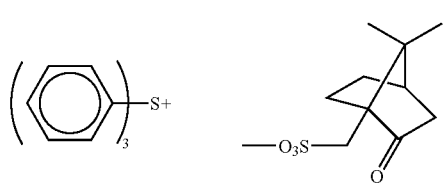 $C_4F_9SO_3-$
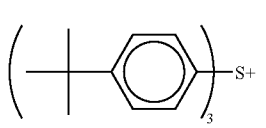

-continued
(z14) 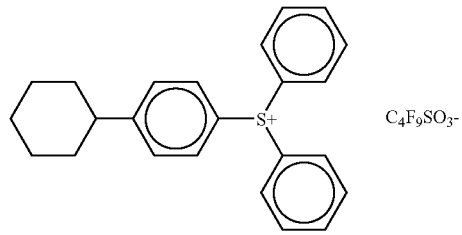
(z15) 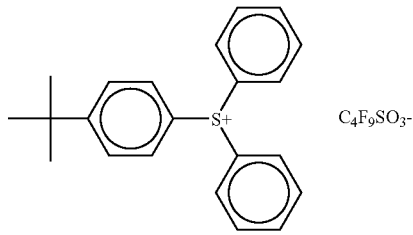
(z16) 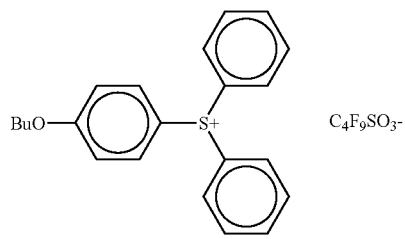
(z17) 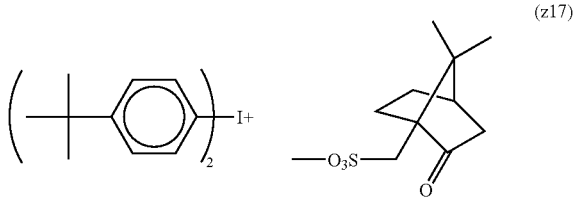
(z18) 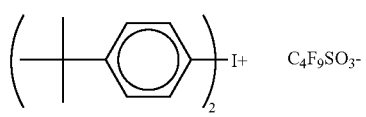
(z19) 
(z20) 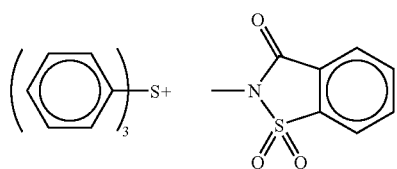
(z21) 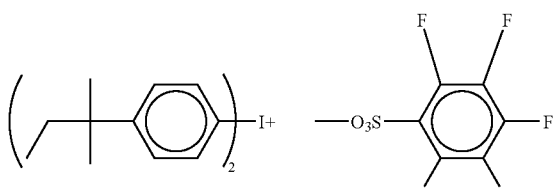
(z22) 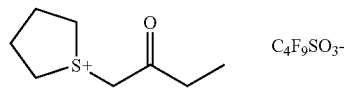
(z23) 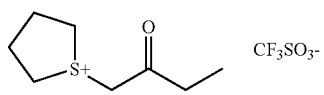 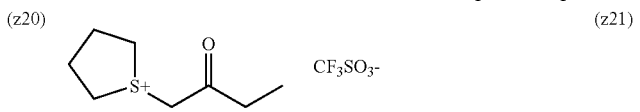
(z24) 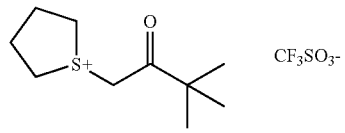
(z25) 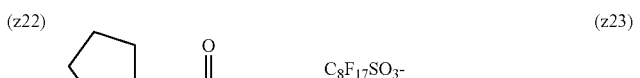
(z26) 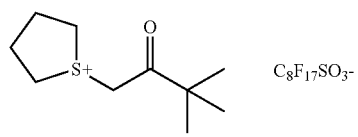
(z27) 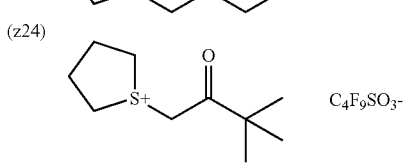
(z28) 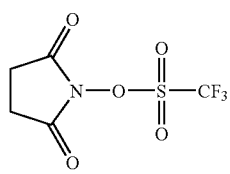
(z29) 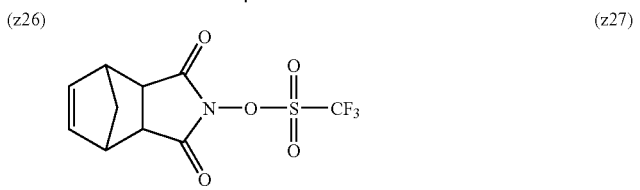
(z30) 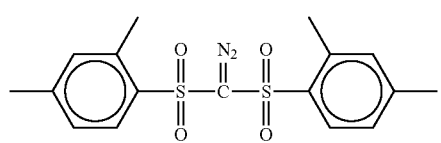
(z31) 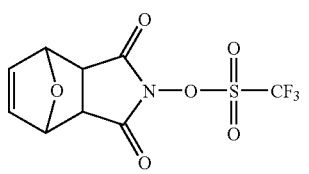 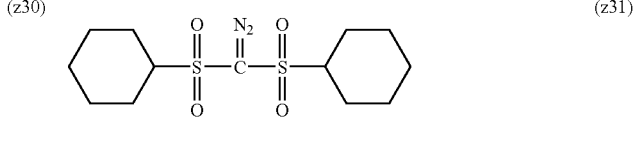

-continued
(z32) 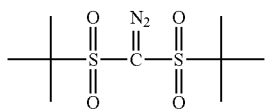
(z33) 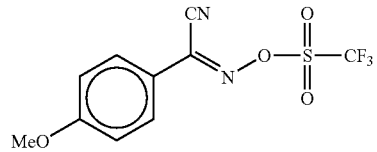
(z34) 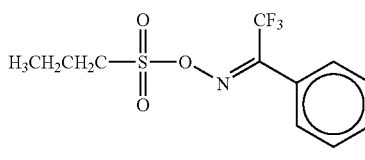
(z35) 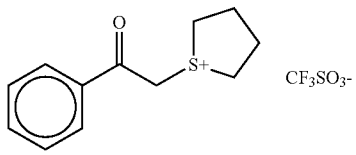
(z36) 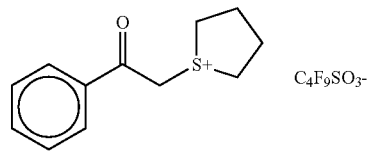
(z37) 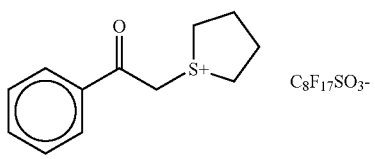
(z38) 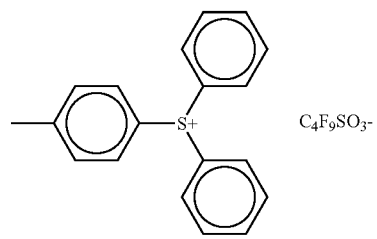
(z39) 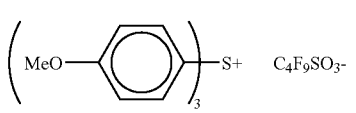
(z40) 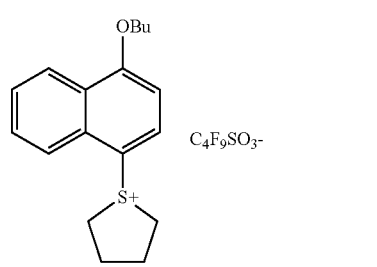
(z41) 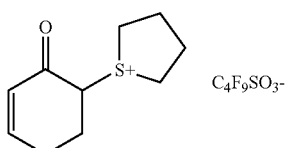
(z42) 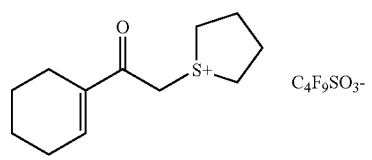
(z43) 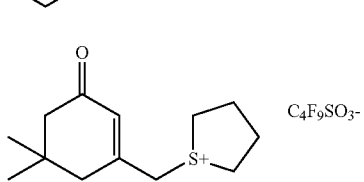
(z44) 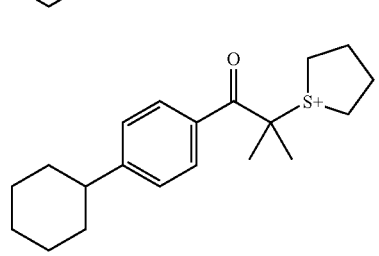
(z45) 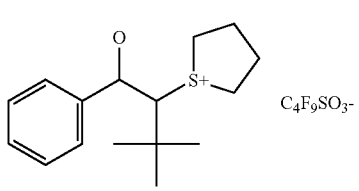
(z46) 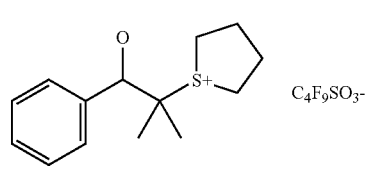

-continued
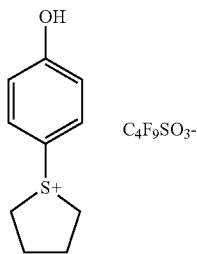 (z47)
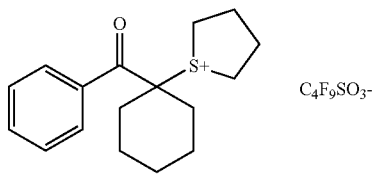 (z48)
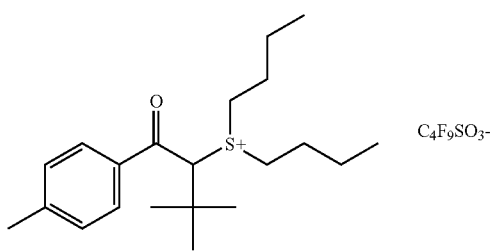 (z49)
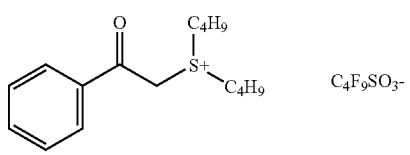 (z50)
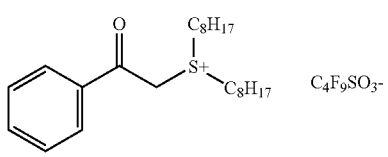 (z51)
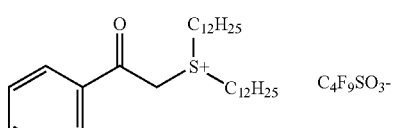 (z52)
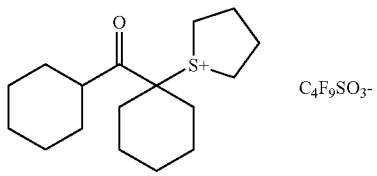 (z53)
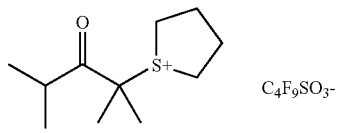 (z54)
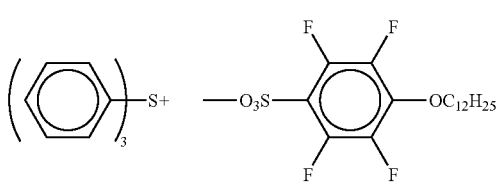 (z55)
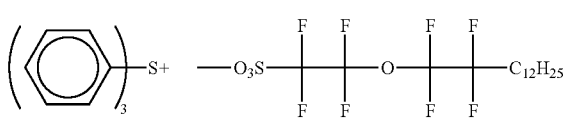 (z56)
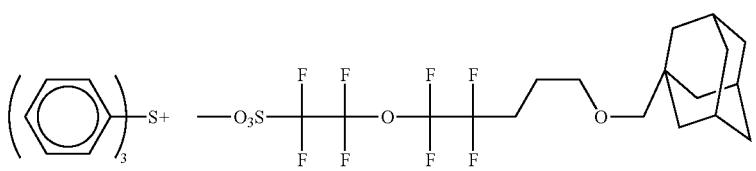 (z57)
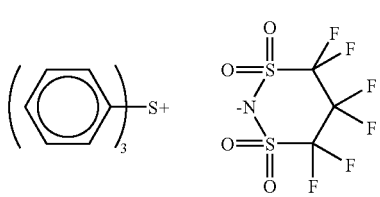 (z58)
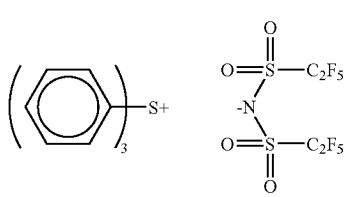 (z59)

[2] (B) Resin Capable of Decomposing Under Action of Acid to Increase its Solubility in Alkali Developer (Hereinafter Referred to as "Component (B)", too)

The resins usable in positive photosensitive compositions according to the invention, which can decompose under action of an acid to increase its solubility in an alkali developer, are resins containing groups capable of being decomposed by an acid (hereinafter referred to as "acid-decomposable groups", too) in their respective main chains, side chains, or both. Of these resins, resins having acid-decomposable groups in their respective side chains are preferred to the others.

Groups suitable as the acid-decomposable groups are groups formed by replacing hydrogen atoms of —COOH or —OH groups with acid-eliminable groups.

The acid-decomposable groups in the invention are acetal groups and tertiary ester groups.

Mother resins to which those acid-decomposable groups are to be attached as side chains are alkali-soluble resins containing —OH or —COOH groups in side chains. Examples thereof include alkali-soluble resins recited below.

These alkali-soluble resins preferably have alkali dissolution speeds of at least 170 A/sec, particularly preferably at least 330 A/sec, as measured with 0.261N tetramethylammonium hydroxide (TMAH) at 23° C. (wherein A stands for angstrom).

The alkali-soluble resins especially preferred from such a point of view are alkali-soluble resins having hydroxystyrene structural units, such as homo- and copolymers of o-, m- and p-hydroxystyrenes, hydrogenated poly(hydroxystyrene)s, halogen- or alkyl-substituted poly(hydroxystyrene)s, partial O-alkylation or O-acylation products of poly(hydroxystyrene)s, styrene-hydroxystyrene copolymers, α-methylstyrene-hydroxystyrene copolymers and hydrogenated novolak resin.

Examples of a repeating unit having an acid-decomposable group preferable in the invention include t-butoxycarbonyloxystyrene, 1-alkoxyethoxystyrene and tertiary alkyl esters of (meth)acrylic acid. Of these repeating units, 2-alkyl-2-adamantyl (meth)acrylates and dialkyl(1-adamantyl)methyl (meth)acrylates are preferred over the others.

The Component (B) used in the invention can be prepared by causing an alkali-soluble resin to react with a precursor of an acid-decomposable group, or by copolymerizing an alkali-soluble resin monomer to which an acid-decomposable group is bonded and different monomers, as disclosed in European Patent No. 254,853, JP-A-2-25850, JP-A-3-223860 and JP-A-4-251259.

Examples of Component (B) used in the invention are recited below, but these examples should not be construed as limiting the scope of the invention.
p-t-Butoxystyrene/p-hydroxystyrene copolymer,
p-(t-Butoxycarbonyloxy)styrene/p-hydroxystyrene copolymer,
p-(t-Butoxycarbonylmethyloxy)styrene/p-hydroxystyrene copolymer,
4-(t-Butoxycarbonylmethyloxy)-3-methylstyrene/4-hydroxy-3-methylstyrene copolymer,
p-(t-Butoxycarbonylmethyloxy)styrene/m-hydroxystyrene copolymer,
p-(t-Butoxycarbonylmethyloxy)styrene/p-hydroxystyrene (10% hydrogenation product) copolymer,
m-(t-Butoxycarbonylmethyloxy)styrene/m-hydroxystyrene copolymer,
o-(t-Butoxycarbonylmethyloxy)styrene/o-hydroxystyrene copolymer,
p-(Cumyloxycarbonylmethyloxy)styrene/p-hydroxystyrene copolymer,
Cumyl methacrylate/metbyl methacrylate copolymer,
4-t-Butoxycarbonylstyrene/dimethyl maleate copolymer,
Benzyl methacrylate/tetrahydropyranyl methacrylate copolymer,
p-(t-Butoxycarbonylmethyloxy)styrene/p-hydroxystyrene/ styrene copolymer,
p-t-Butoxystyrene/p-hydroxystyrene/fumaronitrile copolymer,
t-Butoxystyrene/hydroxyethyl methacrylate copolymer,
Styrene/N-(4-hydroxyphenyl)maleimide/N-(4-t-butoxycarbonyloxyphenyl)maleimide copolymer,
p-Hydroxystyrene/t-butyl methacrylate copolymer,
Styrene/p-hydroxystyrene/t-butyl methacrylate copolymer,
p-Hydroxystyrene/t-butyl acrylate copolymer,
Styrene/p-hydroxystyrene/t-butyl acrylate copolymer,
p-(t-Butoxycarbonylmetcyloxy)styrene/p-hydroxystyrene/ N-metlylmaleimide copolymer,
t-Butyl methacrylate/1-adamantylmethyl methacrylate copolymer,
p-Hydroxystyrene/t-butyl acrylate/p-acetoxystyrene copolymer,
p-Hydroxystyrene/t-butyl acrylate/p-(t-butoxycarbonyloxy) styrene copolymer,
p-Hydroxystyrene/t-butyl acrylate/p-(t-butoxycarbonylmethyloxy)styrene copolymer,

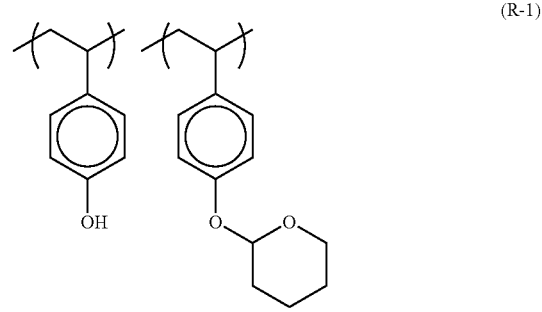
(R-1)

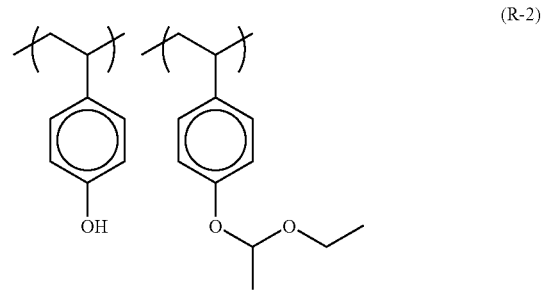
(R-2)

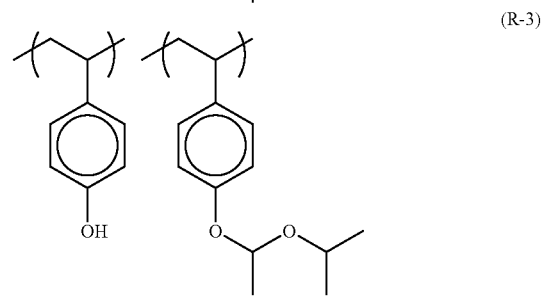
(R-3)

(R-4)
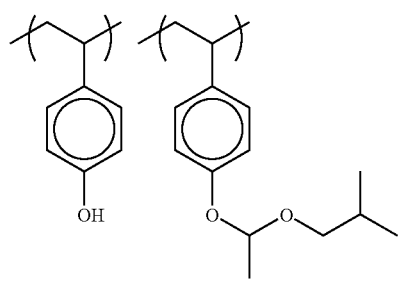
(R-5)
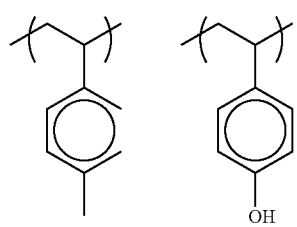
(R-6)
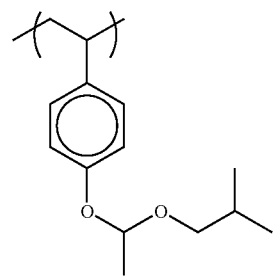
(R-7)
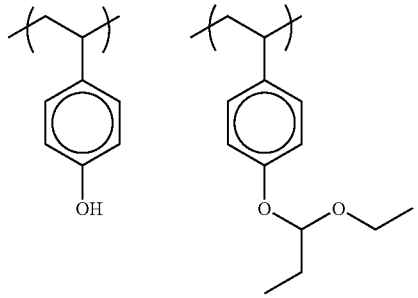
(R-8)
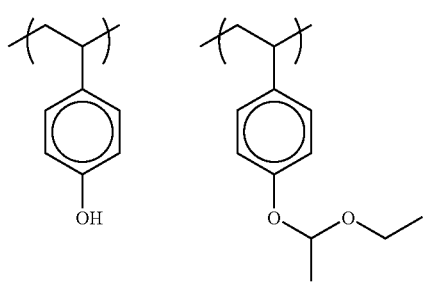
(R-9)
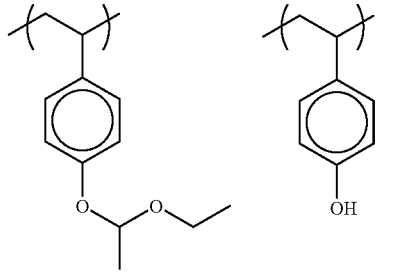

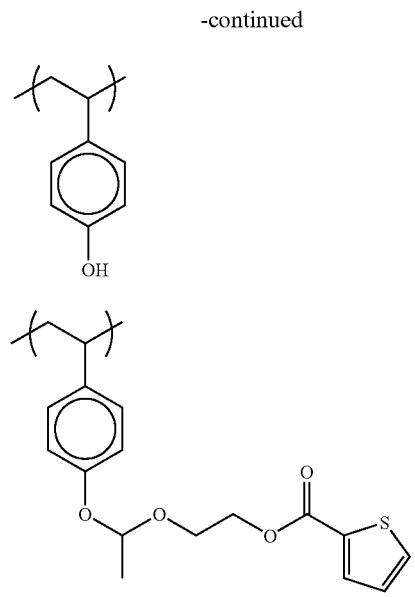
(R-10)
(R-11)
(R-12)
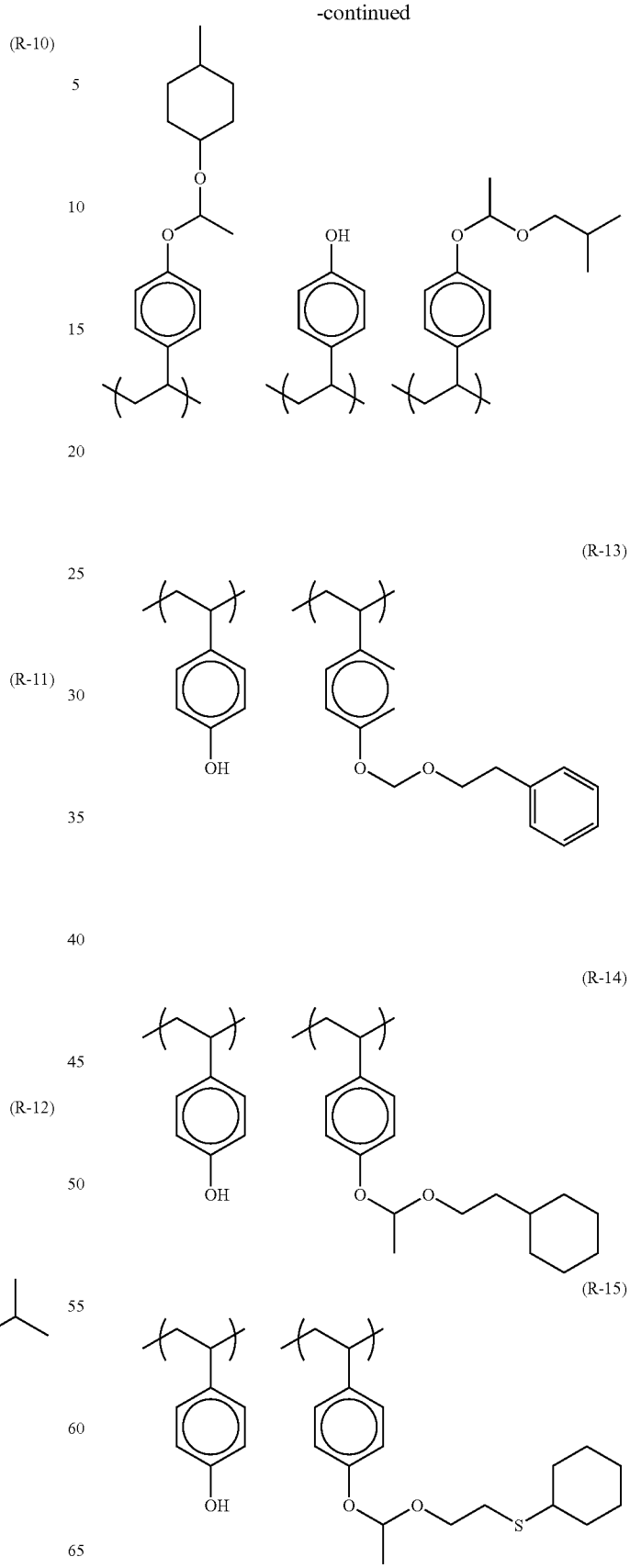
(R-13)
(R-14)
(R-15)

(R-16)
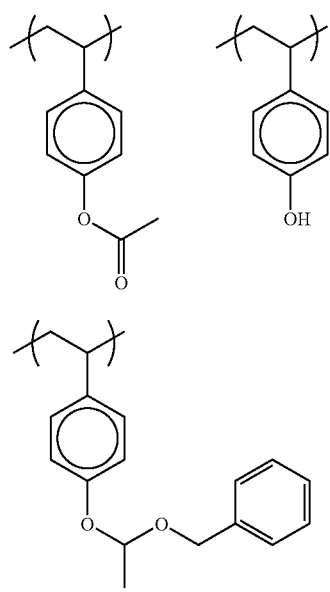
(R-18)
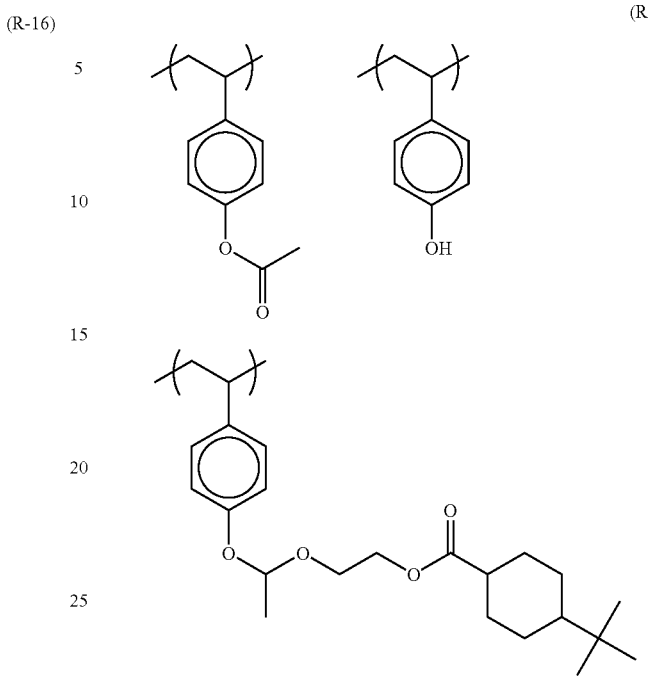
(R-17)
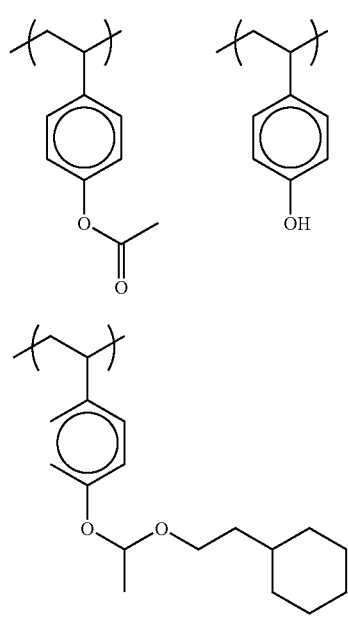
(R-19)
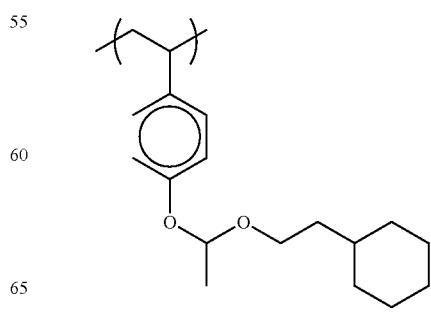

(R-20)
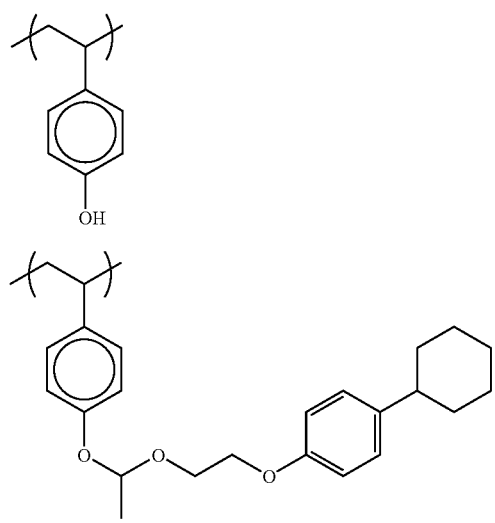
(R-21)
(R-22)
(R-23)
(R-24)
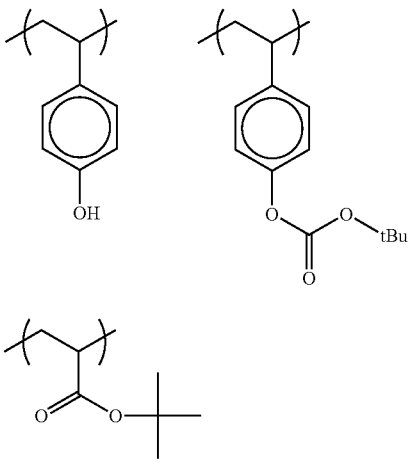
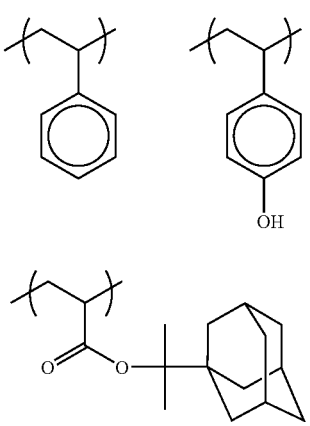
(R-25)
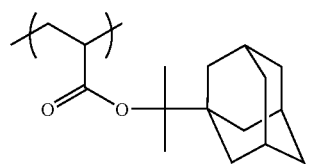
(R-26)
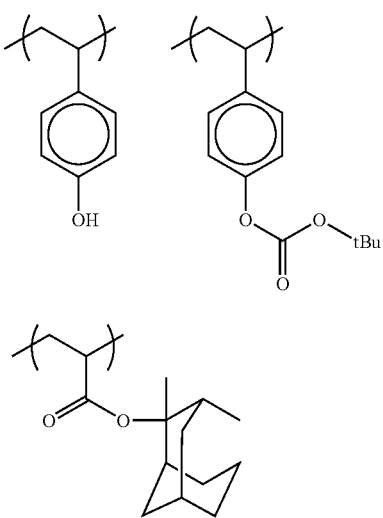

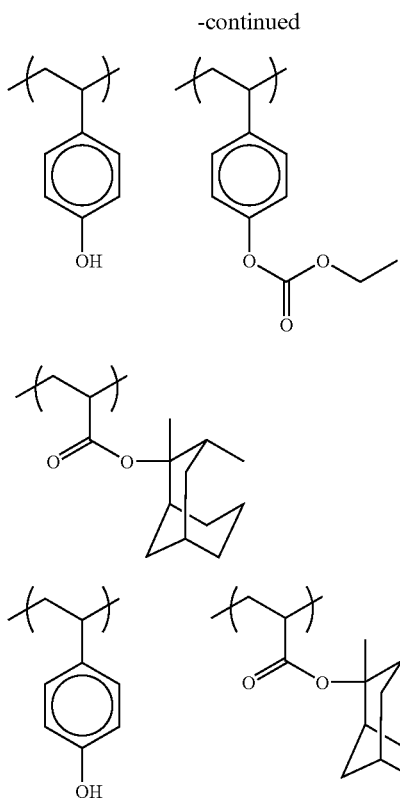

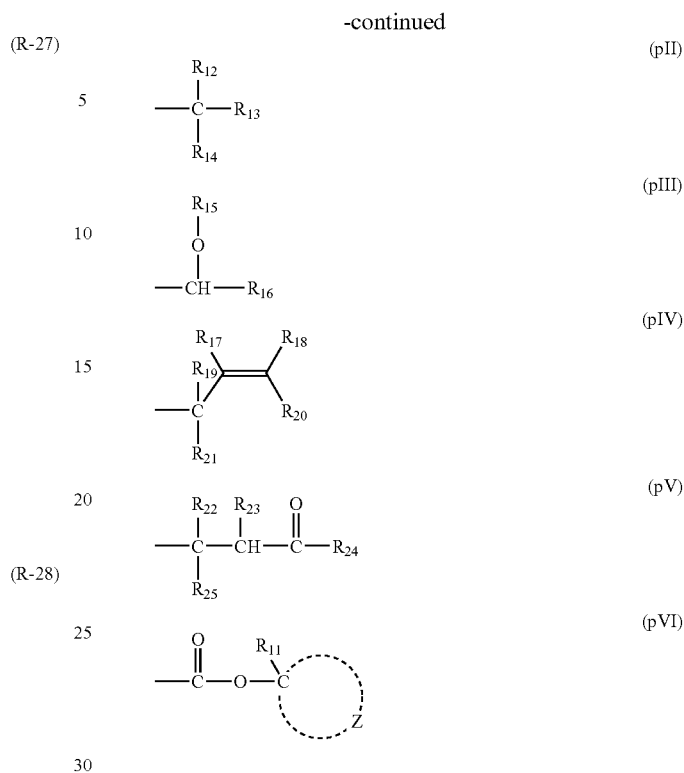

In the above examples, tBu stands for a t-butyl group.

The rate of acid-decomposable group content in each resin is expressed as B/(B+S) wherein B represents the number of acid-decomposable groups and S represents the number of alkali-soluble groups that are not protected by acid-eliminable groups. This content rate is preferably from 0.01 to 0.7, far preferably from 0.05 to 0.50, particularly preferably from 0.05 to 0.40.

In the case of irradiating the present positive photosensitive compositions with ArF excimer laser light, it is preferable that the resin of Component (B) is a resin having monocyclic or polycyclic aliphatic hydrocarbon structures and capable of decomposing under action of an acid to increase solubility in an alkali developer.

The resin having monocyclic or polycyclic aliphatic hydrocarbon structures and capable of decomposing under action of an acid to increase solubility in an alkali developer (hereinafter referred to as "alicyclic hydrocarbon-incorporated acid-decomposable resins", too) is preferably a resin containing repeating units of at least one kind selected from repeating units having as partial structures alicyclic hydrocarbon moieties represented by the following formula (pI), (pII), (pIII), (pIV), (pV) or (pVI), or repeating units represented by the following formula (II-AB):

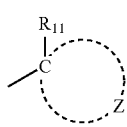

In the above formulae (pI) to (pVI), $R_{11}$ represents a methyl group, an ethyl group, an n-propyl group, an isopropyl group, an n-butyl group, an isobutyl group or a sec-butyl group, and Z represents atoms forming a cycloalkyl group together with the carbon atom.

$R_{12}$ to $R_{16}$ independently represent a 1-4C linear or branched alkyl group or a cycloalkyl group, provided that at least one of $R_{12}$, $R_{13}$ and $R_{14}$ or either $R_{15}$ or $R_{16}$ is a cycloalkyl group.

$R_{17}$ to $R_{21}$ independently represent a hydrogen atom, a 1-4C linear or branched alkyl group or a cycloalkyl group, provided that at least one of $R_{17}$ to $R_{21}$ is a cycloalkyl group. And either $R_{19}$ or $R_{21}$ represents a 1-4C linear or branched alkyl group or a cycloalkyl group.

$R_{22}$ to $R_{25}$ independently represent a hydrogen atom, a 1-4C linear or branched alkyl group or a cycloalkyl group, provided that at least one of $R_{22}$ to $R_{25}$ is a cycloalkyl group. Alternatively, $R_{23}$ and $R_{24}$ may combine with each other to form a ring.

In formula (II-AB), $R_{11}'$ and $R_{12}'$ independently represent a hydrogen atom, a cyano group, a halogen atom, or an alkyl group.

Z' represents atoms forming an alicyclic structure together with the bonded two carbon atoms (C—C) and.

The formula (II-AB) is preferably the following formula (II-A) or (II-B):

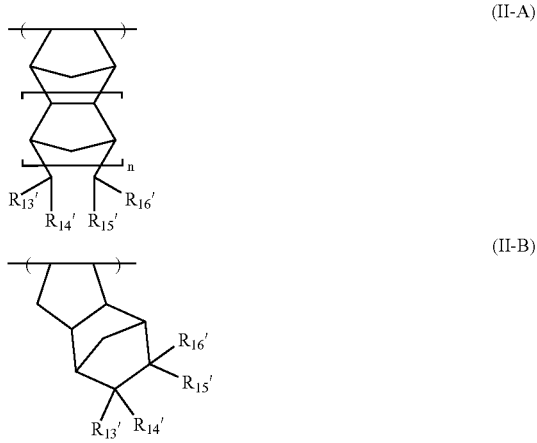

In formulae (II-A) and (II-B), $R_{13}'$ to $R_{16}'$ independently represent a hydrogen atom, a halogen atom, a cyano group, —COOH, —COOR$_5$, a group decomposing through action of an acid, —C(=O)—X—A'—R$_{17}'$, an alkyl group or a cycloalkyl group.

Herein, R$_5$ represents an alkyl group or a cycloalkyl group, or —Y illustrated below.

X represents an oxygen atom, a sulfur atom, —NH—, —NHSO$_2$— or —NHSO$_2$NH—.

A' represents a single bond, or a divalent linkage group.

Therein, at least two of the groups $R_{13}'$ to $R_{16}'$ may combine with each other to form a ring. n represents 0 or 1.

$R_{17}'$ represents —COOH, —COOR$_5$, —CN, a hydroxyl group, an alkoxy group, —CO—NH—R$_6$, —CO—NH—SO$_2$—R$_6$, or —Y illustrated below.

R$_6$ represents an alkyl group or a cycloalkyl group.

The group —Y is as follows:

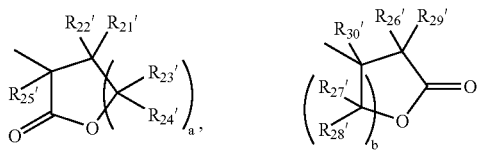

Herein, $R_{21}'$ to $R_{30}'$ independently represent a hydrogen atom, or an alkyl group. a and b are each 1 or 2.

In formulae (pI) to (pVI), the alkyl group represented by each of $R_{12}$ to $R_{25}$ is a 1-4C linear or branched alkyl group. Examples of such an alkyl group include a methyl group, an ethyl group, an n-propyl group, an isopropyl group, an n-butyl group, an isobutyl group, a sec-butyl group and a t-butyl group.

Examples of a substituent the alkyl group may have include a 1-4C alkoxy group, a halogen atom (e.g., fluorine, chlorine, bromine, iodine), an acyl group, an acyloxy group, a cyano group, a hydroxyl group, a carboxyl group, an alkoxycarbonyl group and a nitro group.

The cycloalkyl group represented by each of $R_{11}$ to $R_{25}$ or formed by combining Z with the carbon atoms may be monocyclic or polycyclic. Specifically, such a cycloalkyl group may have any of monocyclic, bicyclic, tricyclic and tetracyclic structures and contain at least 5 carbon atoms.

Further, it is preferable that the number of carbon atoms constituting the cyclic structure be from 6 to 30, particularly from 7 to 25. These cycloalkyl groups may have substituents.

Suitable examples of such cycloalkyl groups include an adamantyl group, a noradamantyl group, a decaline residue, a tricyclodecanyl group, a tetracyclododecanyl group, a norbornyl group, a sedorol group, a cyclohexyl group, a cycloheptyl group, a cyclooctyl group, a cyclodecanyl group and a cyclododecanyl group. Of these groups, an adamantyl group, a decaline residue, a norbornyl group, a sedorol group, a cyclohexyl group, a cycloheptyl group, a cyclooctyl group, a cyclodecanyl group and a cyclododecanyl group are preferred over the others.

Examples of substituents those cycloalkyl groups may have include an alkyl group, a halogen atom, a hydroxyl group, an alkoxy group, a carboxyl group and an alkoxycarbonyl group. As the alkyl group, a lower alkyl group such as a methyl group, an ethyl group, a propyl group, an isopropyl group or a butyl group is suitable. Preferably, the alkyl group is a group selected from methyl, ethyl, propyl or isopropyl group. Examples of the alkoxy group include 1-4C alkoxy groups, such as a methoxy group, an ethoxy group, a propoxy group and a butoxy group. As examples of substituents the alkyl group, the alkoxy group and the alkoxycarbonyl group may further have, mention may be made of a hydroxyl group, a halogen atom and an alkoxy group.

The structures represented by formulae (pI) to (pVI) in the resins can be used for alkali-soluble group protection. Examples of an alkali-soluble group include various groups known in this technical field.

Examples of an alkali-soluble group used for the protection include carboxyl, sulfo, phenol and thiol groups, preferably carboxyl and sulfo groups.

Suitable examples of alkali-soluble groups protected by the structures represented by formulae (pI) to (pVI) in the present resins include structures formed by replacing hydrogen atoms of carboxyl groups with the structures represented by formulae (pI) to (pVI).

As the repeating units having alkali-soluble groups protected by structures represented by formulae (pI) to (pVI), repeating units represented by the following formula (pA) are preferred:

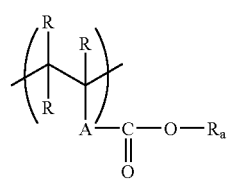

Herein, each R represents a hydrogen atom, a halogen atom, or a 1-4C linear or branched alkyl group. And the three R groups may be the same or different.

A represents a single bond, a single group selected from alkylene groups, an ether group, a thioether group, a carbonyl group, an ester group, an amide group, a sulfonamide group, an urethane group or an urea group, or a combination of at least two of these groups.

Ra represents any of the groups represented by formulae (pI) to (pVI).

The most suitable repeating units of those represented by formula (pA) are repeating units derived from 2-alkyl-2-adamantyl (meth)acrylate and dialkyl(1-adamantyl)methyl (meth)acrylate.

Examples of a repeating unit represented by formula (pA) are illustrated below.

(In the strucural formulas illustrated below, Rx is H, CH$_3$ or CF$_3$)

1
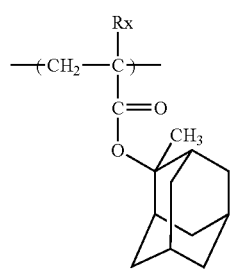

2
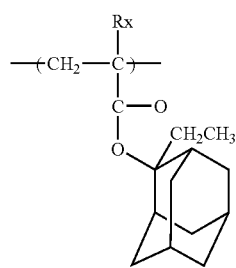

3
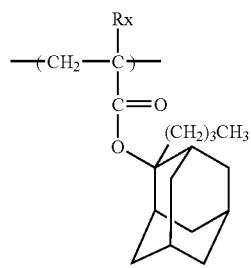

4
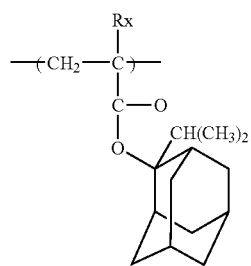

-continued

5
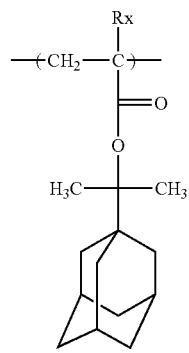

6
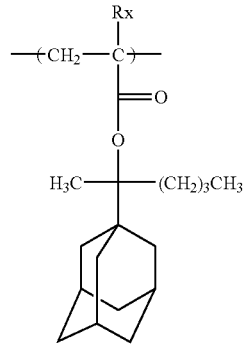

7
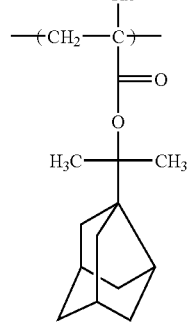

8
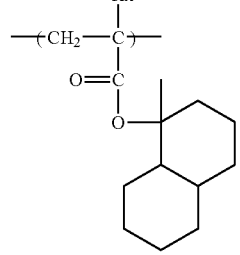

9
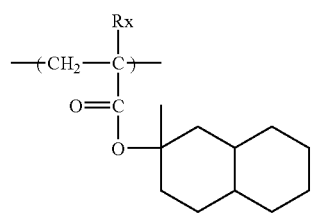

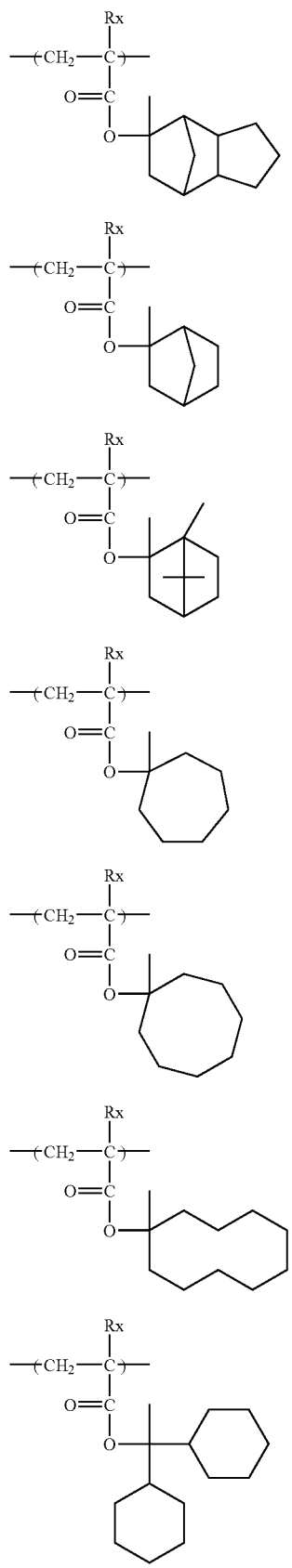
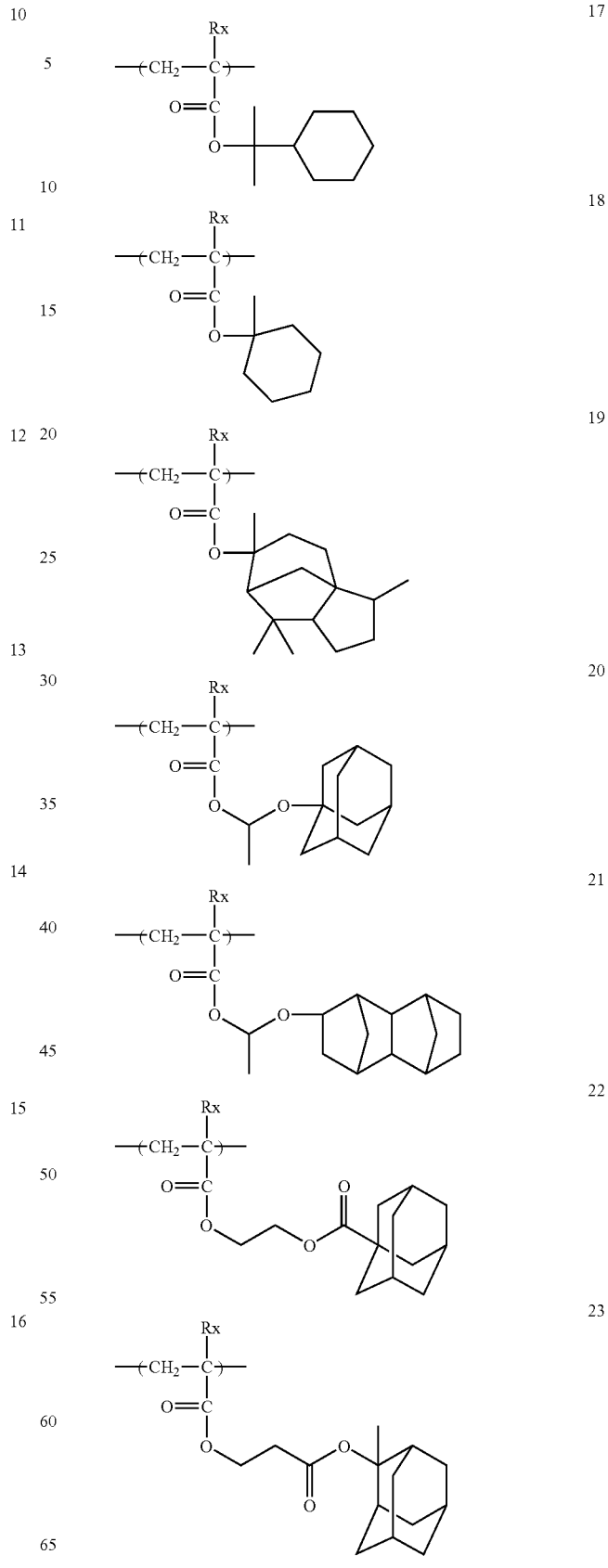

In formula (II-AB), $R_{11}'$ and $R_{12}'$ independently represent a hydrogen atom, a cyano group, a halogen atom, or an alkyl group.

Z' represents atoms forming an alicyclic structure in which the bonded two carbon atoms (C—C) are contained.

The halogen atom represented by $R_{11}'$ and $R_{12}'$ each can be a chlorine, bromine, fluorine or iodine atom.

The alkyl group represented by $R_{11}'$ and $R_{12}'$ each is suitably a 1-10C linear or branched alkyl group, preferably a 1-6C linear or branched alkyl group, particularly preferably a methyl group, an ethyl group, a propyl group, an isopropyl group, an n-butyl group, an isobutyl group, a sec-butyl group or a t-butyl group.

These alkyl groups each can have a substituent, such as a hydroxyl group, a halogen atom, a carboxyl group, an alkoxy group, an acyl group, a cyano group or an acyloxy group. Examples of the halogen atom include chlorine, bromine, fluorine and iodine atoms. Examples of the alkoxy group include 1-4C alkoxy groups, such as methoxy, ethoxy, propoxy and butoxy groups. Examples of the acyl group include a formyl group and an acetyl group. And an example of the acyloxy group is an acetoxy group.

The atoms for forming an alicyclic structure represented by Z' are atoms forming repeating unfits having unsubstituted or substituted alicyclic hydrocarbon groups in the resin. In particular, the atoms forming a bridged alicyclic structure to constitute bridged alicyclic hydrocarbon repeating units are preferred.

Examples of a skeleton of the alicyclic hydrocarbon formed include the same skeletons as those of the aliphatic hydrocarbon groups $R_{12}$ to $R_{25}$ may represent in formulae (pI) to (pVI).

Substituents may be attached to the skeletons of the alicyclic hydrocarbons formed. Examples of such substituents include $R_{13}'$ to $R_{16}'$ in formulae (II-A) and (II-B) each.

Of the repeating units having the bridged alicyclic hydrocarbons as mentioned above, the repeating units represented by formulae (II-A) and (II-B) are preferred over the others.

In the alicyclic hydrocarbon-incorporated acid-decomposable resins relating to the invention, each acid-decomposable group may be contained in the group —C(=O)—X-A'-$R_{17}'$, or as a substituent of Z' in formula (II-AB).

The structure of such an acid-decomposable group is represented by —C(=O)—$X_1$—$R_0$.

Examples of $R_0$ in the formula include tertiary alkyl groups, such as a t-butyl group and a t-amyl group, an isobornyl group, 1-alkoxyethyl groups, such as a 1-ethoxyethyl group, a 1-butoxyethyl group, a 1-isobutoxyethyl group and a 1-cyclohexyloxyethyl group, alkoxymethyl groups, such as a 1-methoxymethyl group and a 1-ethoxymethyl group, 3-oxoalkyl groups, a tetrahydropyranyl group, a tetrahydrofuranyl group, trialkylsilyl ester groups, 3-oxocyclohexyl ester groups, a 2-methyl-2-adamantyl group and mevalonic lactone residues. $X_1$ has the same meaning as X mentioned above.

The halogen atom $R_{13}'$ to $R_{16}'$ each can represent is a chlorine, bromine, fluorine or iodine atom.

The alkyl group each of $R_5$, $R_6$, $R_{13}'$ to $R_{16}'$ and $R_{21}'$ to $R_{30}'$ can represent is suitably a 1-10C linear or branched alkyl group, preferably a 1-6C linear or branched alkyl group, particularly preferably a methyl group, an ethyl group, a propyl group, an isopropyl group, an n-butyl group, an isobutyl group, a sec-butyl group or a t-butyl group.

The cycloalkyl group each of $R_5$, $R_6$ and $R_{13}'$ to $R_{16}'$ can represent is a monocyclic cycloalkyl group or a bridged cycloalkyl group, with examples including a cycloproypl group, a cyclopentyl group, a cyclohexyl group, an adamantyl group, a 2-methyl-2-adamantyl group, a norbornyl group, a bornyl group, an isobornyl group, a tricyclodecanyl group, a dicyclopentenyl group, a norbornane epoxy group, a menthyl group, an isomenthyl group, a neomenthyl group and a tetracyclododecanyl group.

The ring that can be formed by at least two of $R_{13}'$ to $R_{16}'$ being combined includes 5-12C rings, such as a cyclopentene, a cyclohexene, a cycloheptane and a cyclooctane.

The alkoxy group $R_{17}'$ can represent includes 1-4C alkoxy groups, such as a methoxy group, an ethoxy group, a propoxy group and a butoxy group.

Examples of a substituent each of the alkyl, cycloalkyl and alkoxy groups recited above can further have include a hydroxyl group, a halogen atom, a carboxyl group, an alkoxy group, an acyl group, a cyano group, an acyloxy group, an alkyl group and a cycloalkyl group. Examples of the halogen atom include a chlorine atom, a bromine atom, a fluorine atom and an iodine atom. Examples of the alkoxy group include 1-4C alkoxy groups, such as a methoxy group, an ethoxy group, a propoxy group and a butoxy group. Examples of the acyl group include a formyl group and an acetyl group, and an example of the acyloxy group is an acetoxy group.

In addition, examples of the alkyl group and those of the cycloalkyl group include the same ones as recited above.

Examples of the divalent linkage group represented by A' include an alkylene group, an ether group, an thioether group, a carbonyl group, an ester group, an amide group, a sulfonamide group, a urethane group, a urea group and combinations of two or more of the above-recited ones.

In an alicyclic hydrocarbon-incorporated acid-decomposable resin relating to the invention, groups capable of decomposing under action of an acid may be contained in repeating units of at least one kind selected from repeating units which each have a partial structure containing an alicyclic hydrocarbon group represented by any of formulae (pI) to (pVI), the repeating units represented by formula (II-AB), or repeating units derived from a copolymerizing component as mentioned below.

The various substituents each of $R_{13}'$ to $R_{16}'$ in formula (II-A) or (II-B) can represent may also become substituents for the atoms Z' in formula (II-AB), which form an alicyclic structure or a bridged alicyclic structure, can have.

Examples of repeating units represented by formula (II-A) and formula (II-B), respectively, are illustrated below, but these examples should not be construed as limiting the scope of the invention.

[II-1]

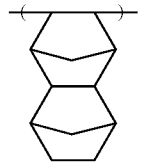

[II-2]

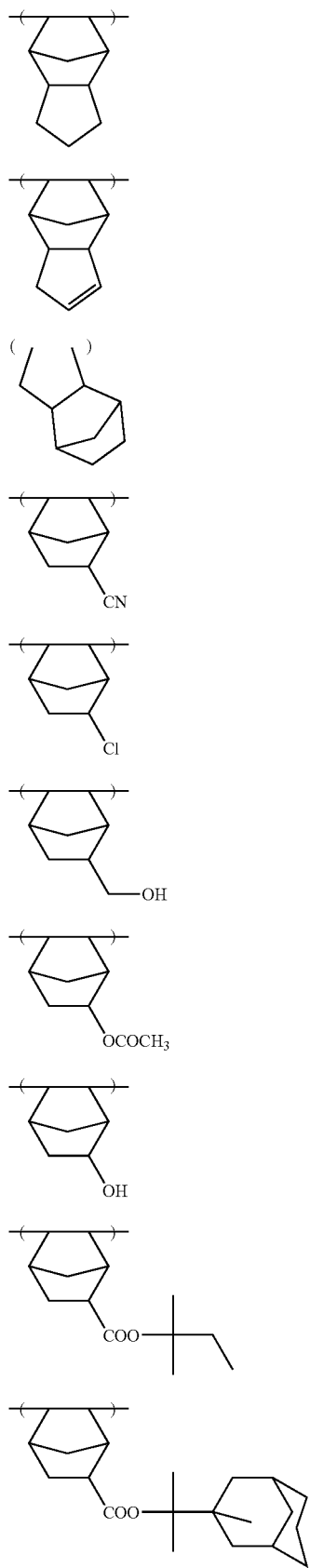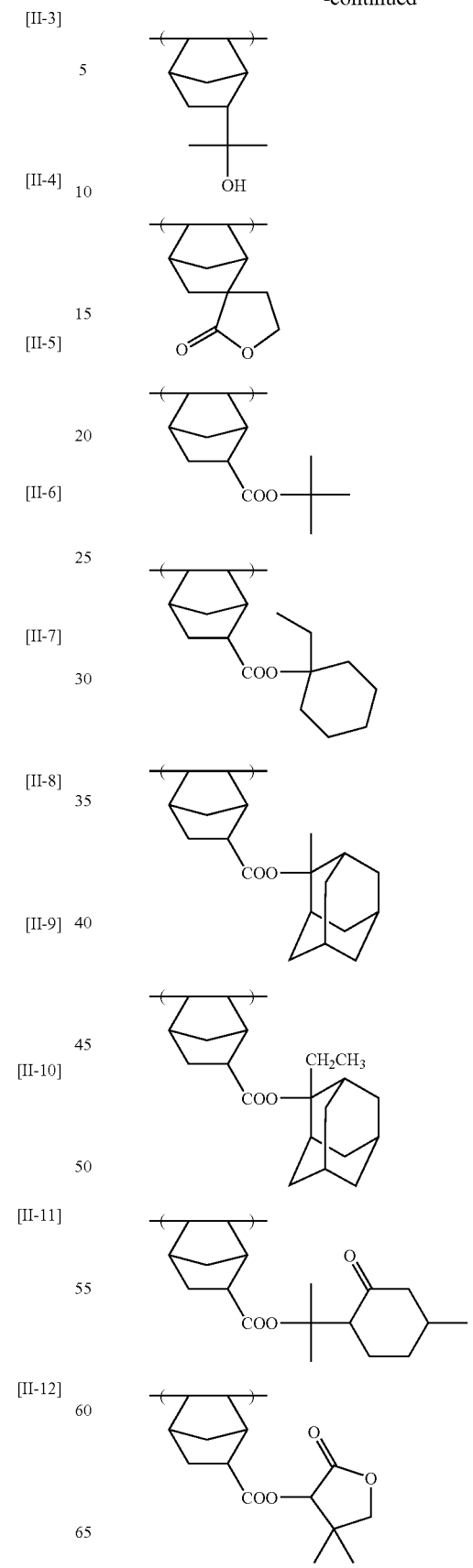

-continued

[II-21] 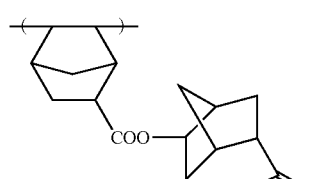

[II-22] 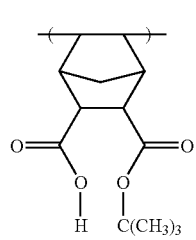

[II-23] 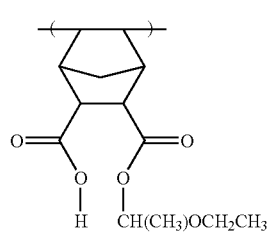

[II-24] 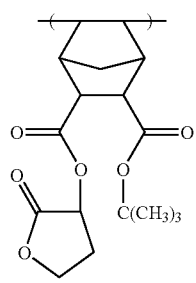

[II-25] 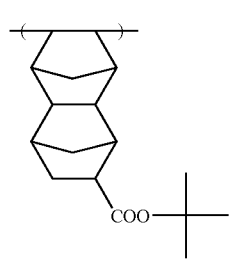

[II-26] 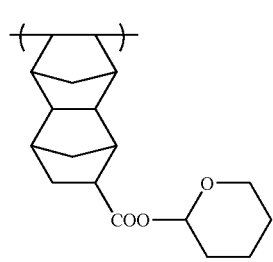

-continued

[II-27] 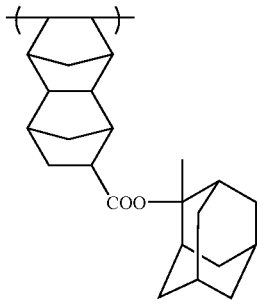

[II-28] 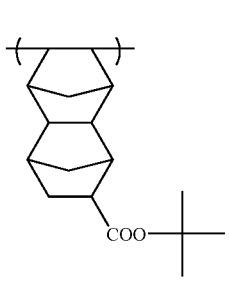

[II-29] 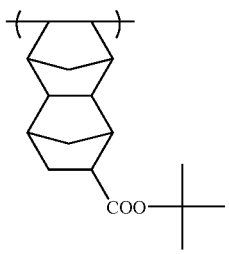

[II-30] 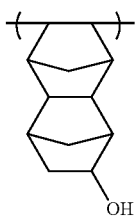

[II-31] 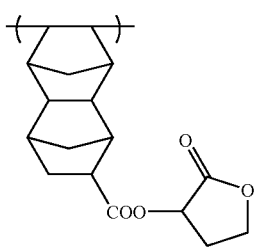

[II-32] 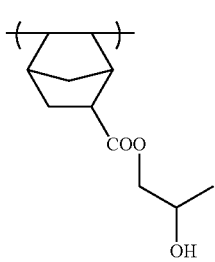

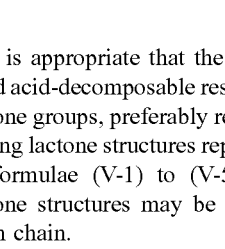

It is appropriate that the alicyclic hydrocarbon-incorporated acid-decomposable resins used in the invention contain lactone groups, preferably repeating units containing groups having lactone structures represented by formula (Lc) or any of formulae (V-1) to (V-5). Herein, the groups having lactone structures may be attached directly to the resin's main chain.

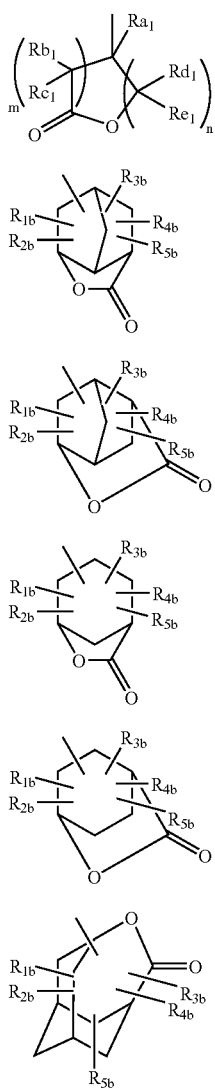

In formula (Lc), $Ra_1$, $Rb_1$, $Rc_1$, $Rd_1$ and $Re_1$ independently represent a hydrogen atom or an alkyl group. m and n each represent an integer of 0 to 3, provided that m+n is from 2 to 6.

In formulae (V-1) to (V-5) each, $R_{1b}$ to $R_{5b}$ independently represent a hydrogen atom, an alkyl group, a cycloalkyl group, an alkoxy group, an alkoxycarbonyl group, an alkylsulfonylimino group or an alkenyl group. Alternatively, any two of $R_{1b}$ to $R_{5b}$ may combine with each other to form a ring.

The alkyl group of $Ra_1$ to $Re_1$ each in formula (Lc) and the alkyl moiety in an alkyl, alkoxy, alkoxycarbonyl or alkylsulfonylimino group $R_{1b}$ to $R_{5b}$ each can represent in formulae (V-1) to (V-5) each include linear and branched alkyl groups which may have substituents. Examples of such a substituent include a hydroxyl group, a halogen atom, a carboxyl group, an alkoxy group, an acyl group, a cyano group, an acyloxy group and a cycloalkyl group.

Examples of repeating units containing groups having lactone structures represented by formula (Lc) or any of formulae (V-1) to (V-5) include the repeating units represented by formula (II-A) or (II-B) so long as at least one of $R_{13}'$ to $R_{16}'$ is a group represented by formula (Lc) or any of formulae (V-1) to (V-5) (for example, the $R_5$ of —$COOR_5$ is a group represented by formula (Lc) or any of formulae (V-1) to (V-5)), and repeating units represented by the following formula (AI):

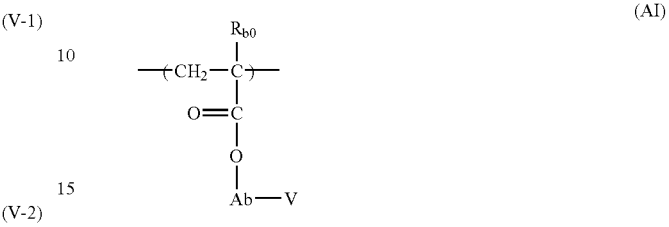

In formula (AI), $R_{b0}$ represents a hydrogen atom, a halogen atom, or a 1-4C alkyl group. Suitable examples of a substituent of the alkyl group represented by $R_{b0}$ include the groups recited above as the substituents the alkyl group represented by $R_{1b}$ in each of formulae (V-1) to (V-5) may suitably have.

Examples of a halogen atom represented by $R_{b0}$ include a fluorine atom, a chlorine atom, a bromine atom and an iodine atom. However, $R_{b0}$ is preferably a hydrogen atom.

$A_b$ represents a single bond, an ether group, an ester group, a carbonyl group, an alkylene group, or a divalent group formed by combining at least two of these groups.

V represents a group represented by formula (Lc) or any of formulae (V-1) to (V-5).

Examples of a repeating unit containing a group having a lactone structure are illustrated below, but these examples should not be construed as limiting the scope of the invention.

(In the structural formulas illustrated below, Rx is H, $CH_3$ or $CF_3$)

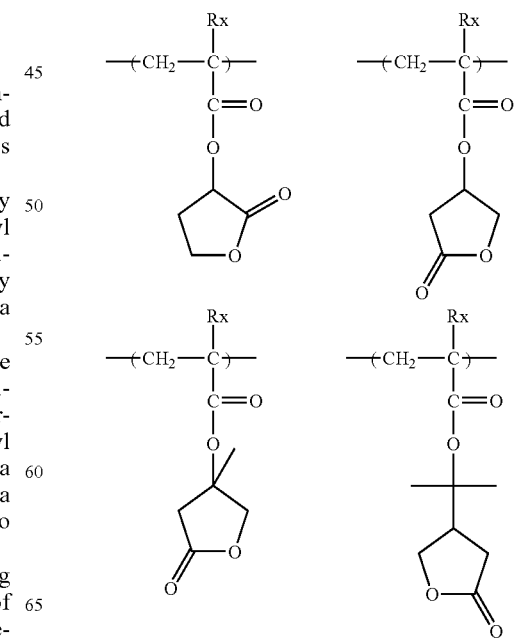

-continued
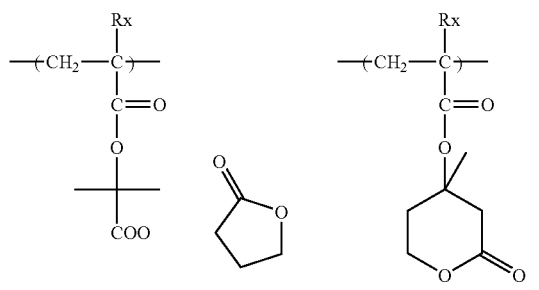
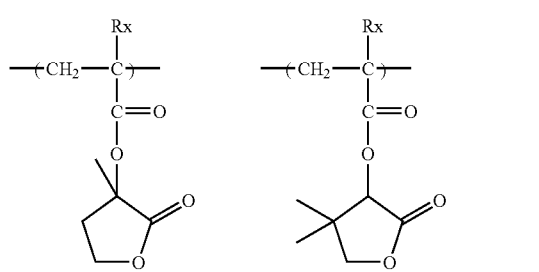
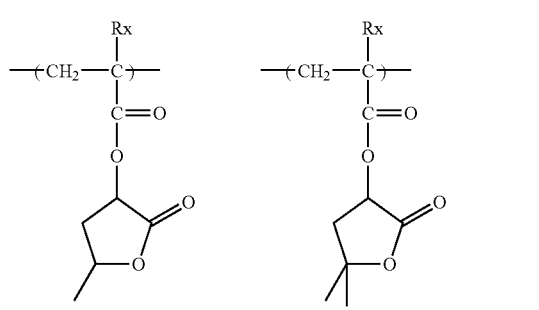
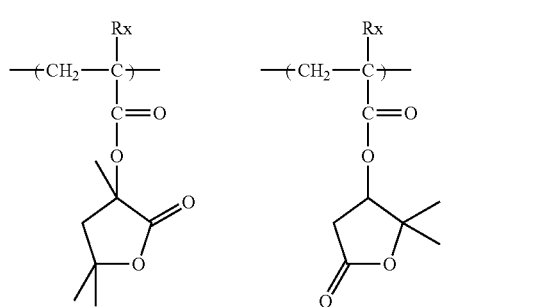
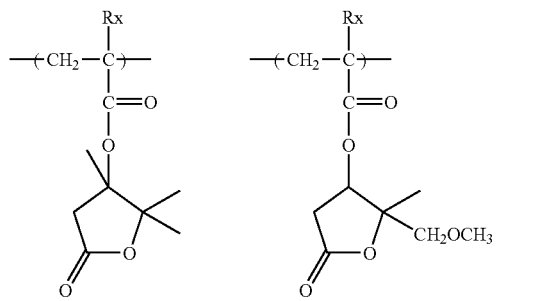
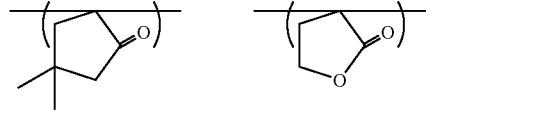
-continued
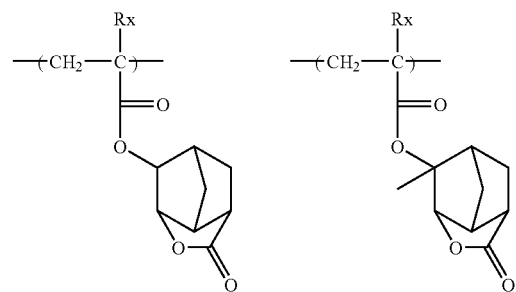
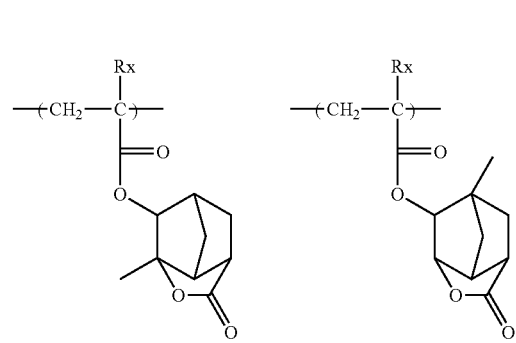
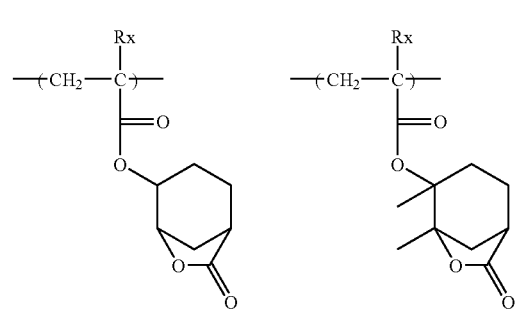
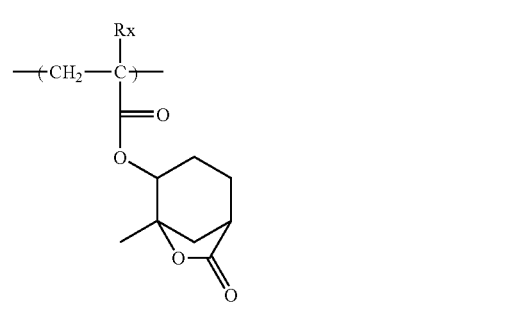
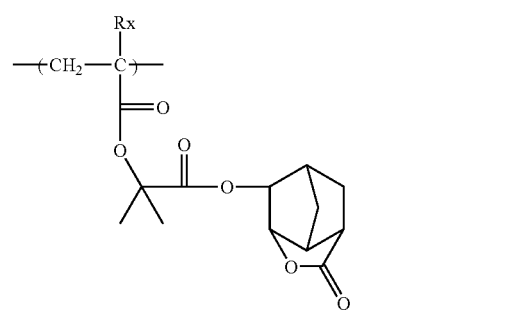

-continued
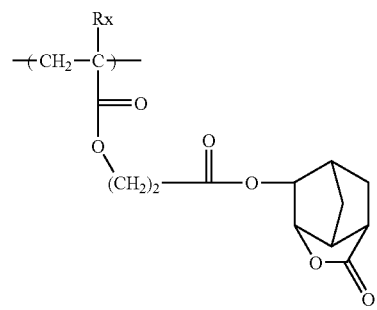
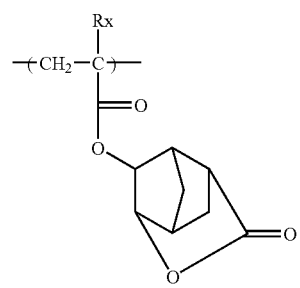
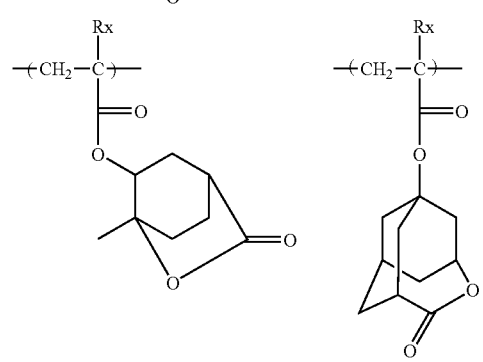
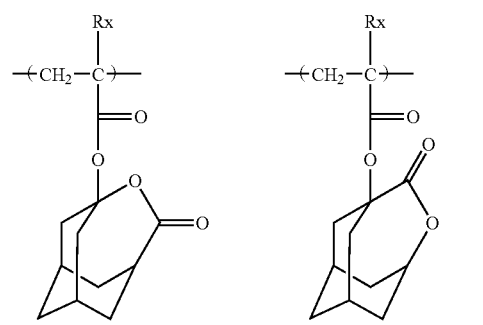
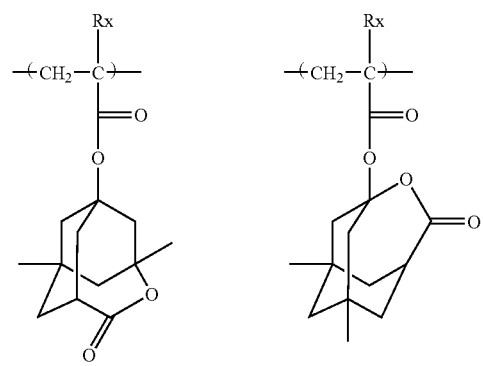
-continued
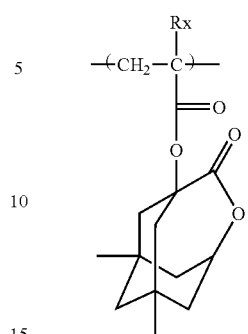
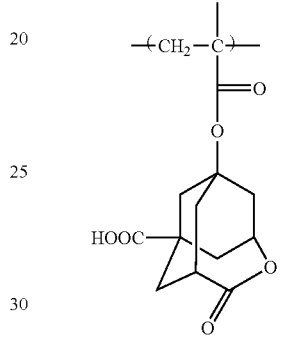
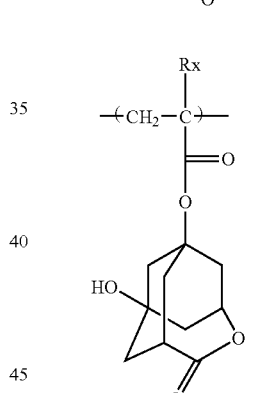
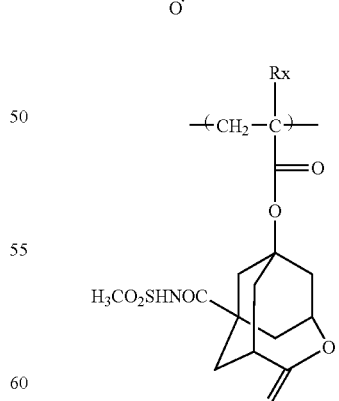
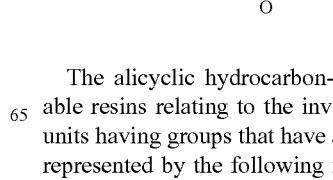
The alicyclic hydrocarbon-incorporated acid-decomposable resins relating to the invention may contain repeating units having groups that have adamantane skeletons and are represented by the following formula (VII):

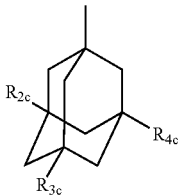
(VII)

In formula (VII), $R_{2c}$ to $R_{4c}$ independently represent a hydrogen atom or a hydroxyl group, provided that at least one of $R_{2c}$ to $R_{4c}$ represents a hydroxyl group.

The group represented by formula (VII) is preferably a dihydroxy- or monohydroxy-substituted group, far preferably a dihydroxy-substituted group.

Examples of a repeating unit having a group represented by formula (VII) include the repeating unit represented by formula (II-A) or (II-B) wherein at least one of $R_{13}'$ to $R_{16}'$ is a group represented by formula (VII) (e.g., the group —COOR$_5$ whose R$_5$ is a group represented by formula (VII)), and a repeating unit represented by the following formula (AII):

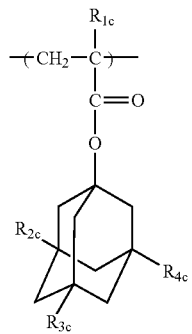
(AII)

In formula (AII), $R_{1c}$ represents a hydrogen atom or a methyl group.

$R_{2c}$ to $R_{4c}$ independently represent a hydrogen atom or a hydroxyl group, provided that at least one of $R_{2c}$ to $R_{4c}$ is a hydroxyl group. And it is preferable that two among the substituents $R_{2c}$ to $R_{4c}$ are hydroxyl groups.

Examples of a repeating unit having the structure represented by formula (AII) are illustrated below, but these examples should not be construed as limiting the scope of the invention.

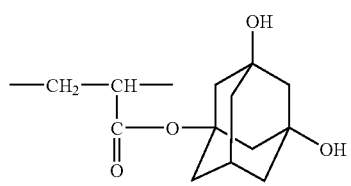
(1)

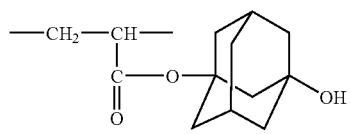
(2)

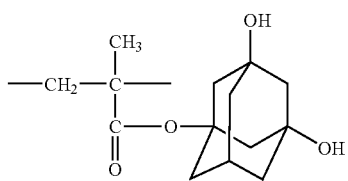
(3)

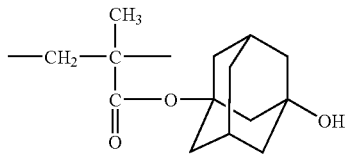
(4)

The alicyclic hydrocarbon-incorporated acid-decomposable resins used in the invention may contain repeating units represented by the following formula (VIII):

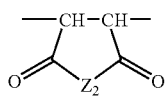
(VIII)

In formula (VIII), $Z_2$ represents —O— or —N(R$_{41}$)—. $R_{41}$ represents a hydrogen atom, a hydroxyl group, an alkyl group, or —OSO$_2$—R$_{42}$. R$_{42}$ represents an alkyl group, a cycloalkyl group or a camphor residue. The alkyl group represented by R$_{41}$ and R$_{42}$ each may be substituted with a halogen atom (preferably a fluorine atom).

Examples of a repeating unit represented by formula (VIII) are illustrated below, but these examples should not be construed as limiting the scope of the invention.

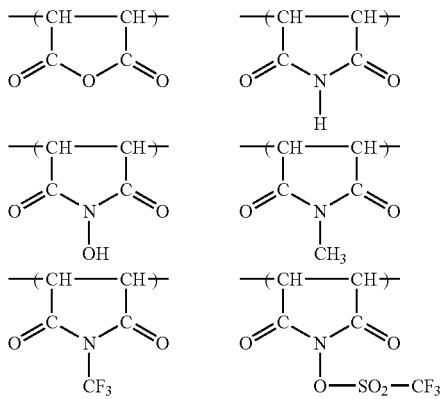

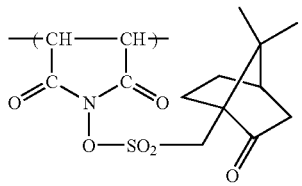

It is appropriate that the alicyclic hydrocarbon-incorporated acid-decomposable resins used in the invention contain repeating units having alkali-soluble groups, preferably repeating units having carboxyl groups. By containing such groups, resolution in contact-hole use can be heightened. As the repeating units having carboxyl groups, not only repeating units in which carboxyl groups are attached directly to the resin's main chain, such as repeating units derived from acrylic acid or methacrylic acid, but also repeating units in which carboxyl groups are attached to the resin's main chain via linkage groups are suitable. Herein, the linkage groups may have a monocyclic or polycyclic hydrocarbon structure. The most suitable one are repeating units derived from acrylic acid and methacrylic acid.

In addition to the repeating units as recited above, the alicyclic hydrocarbon-incorporated acid-decomposable resin used in the invention can contain a wide variety of repeating units for the purposes of adjusting dry etching resistance, standard developer suitability, adhesion to substrates, resist profile and other characteristics generally required for resist, such as resolution, heat resistance and sensitivity.

Examples of repeating units that can meet those purposes include the repeating structural units corresponding to the monomers described below, but these examples should not be construed as limiting the scope of the invention.

Further incorporation of those repeating units enables fine adjustments of properties required for alicyclic hydrocarbon-incorporated acid-decomposable resins, specifically:
(1) Coating solvent solubility,
(2) Film formability (glass transition temperature),
(3) Alkali developability,
(4) Thinning of resist coating (choices of which hydrophobic group and which alkali-soluble group to introduce),
(5) Adhesion to unexposed areas of a substrate, and
(6) Dry etching resistance.

Examples of monomers usable for the foregoing purposes include compounds that have one addition-polymerizable unsaturated bond each and can be selected from acrylic acid esters, methacrylic acid esters, acrylamides, methacrylamides, allyl compounds, vinyl ethers or vinyl esters.

Other addition-polymerizable unsaturated compounds may be copolymerized so long as they can copolymerize with the monomers corresponding to the various repeating structural units as recited above.

In an alicyclic hydrocarbon-incorporated acid-decomposable resin, the molar ratio between repeating structural units of different kinds is determined appropriately for adjustment to the desired dry etching resistance, standard developer suitability, adhesion to a substrate and resist profile, and besides, generally required properties, such as resolution, heat resistance and sensitivity.

Preferred embodiments of the alicyclic hydrocarbon-incorporated acid-decomposable resin used in the invention are as follows:
(1) A resin containing repeating units that have alicyclic hydrocarbon-containing partial structures represented by any of formulae (pI) to (pVI) (Side-chain type), and
(2) A resin containing repeating units represented by formula (II-AB) (Main-chain type), which further includes;
(3) A resin containing maleic anhydride derivative and (meth)acrylate structures in addition to the repeating units represented by formula (II-AB) (Hybrid type).

The suitable proportion of repeating units having acid-decomposable groups to the total repeating structural units in an alicyclic hydrocarbon-incorporated acid-decomposable resin is from 10 to 60% by mole, preferably from 20 to 50% by mole, far preferably from 25 to 40% by mole.

In an alicyclic hydrocarbon-incorporated acid-decomposable resin, it is appropriate that the repeating units having alicyclic hydrocarbon-containing partial structures represented by any of formulae (pI) to (pVI) constitute 30 to 70 mole %, preferably 35 to 65 mole %, far preferably 40 to 60 mole %, of the total repeating structural units.

In an alicyclic hydrocarbon-incorporated acid-decomposable resin, the suitable proportion of the repeating units represented by formula (II-AB) to the total repeating structural units is from 10 to 60% by mole, preferably from 15 to 55% by mole, far preferably from 20 to 50% by mole.

The proportion of repeating units derived from the other monomers as copolymerizing components in the resin can be appropriately determined depending on the desired resist properties. Their suitable proportion is generally at most 99% by mole, preferably at most 90% by mole, far preferably at most 80% by mole, based on the total mole number of the repeating units having alicyclic hydrocarbon-containing partial structures represented by any of formulae (pI) to (pVI) and the repeating units represented by formula (II-AB).

When the present composition is intended for ArF exposure, it is advantageous for the resin to have no aromatic groups from the viewpoint of transparency to ArF light.

The alicyclic hydrocarbon-incorporated acid-decomposable resins usable in the invention can be synthesized according to a conventional method (e.g., a radical polymerization method). In a general synthesis method, for instance, monomer species are placed in a reaction vessel collectively or intermittently, dissolved and homogenized, if needed, in a reaction solvent, e.g., an ether such as tetrahydrofuran, 1,4-dioxane or diisopropyl ether, a ketone such as methyl ethyl ketone or methyl isobutyl ketone, an ester solvent such as ethyl acetate, and further in a solvent capable of dissolving the present composition, such as propylene glycol monomethyl ether acetate, which is mentioned later, and then the polymerization thereof is initiated by use of a commercially available radical initiator (e.g., an initiator of azo type, peroxide) in an atmosphere of inert gas, such as nitrogen or argon, if needed, under heating. The additional initiator is added by the lump or in several portions, if required. At the conclusion of the reaction, the reaction mixture is poured into a solvent, and the intended polymer is recovered by a powder or solid recovery method. The concentration of the reaction solution is at least 20% by mass, preferably at least 30% by mass, far preferably at least 40% by mass. The reaction temperature is generally from 10° C. to 150° C., preferably from 30° C. to 120° C., far preferably from 50° C. to 100° C.

When the present composition is used for the upper-layer resist of a multilayer resist, it is preferable that the resin of Component (B) contains silicon atoms.

As the resin that contains silicon atoms and can decompose under action of an acid to increase solubility in an alkali developer, a resin containing silicon atoms in at least either the main chain or side chains can be used. Examples of a resin having siloxane structures in side chains include copolymers prepared from olefin monomers containing silicon atoms in their respective side chains, maleic anhydride and (meth)acrylic acid monomers containing acid-decomposable groups in their respective side chains.

As the resins containing silicon atoms, resins having trialkylsilyl structures and resins having monocyclic or polycyclic siloxane structures are suitable, resins containing repeating units having structures represented by any of the following formulae (SS-1) to (SS-4) are more suitable, and resins containing (meth)acrylate, vinyl or allyl repeating units having structures represented by any of the following formulae (SS-1) to (SS-4) are preferred by far:

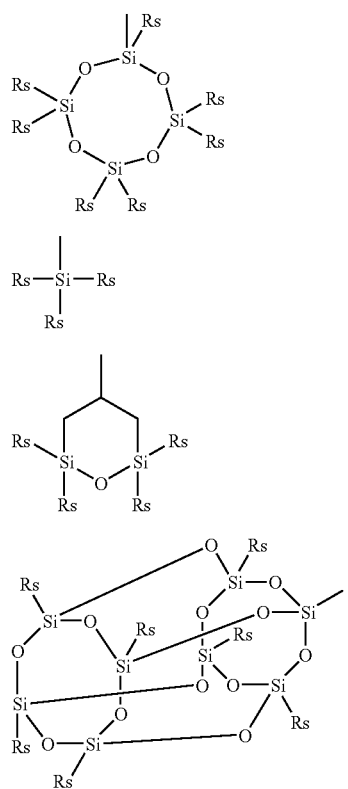

SS-1

SS-2

SS-3

SS-4

In formulae (SS-1) to (SS-4), Rs represents a 1-5C alkyl group, preferably a methyl group or an ethyl group.

As the resin containing silicon atoms, a resin having at least two different kinds of silicon-containing repeating units is suitable, a resin having both (Sa) repeating units containing 1 to 4 silicon atoms each and (Sb) repeating units containing 5 to 10 silicon atoms each is more suitable, and a resin containing at least one kind of repeating units having structures represented by any of formulae (SS-1) to (SS-3) and repeating units having structures represented by formula (SS-4) is preferred by far.

When the present positive photosensitive composition is irradiated with $F_2$ excimer laser light, it is advantageous to use as the resin of Component (B) a resin having a structure that the main chain and/or side chains of the polymer skeleton are substituted by fluorine atoms and being capable of decomposing under action of an acid to increase solubility in an alkali developer (hereinafter referred to as a fluorinated group-containing resin, too), preferably a resin containing hydroxyl groups substituted by fluorine atoms or fluoroalkyl groups at their respective 1-positions or hydroxyl groups that are protected with acid-decomposable groups and substituted by fluorine atoms or fluoroalkyl groups at their respective 1-positions, particularly preferably a resin having hexafluoro-2-propanol structures or hexafluoro-2-propanol structures whose hydroxyl groups are protected with acid-decomposable groups. By introduction of fluorine atoms into a resin, the transparency to far-ultraviolet light, especially $F_2$ light (157 nm), can be enhanced.

Examples of a fluorinated group-containing resin suitable as an acid-decomposable resin (B) include resins containing repeating units of at least one kind each, which are represented by any of the following formulae (FA) to (FG):

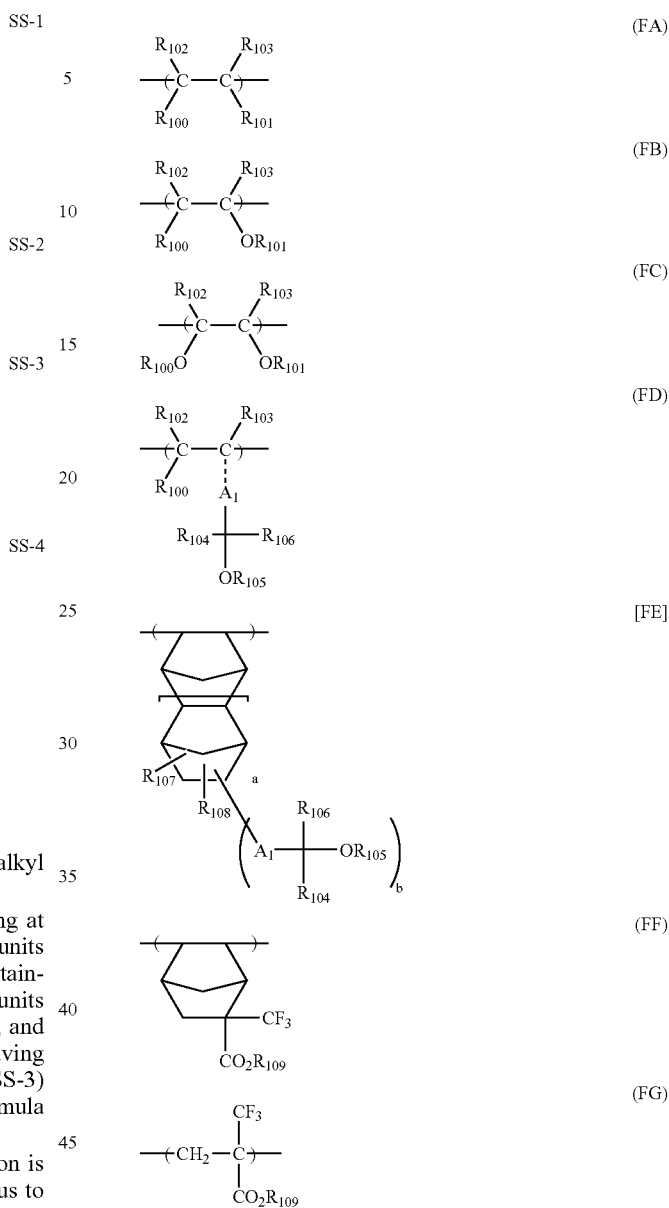

In the above formulae, $R_{100}$ to $R_{103}$ each represent a hydrogen atom, a fluorine atom, an alkyl group or an aryl group.

$R_{104}$ and $R_{106}$ each represent a hydrogen atom, a fluorine atom or an alkyl group, provided that at least either $R_{104}$ or $R_{106}$ is a fluorine atom or a fluoroalkyl group. Preferably, both $R_{104}$ and $R_{106}$ are trifluoromethyl groups.

$R_{105}$ represents a hydrogen atom, an alkyl group, a cycloalkyl group, an acyl group, an alkoxycarbonyl group or a group capable of decomposing under action of an acid.

$A_1$ represents a single bond or a divalent linkage group, with examples including linear, branched and cyclic alkylene groups, an alkenylene group, an arylene group, —OCO—, —COO—, —CON($R_{24}$)— and a linkage group containing two or more of the groups recited above. $R_{24}$ is a hydrogen atom or an alkyl group.

$R_{107}$ and $R_{108}$ each represent a hydrogen atom, a halogen atom, an alkyl group, an alkoxy group, an alkoxycarbonyl group or a group capable of decomposing under action of an acid.

$R_{109}$ represents a hydrogen atom, an alkyl group, a cycloalkyl group or a group capable of decomposing under action of an acid.

b is 0, 1 or 2.

Alternatively, $R_{100}$ and $R_{101}$ in formulae (FA) to (FC) each may form a ring via an alkylene group (containing 1 to 5 carbon atoms) which may be substituted by a fluorine atom.

The repeating units represented by formulae (FA) to (FG) contain at least one fluorine atom each, preferably at least three fluorine atoms each.

The alkyl group in formulae (FA) to (FG) each is, e.g., a 1-8C alkyl group, with suitable examples including a methyl group, an ethyl group, a propyl group, an n-butyl group, a sec-butyl group, a hexyl group, a 2-ethylhexyl group and an octyl group.

The cycloalkyl group may have a monocyclic form or a polycyclic form. Suitable examples of a monocyclic cycloalkyl group include 3-8C cycloalkyl groups, such as a cyclopropyl group, a cyclopentyl group, a cyclohexyl group, a cycloheptyl group and a cyclooctyl group. And suitable examples of a polycyclic cycloalkyl group include 6-20C cycloalkyl groups, such as an adamantyl group, a norbornyl group, an isobornyl group, a camphanyl group, a dicyclopentyl group, an α-pinyl group, a tricyclodecanyl group, a tetracyclododecyl group and an androstanyl group. Incidentally, a carbon atom in the monocyclic or polycyclic cycloalkyl group as recited above may be replaced by a hetero atom, such as an oxygen atom.

The fluoroalkyl group is, e.g., a 1-12C fluoroalkyl group, with suitable examples including a trifluoromethyl group, a perfluoroethyl group, a perfluoropropyl group, a perfluorobutyl group, a perfluorohexyl group, a perfluorooctyl group, a perfluorooctylethyl group and a perfluorododecyl group.

The aryl group is, e.g., a 6-15C aryl group, with suitable examples including a phenyl group, a tolyl group, a dimethylphenyl group, a 2,4,6-trimethylphenyl group, a naphthyl group, an anthryl group and a 9,10-dimethoxyanthryl group.

The alkoxy group is, e.g., a 1-8C alkoxy group, with suitable examples including a methoxy group, an ethoxy group, an n-propoxy group, an iso-propoxy group, a butoxy group, a pentoxy group, an allyloxy group and an octoxy group.

The acyl group is, e.g., a 1-10C acyl group, with suitable examples including a formyl group, an acetyl group, a propanoyl group, a butanoyl group, a pivaroyl group, an octanoyl group and a benzoyl group.

The alkoxycarbonyl group is preferably a secondary alkoxycarbonyl group, far preferably a tertiary alkoxycarbonyl group, such as an i-propoxycarbonyl group, a t-butoxycarbonyl group, a t-amyloxycarbonyl group or a 1-methyl-1-cyclohexyloxycarbonyl group.

The halogen atom is, e.g., a fluorine atom, a chlorine atom, a bromine atom or an iodine atom.

The alkylene group preferably includes 1-8C alkylene groups, such as a methylene group, an ethylene group, a propylene group, a butylene group, a hexylene group and an octylene group.

The alkenylene group preferably includes 2-6C alkenylene groups, such as an ethenylene group, a propenylene group and a butenylene group.

The cycloalkylene group preferably includes 5-8C cycloalkylene groups, such as cyclopentylene and cyclohexylene.

The arylene group preferably includes 6-15C arylene groups, such as a phenylene group, a tolylene group and a naphthylene group.

Those groups each may have a substituent. Examples of such a substituent include active hydrogen-containing groups, such as an alkyl group, a cycloalkyl group, an aryl group, an amino group, an amido group, a ureido group, a urethane group, a hydroxyl group and a carboxyl group, halogen atoms (fluorine, chlorine, bromine and iodine atoms), alkoxy groups (such as a methoxy group, an ethoxy group, a propoxy group and a butoxy group), a thioether group, acyl groups (such as an acetyl group, a propanoyl group and a benzoyl group), acyloxy groups (such as an acetoxy group, a propanoyloxy group and a benzoyloxy group), alkoxycarbonyl groups (such as a methoxycarbonyl group, an ethoxycarbonyl group and a propoxycarbonyl group), a cyano group and a nitro group.

Therein, the alkyl group, the cycloalkyl group and the aryl group include the same ones as recited above, respectively. Further, the alkyl group may have a fluorine atom or a cycloalkyl group as a substituent.

Examples of groups that are incorporated in a fluorinated group-containing resin usable in the invention and can decompose under action of an acid to show alkali solubility include —OC($R_{36}$)($R_{37}$)($R_{38}$), —OC($R_{36}$)($R_{37}$)(OR$_{39}$), —O—COO—C($R_{36}$)($R_{37}$)($R_{38}$), —O—C($R_{01}$)($R_2$)COO—C($R_{36}$)($R_{37}$)($R_{38}$), —COO—C($R_{36}$)($R_{37}$)($R_{38}$) and —COO—C($R_{36}$)($R_{37}$)(OR$_{39}$).

$R_{36}$ to $R_{39}$ each represent an alkyl group, a cycloalkyl group, an aryl group, an aralkyl group or an alkenyl group, and $R_{01}$ and $R_{02}$ each represent a hydrogen atom, an alkyl group, a cycloalkyl group, an alkenyl group (such as a vinyl group, an allyl group, a butenyl group or a cyclohexenyl group), an aralkyl group (such as a benzyl group, a phenethyl group or a naphthylmethyl group), or an aryl group.

Suitable examples of the group capable of decomposing under action of an acid to show alkali solubility include the ether or ester groups of t-alkyl groups, such as a t-butyl group, a t-amyl group, a 1-alkyl-1-cyclohexyl group, a 2-alkyl-2-adamantyl group, a 2-adamantyl-2-propyl group and a 2-(4-methylcyclohexyl)-2-propyl group, acetal or acetal ester groups, such as an 1-alkoxy-1-ethoxy group and a tetrahydropyranyl group, t-alkylcarbonate groups and t-alkylcarbonylmethoxy groups.

Examples of repeating structural units represented by formulae (FA) to (FG) respectively are illustrated below, but these examples should not be construed as limiting the scope of the invention.

-continued
(F-3) 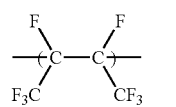
(F-4) 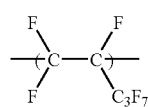
(F-5) 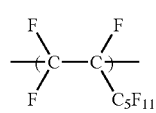
(F-6) 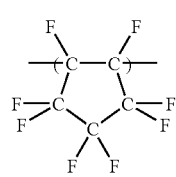
(F-7) 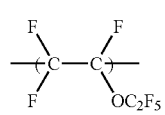
(F-8) 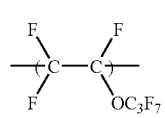
(F-9) 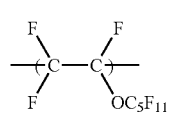
(F-10) 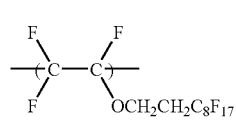
(F-11) 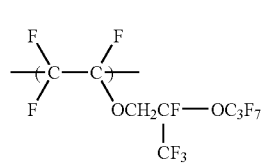
(F-12) 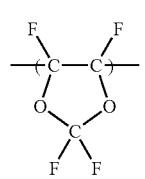
(F-13) 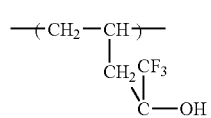
(F-14) 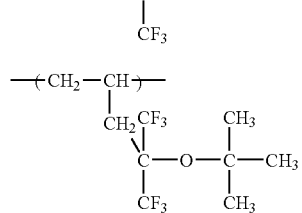
-continued
(F-15) 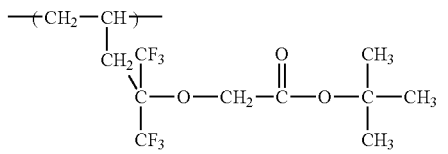
(F-16) 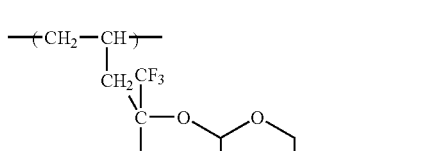
(F-17) 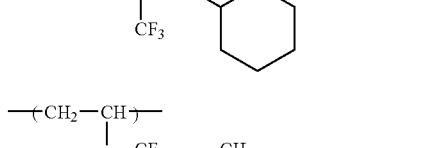
(F-18) 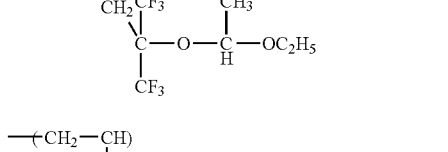
(F-19) 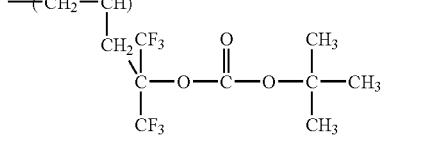
(F-20) 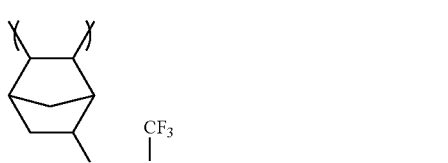
(F-21) 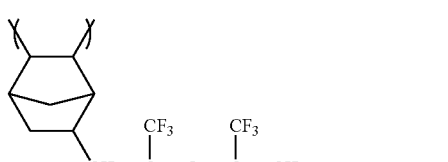
(F-22) 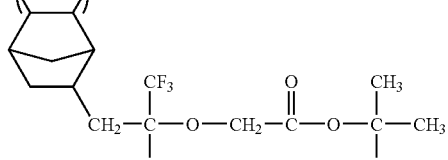

-continued
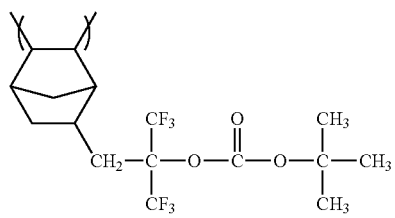
(F-23)
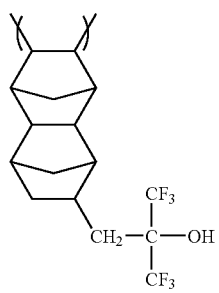
(F-24)
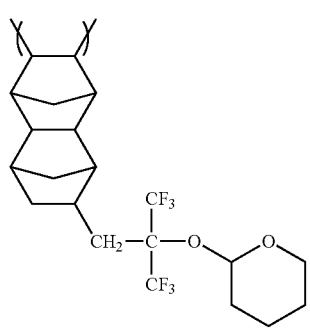
(F-25)
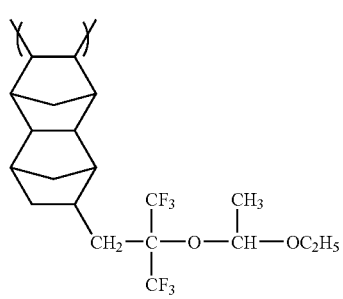
(F-26)
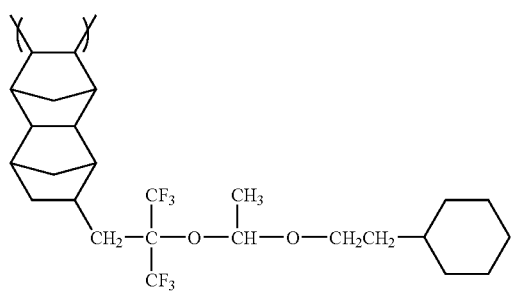
(F-27)
-continued
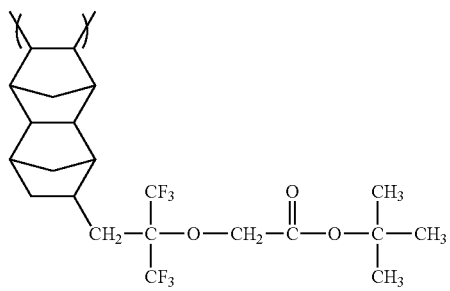
(F-28)
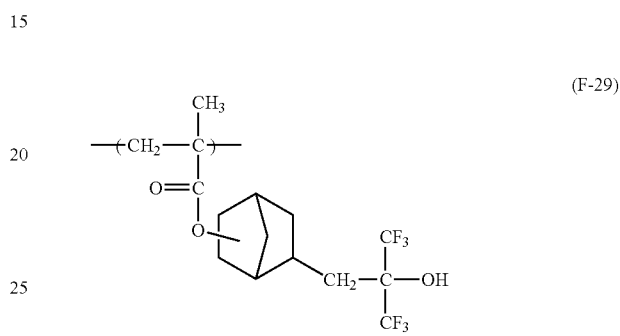
(F-29)
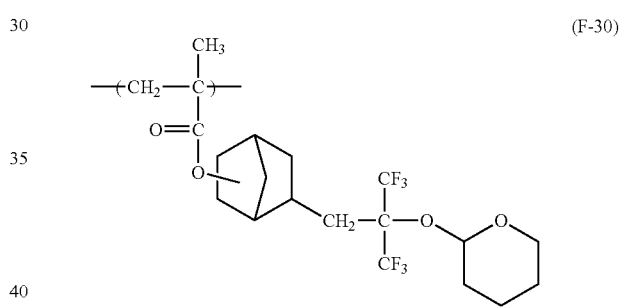
(F-30)
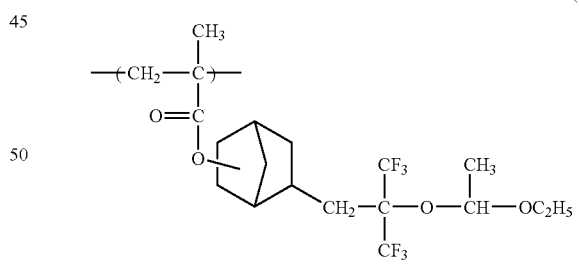
(F-31)
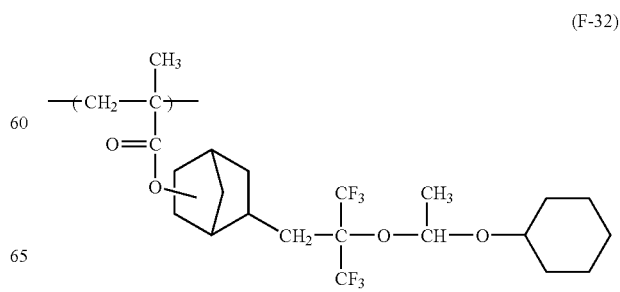
(F-32)

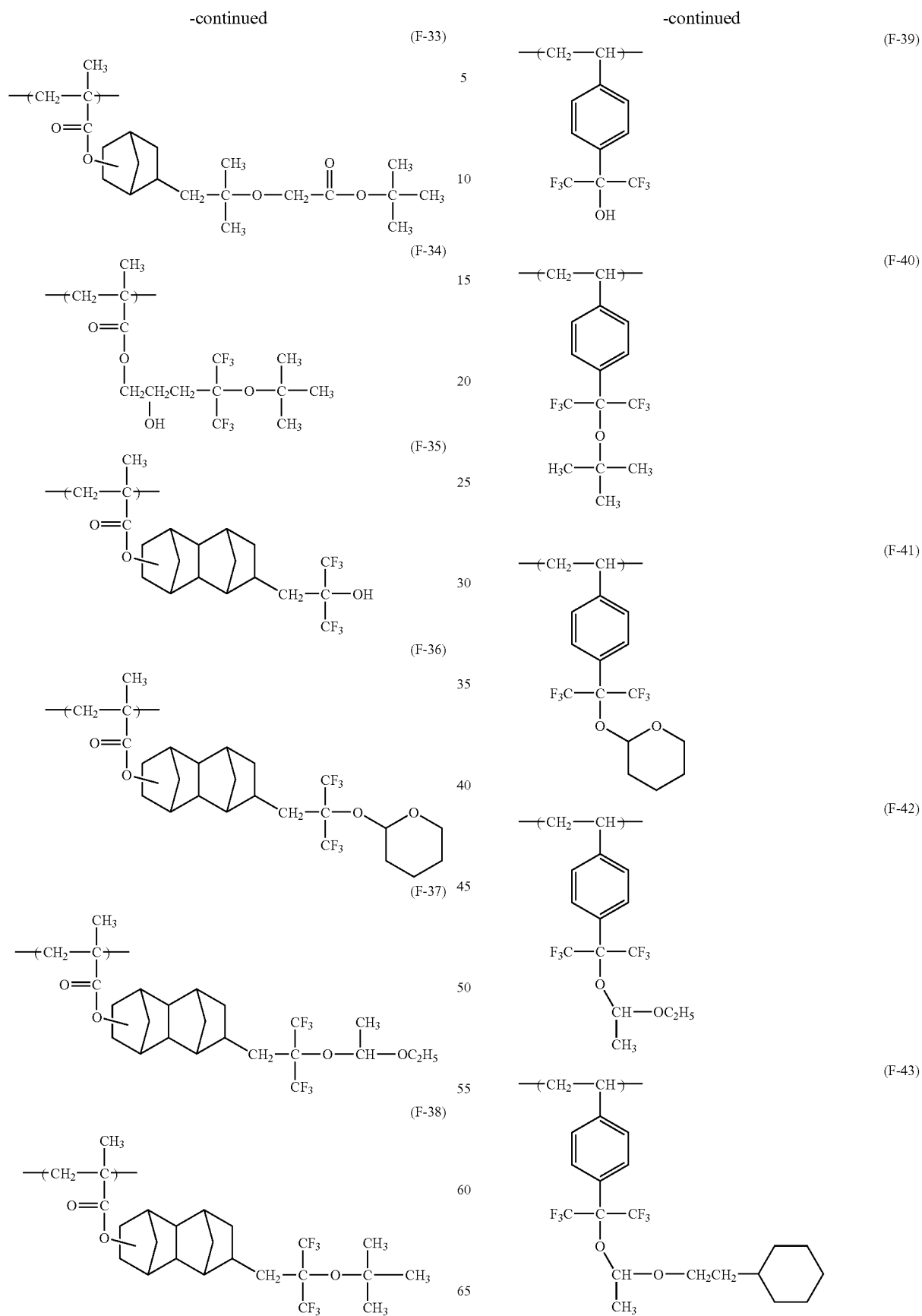

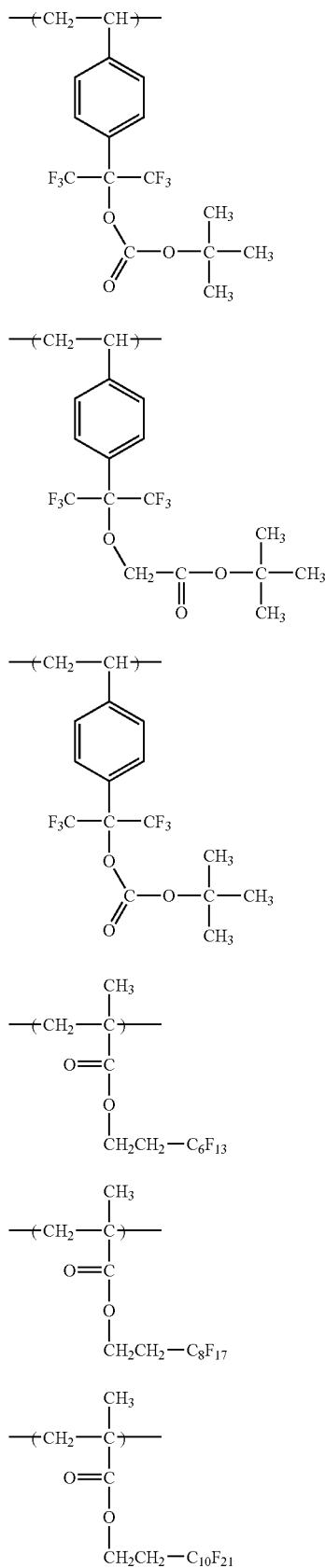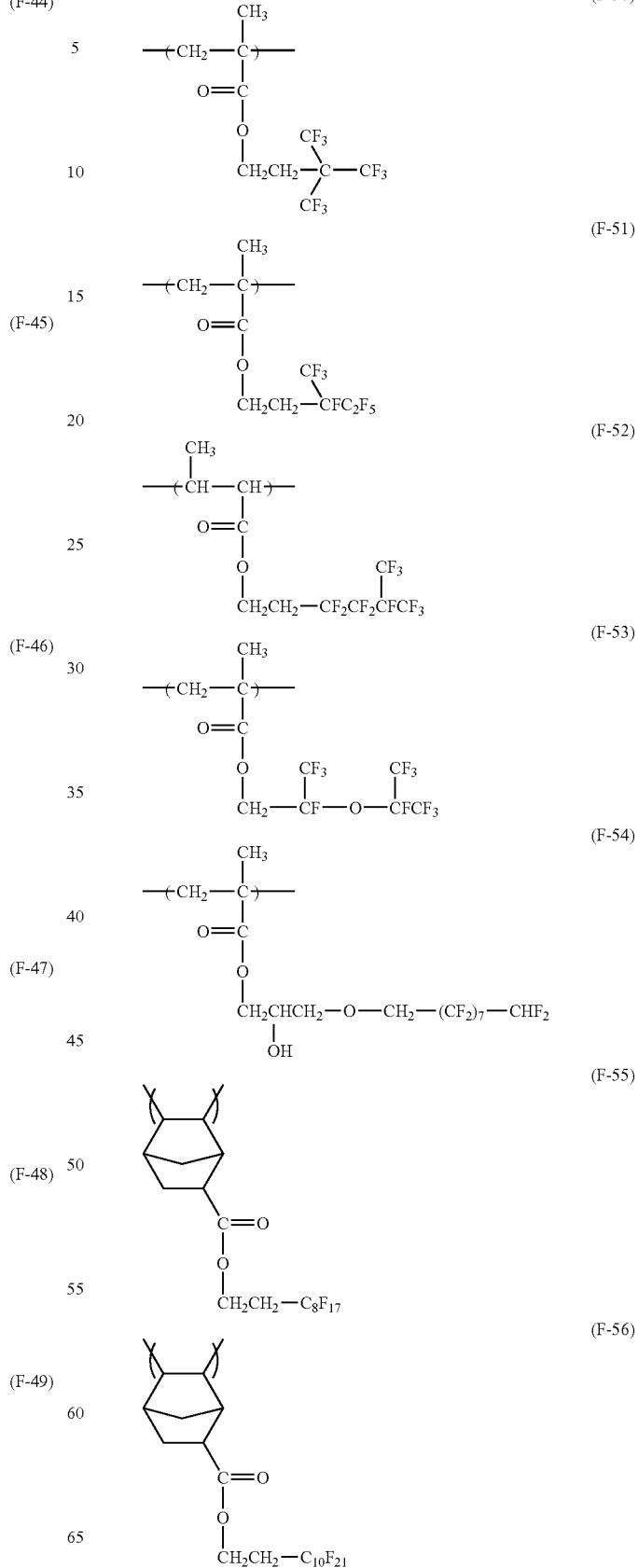

-continued

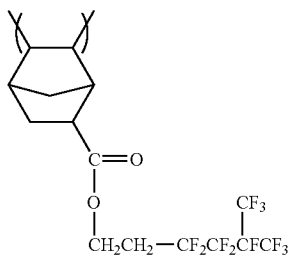 (F-57)

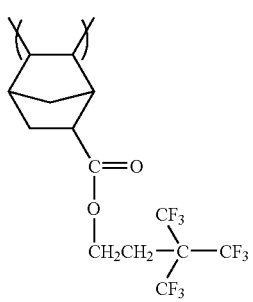 (F-58)

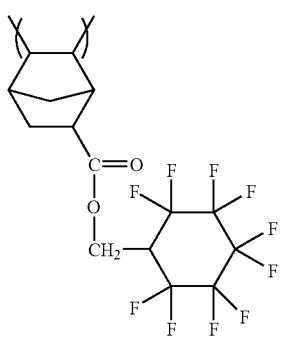 (F-59)

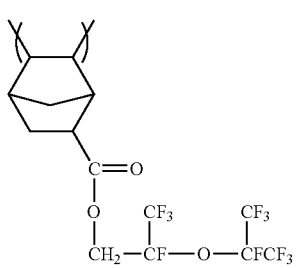 (F-60)

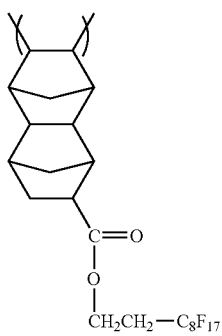 (F-61)

-continued

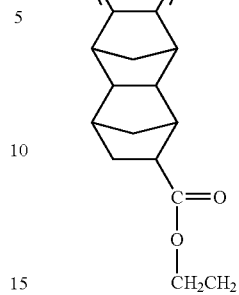 (F-62)

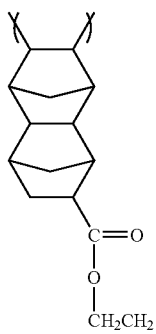 (F-63)

n = 8

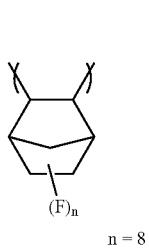 (F-64)

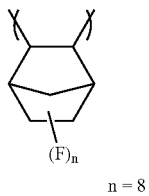 (F-65)

The percentage of the total content of repeating units represented by formulae (FA) to (FG) in a resin made up of all the repeating units required is generally from 10 to 80% by mole, preferably from 30 to 70% by mole, far preferably from 35 to 65% by mole.

Besides containing the repeating structural units as recited above, resins used in the present resist compositions may contain other copolymerizing monomers for the purpose of further enhancing the resist performance.

The copolymerizing monomers usable for the above purpose are addition-polymerizable compounds, which have one unsaturated bond each, other than the above-recited ones, inclusive of compounds selected from acrylic acid esters, acrylamides, methacrylic acid esters, methacrylamides, allyl compounds, vinyl ethers, vinyl esters, styrenes, or crotonic acid esters.

From the viewpoints of improving dry etching resistance, adjusting alkali solubility and enhancing adhesion to a substrate, it is appropriate that the fluorine-containing resins contain not only the fluorine atom-containing repeating units as illustrated above but also other repeating units as copolymerized components. The other repeating units suitable as the copolymerized components include:

1) Repeating units having alicyclic hydrocarbon structures represented by formulae (pI) to (pVI) and formula (II-AB), respectively, specifically the repeating units 1 to 23 and the repeating units [II-1] to [II-32] illustrated hereinbefore, preferably the repeating units 1 to 23 wherein Rx represents $CF_3$;
2) Repeating units having lactone structures represented by formula (Lc) and formulae (V-1) to (V-5), respectively, specifically the repeating units illustrated as examples hereinbefore, especially those having groups represented by formula (Lc) and formulae (V-1) to (V-4), respectively; and
3) Repeating units represented by the following formulae (XV), (XVI) and (XVII), which are derived from maleic anhydride, a vinyl ether and a cyano group-containing vinyl compound, respectively, wherein fluorine atoms may be contained or not, with examples including the repeating units (C-1) to (C-15) illustrated hereinafter.

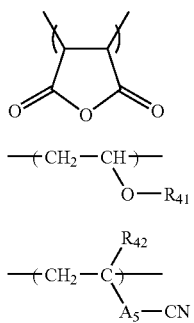

In the above formulae, $R_{41}$ represents an alkyl group, a cycloalkyl group, an aralkyl group or an aryl group. The alkyl group of $R_{41}$ may be substituted with an aryl group.

$R_{42}$ represents a hydrogen atom, a halogen atom, a cyano group or an alkyl group.

$A_5$ represents a single bond, or a divalent alkylene, alkenylene, cycloalkylene or arylene group, or —O—CO—$R_{22}$—, —CO—O—$R_{23}$— or —CO—N($R_{24}$)—$R_{25}$—.

$R_{22}$, $R_{23}$ and $R_{25}$, which may be the same or different, each represent a single bond, or a divalent alkylene, alkenylene, cycloalkylene or arylene group which may have ether, ester, amido, urethane or ureido group.

$R_{24}$ represents a hydrogen atom, an alkyl group, a cycloalkyl group, an aralkyl group or an aryl group.

Herein, examples of each substituent include the same ones as in formulae (FA) to (FG).

Examples of repeating structural units represented by formulae (XV) to (VVII) are illustrated below, but these examples should not be construed as limiting the scope of the invention.

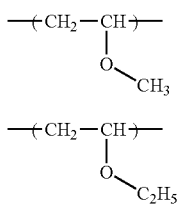

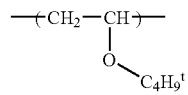

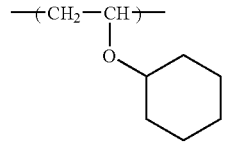

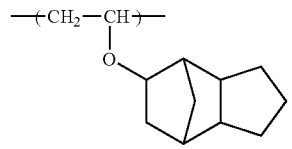

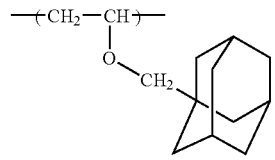

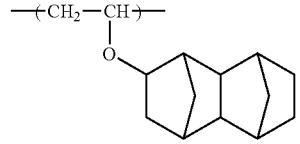

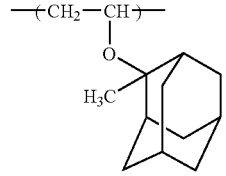

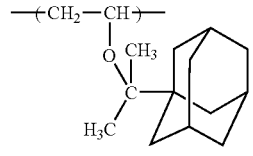

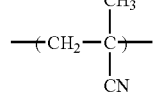

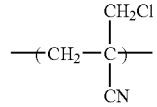

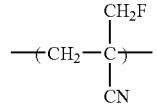

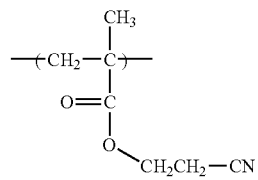

-continued

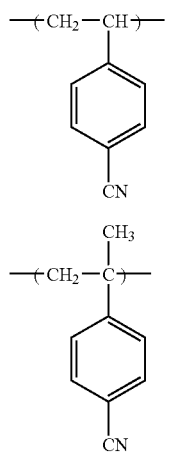

(C-14)

(C-15)

The sum of repeating units represented by formulae (XV) to (XVII) and other additional repeating units makes up generally 0 to 70% by mole, preferably 10 to 60% by mole, far preferably 20 to 50% by mole, of all the repeating units constituting the resin.

The fluorine-containing resin as an acid-decomposable resin may contain acid-decomposable groups in any of repeating units.

The suitable proportion of acid-decomposable group-containing repeating units to the total repeating units in the resin is from 10 to 70% by mole, preferably from 20 to 60% by mole, far preferably from 30 to 60% by mole.

The fluorine-containing resins can be synthesized by radical polymerization in much the same manner as the alicyclic hydrocarbon-incorporated acid-decomposable resins.

It is preferable that the resins usable in the invention have their weight average molecular weight in the range of 1,000 to 200,000, as measured by GPC and calculated in terms of polystyrene. By controlling the weight average molecular weight to 1,000 or above, the heat resistance and the dry etching resistance can be heightened, while the control of the weight average molecular weight to 200,000 or below enables developability enhancement and improvement in film forming property owing to a big drop in viscosity.

In the present positive photosensitive composition, the mixing proportion of resins of Component (B) relating to the invention is from 40 to 99.9% by mass, preferably from 50 to 99.97% by mass, to the total solid components.

[3] (C) Dissolution-Inhibiting Compound Capable of Decomposing Under Action of Acid to Increase Its Solubility in Alkali Developer and Having Molecular Weight of 3,000 or Below (Hereinafter Referred to as "Component (C)" or "Dissolution-Inhibiting Compound")

As a dissolution-inhibiting compound (C) that can decompose under action of an acid to increase its solubility in an alkali developer and has a molecular weight of 3,000 or below, acid-decomposable group-containing alicyclic or aliphatic compounds, such as the acid-decomposable group-containing cholic acids described in *Proceeding of SPIE*, 2724, 355 (1996), are suitable because they do not lower transparency to light with wavelengths of 220 nm or below. Examples of the acid-decomposable group and examples of the alicyclic structure include the same groups and the same structures as recited in the description of alicyclic hydrocarbon-incorporated acid-decomposable resins.

In the case where the present photosensitive compositions are irradiated with KrF excimer laser or electron beams, phenol compounds whose OH groups are substituted with acid-decomposable groups are suitable. The number of phenol skeletons in such a phenol compound is preferably from 1 to 9, far preferably from 2 to 6.

The molecular weight of a dissolution-inhibiting compound used in the invention is 3,000 or below, preferably from 300 to 3,000, far preferably from 500 to 2,500.

The amount of the dissolution-inhibiting compound added is preferably from 3 to 50% by mass, far preferably from 5 to 40% by mass, of the amount of total solids in the photosensitive composition.

Examples of dissolution-inhibiting compounds usable in the invention are illustrated below, but these examples should not be construed as limiting the scope of the invention.

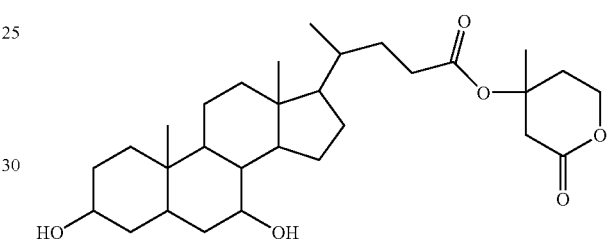

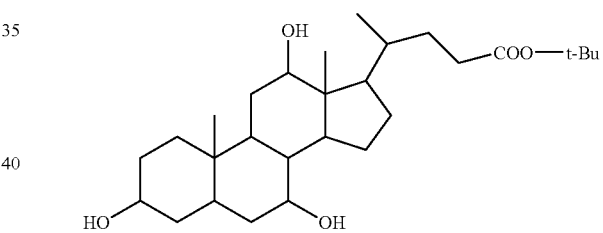

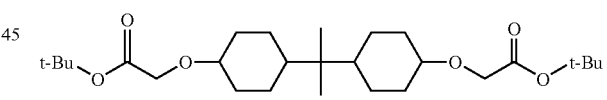

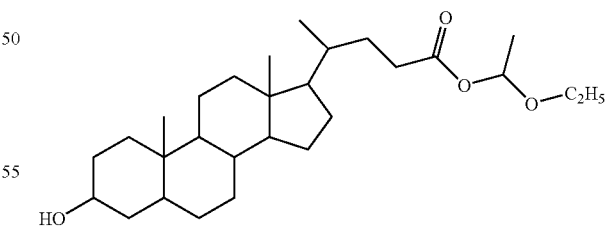

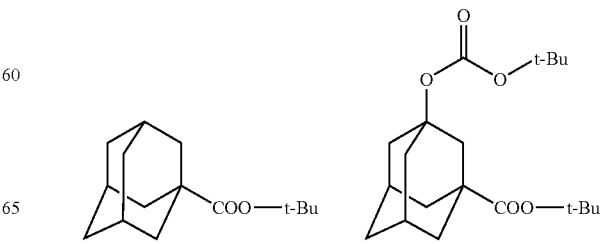

-continued

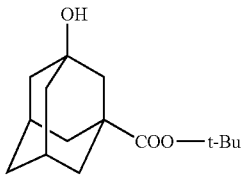

[4] (D) Resin Soluble in Alkali Developer (Hereinafter Referred to as "Component (D)" or "Alkali-Soluble Resin")

The alkali dissolution speed of an alkali-soluble resin is preferably 20 Å/sec or above, particularly preferably 200 Å/sec, as measured with 0.261N tetramethylammonium hydroxide (TMAH) (at 23° C.). Herein, Å stands for angstrom.

[312]

Examples of an alkali-soluble resin usable in the invention include novolak resin, halogenated novolak resin, acetone-pyrogallol resin, poly(o-hydroxystyrene), poly(m-hydroxystyrene), poly(p-hydroxystyrene), hydrogenated poly(hydroxystyrene)s, halogen- or alkyl-substituted poly(hydroxystyrene)s, hydroxystyrene-N-substituted maleimide copolymer, o/p-hydroxystyrene copolymer, m/p-hydroxystyrene copolymer, poly(hydroxystyrene)s whose hydroxyl groups are partially O-alkylated (such as 5 to 30 mole % O-methylation, O-(1-methoxy)ethylation, O-(1-ethoxy)ethylation, O-2-tetrahydropyranylation or O-(t-butoxycarbonyl)methylation products of poly(hydroxystyrene)s), poly(hydroxystyrene)s whose hydroxyl groups are partially O-acylated (such as 5 to 30 mole % O-acetylation or O-(t-butoxy)carbonylation products of poly(hydroxystyrene)s), styrene-maleic anhydride copolymer, styrene-hydroxystyrene copolymer, α-methylstyrene-hydroxystyrene copolymer, carboxyl group-containing methacrylic resin and derivatives thereof, and polyvinyl alcohol derivatives. However, these resins should not be construed as limiting the scope of the invention.

Of those resins, especially preferable alkali-soluble resins are novolak resin, poly(o-hydroxystyrene), poly(m-hydroxystyrene), poly(p-hydroxystyrene), copolymers of these hydroxystyrenes, alkyl-substituted poly(hydroxystyrene)s, partially O-alkylated or O-acylated poly(hydroxystyrene)s, styrene-hydroxystyrene copolymer and α-methylstyrene-hydroxystyrene copolymer.

The novolak resin can be prepared by causing addition condensation between specified monomers as main components and aldehydes in the presence of an acid catalyst.

The weight average molecular weight of those alkali-soluble resins is at least 2,000, preferably from 5,000 to 200,000, far preferably from 5,000 to 100,000.

Herein, the weight average molecular weight is defined as a value measured by gel permeation chromatography and calculated in terms of polystyrene.

In the invention, those alkali-soluble resins (D) may be used as combinations of two or more thereof.

The proportion of alkali-soluble resins used to the total solid components in a photosensitive composition is from 40 to 97% by mass, preferably from 60 to 90% by mass.

[5] (E) Acid Cross-Linking Agent Capable of Forming Cross-Links Between Alkali-Soluble Resin Molecules Under Action of an Acid (Hereinafter Referred to as "Component (E)" or "Cross-Linking Agent", too)

In negative photosensitive compositions according to the invention, cross-linking agents are used.

As cross-linking agents, though any compounds can be used as long as alkali-soluble resins are cross-linked with them under action of an acid, the following compound groups (1) to (3) are suitable:

(1) Hydroxymethyl body, alkoxymethyl body and acyloxymethyl body of phenol derivatives,
(2) Compounds having N-hydroxymethyl, N-alkoxymethyl or/and N-acyloxymethyl groups, and
(3) Compounds having epoxy groups.

The suitable number of carbon atoms in the alkoxymethyl group is 6 or below, and that in the acyloxymethyl group is also 6 or below.

Of those cross-linking agents, the compounds illustrated below in particular are preferred over the others:

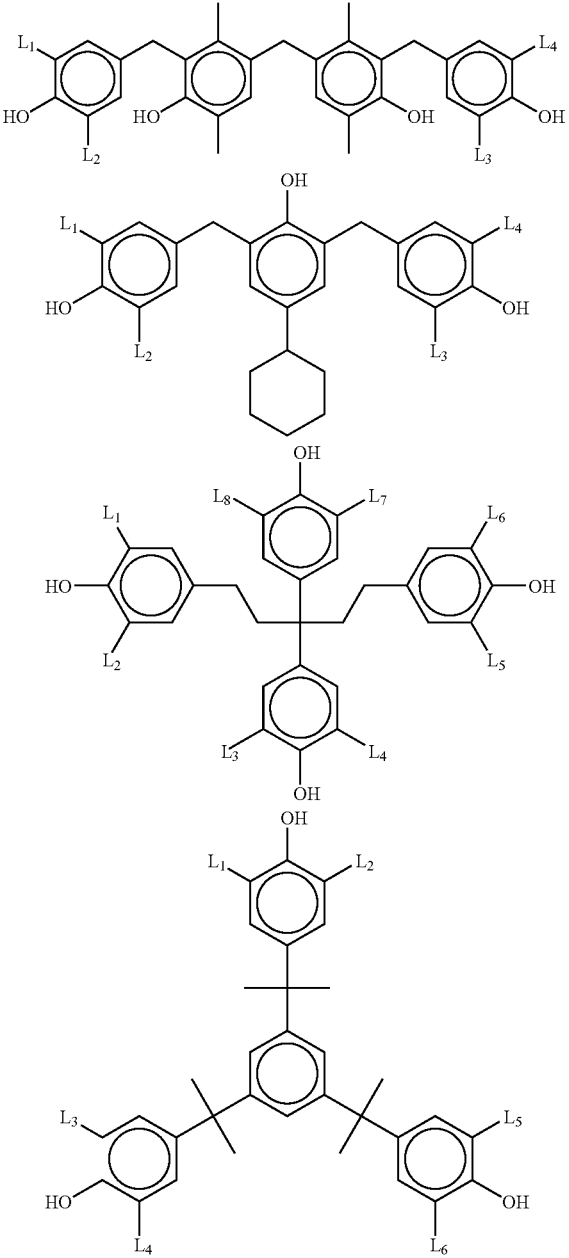

-continued

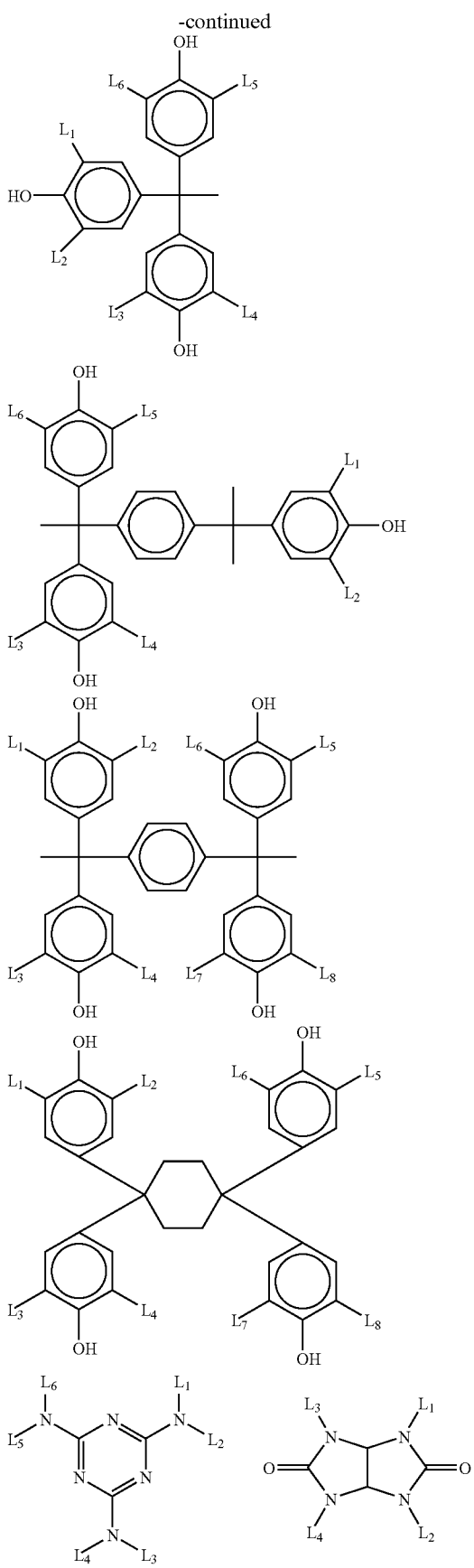

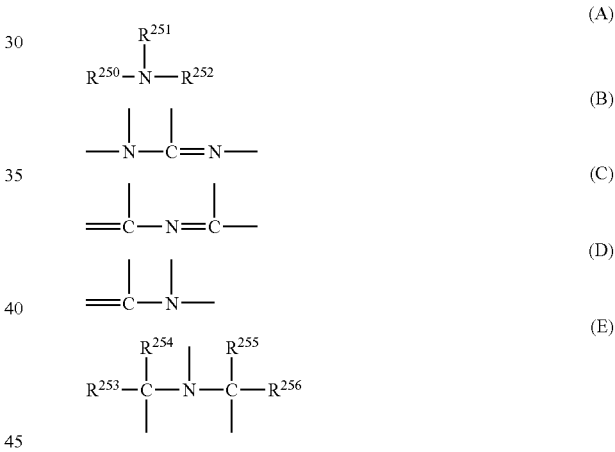

In the above formulae, $L_1$ to $L_8$, which may be the same or different, each represent a hydrogen atom, a hydroxymethyl group, a methoxymethyl group, an ethoxymethyl group or a 1-6C alkyl group.

The cross-linking agents added account for generally 3 to 70% by mass, preferably 5 to 50% by mass, of the total solids in a photosensitive composition.

<Other Components>

[6] (F) Basic Compound

For reduction of changes occurring in properties for a lapse of time between exposure and heating, it is appropriate that the present photosensitive compositions contain basic compounds (F).

The following structures represented by formulae (A) to (E) are suitable as structures of the basic compounds (F):

$$R^{250}-\underset{\underset{R^{252}}{|}}{\overset{\overset{R^{251}}{|}}{N}}\qquad\text{(A)}$$

$$-\underset{|}{N}-\underset{|}{C}=N-\qquad\text{(B)}$$

$$=\underset{|}{C}-\underset{|}{N}=\underset{|}{C}-\qquad\text{(C)}$$

$$=\underset{|}{C}-\underset{|}{N}-\qquad\text{(D)}$$

$$R^{253}-\underset{|}{\overset{|}{C}}-\underset{|}{N}-\underset{|}{\overset{\overset{R^{255}}{|}}{C}}-R^{256}\qquad\text{(E)}$$

Herein, $R^{250}$, $R^{251}$ and $R^{252}$ independently represent a hydrogen atom, a 1-20C alkyl group, a 3-20C cycloalkyl group or a 6-20C aryl group. Alternatively, $R^{250}$ and $R^{251}$ may combine with each other to form a ring. These groups may have substituents, and suitable examples of substituted alkyl and cycloalkyl groups include 1-20C aminoalkyl groups, 3-20C aminocycloalkyl groups, 1-20C hydroxyalkyl groups and 3-20C hydroxycycloalkyl groups.

Further, each of these alkyl chains may contain an oxygen atom, a sulfur atom or a nitrogen atom.

In the above formula, $R^{253}$, $R^{254}$, $R^{255}$ and $R^{256}$ independently represent a 1-6C alkyl group or a 3-6C cycloalkyl group.

Examples of a compound suitable as the basic compound (F) include guanidine, aminopyrrolidine, pyrazole, pyrazoline, piperazine, aminomorpholine, aminoalkylmorpholines and piperidine. These compounds may have substituents. Further, a compound having an imidazole structure, a diazabicyclo structure, an onium hydroxide structure, an onium carboxylate structure, a trialkylamine structure, an aniline structure or a pyridine structure, an alkylamine derivative having a hydroxyl group and/or an ether linkage and an aniline derivative having a hydroxyl group and/or an ether linkage can be included in compounds more suitable as the basic compounds (F).

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]nona-5-ene and 1,8-diazabicyclo[5,4,0]undeca-7-ene. Examples of the compound having an onium hydroxide structure include triarylsulfonium hydroxides, such as triphenylsulfonium hydroxide and tris(t-butylphenyl)sulfonium hydroxide, phenacylsulfonium hydroxides, sulfonium hydroxides having 2-oxoalkyl groups, bis(t-butylphenyl)iodonium hydroxide, phenacylthiophenium hydroxide and 2-oxopropylthiophenium hydroxide. The compound having an onium carboxylate structure corresponds to the compound having an onium hydroxide structure whose anion part is replaced by a carboxylate, and examples of the carboxylate include acetate, adamanthane-1-carboxylate and perfluoroalkylcarboxylates. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having hydroxyl group and/or an ether linkage include ethanolamine, diethanolamine, triethanolamine and tris(methoxyethoxyethyl)amine. An example of the aniline derivative having a hydroxyl group and/or an ether linkage is N,N-bis(hydroxyethyl)aniline.

These basic compounds are used alone or as combinations of two or more thereof. The proportion of the basic compounds used is generally from 0.001 to 10% by mass, preferably from 0.01 to 5% by mass, based on the total solids in a photosensitive composition. For achieving sufficient effect by the addition, at least 0.001% by mass is appropriate, while at most 10% by mass is appropriate from the viewpoints of sensitivity and developability of unexposed areas.

[7] (G) Surfactant Containing Fluorine Atom, or Silicon Atom, or Both

It is preferable that the present photosensitive composition further contains any one of fluorine and/or silicone-containing surfactants (specifically a surfactant containing a fluorine atom, a surfactant containing a silicon atom and a surfactant containing both fluorine and silicon atoms), or two or more of those surfactants.

The incorporation of a surfactant containing a fluorine atom, or a silicon atom, or both in the present photosensitive compositions makes it possible to provide resist patterns reduced in stickiness and development defect at satisfactory sensitivity and resolution when an exposure light source of 250 nm or below, particularly 220 nm or below, is used.

Examples of a surfactant containing a fluorine atom, or a silicon atom, or both include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable herein include fluorine-containing surfactants and silicon-containing surfactants, such as Eftop EF301 and EF303 (manufactured by Shin-Akita Kasei K.K.), Florad FC430 and FC431 (manufactured by Sumitomo 3M, Inc.), Megafac F171, F173, F176, F189 and R08 (manufactured by Dainippon Ink & Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industries, Inc.). In addition, organosiloxane polymer KP-341 (manufactured by Shin-Etsu Chemical Co., Ltd.) can be used as a silicon-containing surfactant.

In addition to known surfactants as recited above, other surfactants can be used which utilize specific polymers containing fluorinated aliphatic groups derived from fluorinated aliphatic compounds produced in accordance with a telomerization method (telomer method) or an oligomerization method (oligomer method). And these fluorinated aliphatic compounds can be synthesized using the methods disclosed in JP-A-2002-90991.

The polymers suitable as those polymers containing fluorinated aliphatic groups are copolymers of fluorinated aliphatic group-containing monomers and poly(oxyalkylene) acrylates and/or poly(oxyalkylene) methacrylates, wherein the fluorinated aliphatic group-containing units may be distributed randomly or in blocks. Examples of those poly(oxyalkylene) groups include a poly(oxyethylene) group, a poly(oxypropylene) group and a poly(oxybutylene) group. In addition, the poly(oxyalkylene) groups may be units in which alkylene groups differing in chain length are contained in their respective oxyalkylene chains, such as poly(oxyethylene block-oxypropylene block-oxyethylene block combination) and poly(oxyethylene block-oxypropylene block combination). Besides being binary copolymers, the copolymers of fluorinated aliphatic group-containing monomers and poly(oxyalkylene) acrylates (or methacrylates) may be at least ternary copolymers prepared by copolymerizing at least two different kinds of fluorinated aliphatic group-containing monomers and at least two different kinds of poly(oxyalkylene) acrylates (or methacrylates) at a time.

Examples of fluorinated aliphatic group-containing polymers as commercially available surfactants include Megafac F178, F-470, F-473, F-475, F-476 and F-472 (manufactured by Dainippon Ink & Chemicals, Inc.). Additional examples of fluorinated aliphatic group-containing polymers include a copolymer of $C_6F_{13}$ group-containing acrylate (or methacrylate) and poly(oxyalkylene) acrylate (or methacrylate), a terpolymer of $C_6F_{13}$ group-containing acrylate (or methacrylate), poly(oxyethylene) acrylate (or methacrylate) and poly(oxypropylene) acrylate (or methacrylate), a copolymer of $C_8F_{17}$ group-containing acrylate (or methacrylate) and poly(oxyalkylene) acrylate (or methacrylate), and a terpolymer of $C_8F_{17}$ group-containing acrylate (or methacrylate), poly(oxyethylene) acrylate (or methacrylate) and poly(oxypropylene) acrylate (or methacrylate).

The suitable amount of the surfactants used is from 0.0001 to 2% by mass, preferably from 0.001 to 1% by mass, of the total amount of a photosensitive composition (excepting the solvent).

[8] (H) Organic Solvent

The present photosensitive compositions are used in a state that the components as recited above are dissolved in appropriate organic solvents.

Examples of organic solvents usable in the present compositions include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone and tetrahydrofuran.

In the invention, though those organic solvents may be used alone or as mixtures of two or more thereof, it is preferable that a solvent containing a hydroxyl group in its structure and a hydroxyl group-free solvent are used in mixed form. By using such a mixed solvent, development of particles in a resist solution during storage can be reduced.

Examples of a hydroxyl group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate in particular are preferred over the others.

Examples of a hydroxyl group-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethyl sulfoxide. Of these solvents, propylene glycol monomethyl ether acetate, ethyl ethoxypropionate, 2-heptanone, γ-butyrolactone, cyclohexanone and butyl acetate are preferred over the others, and propylene glycol monomethyl ether acetate, ethyl ethoxypropionate and 2-heptanone in particular are favorable.

The mixing ratio (by mass) between a hydroxyl group-containing solvent to a hydroxyl group-free solvent is from 1/99 to 99/1, preferably from 10/90 to 90/10, far preferably from 20/80 to 60/40. A mixed solvent containing a hydroxyl group-free solvent in a proportion of at least 50% by mass is especially preferred in point of coating uniformity.

<Other Additives>

To the present photosensitive compositions, dyes, plasticizers, surfactants other than Component (G) mentioned above, photo-sensitizers and compounds capable of promoting dissolution into developers can further be added, if needed.

As the compounds capable of promoting dissolution into developers, low molecular compounds which each have at least two phenolic OH groups or at least one carboxyl group and a molecular weight of 1,000 or below can be used in the invention. In the case of compounds having carboxyl groups, alicyclic or aliphatic compounds are preferable.

The suitable proportion of the dissolution-promoting compounds added to the resin used as Component (B) or the resin used as Component (D) is from 2 to 50% by mass, preferably from 5 to 30% by mass. The proportion of 50% by mass or below is favorable from the viewpoints of development residue control and prevention of pattern deformation at the time of development.

Those phenol compounds, which have molecular weight of 1,000 or below, can be synthesized with ease to persons skilled in the art by reference to the methods disclosed in JP-A-4-122938, JP-A-2-28531, U.S. Pat. No. 4,916,210 and European Patent No. 219,294.

Examples of a carboxyl group-containing alicyclic or aliphatic compound include carboxylic acid derivatives having steroid structures, such as cholic acid, deoxycholic acid and lithocholic acid, adamanthanedicarboxylic acid derivatives, cyclohexanecarboxylic acid and cyclohexanedicarboxylic acid, but the examples should not be construed as being limited to those recited above.

In the invention, surfactants other than the fluorine- and/or silicon-containing surfactants of Component (G) can be added, too. Specifically, such surfactants are nonionic surfactants, with examples including polyoxyethylene alkyl ethers, polyoxyethylene alkyl aryl ethers, polyoxyethylene-polyoxypropylene block copolymer, sorbitan fatty esters and polyoxyethylenesorbitan fatty esters.

These surfactants can be added alone or as combinations of some of them.

(Pattern Formation Method)

The present photosensitive compositions are used in a condition that the components as described above are dissolved in an appropriate organic solvent, preferably the mixed solvent as recited above, and coated on a specified substrate in the following manner.

For instance, the photosensitive composition is coated on a substrate as used for fabrication of high-precision integrated circuit elements (e.g., a silicon/silicon dioxide coating) in accordance with an appropriate coating method, e.g., using a spinner or a coater, and then dried to form a photosensitive coating.

The photosensitive coating is irradiated with an actinic ray or radiation via the desired mask, preferably baked (heated), and then developed. In this manner, satisfactory patterns can be formed.

Examples of an actinic ray or radiation usable therein include infrared light, visible light, ultraviolet light, far-ultraviolet light, X-rays and electron beams, preferably far-ultraviolet light with wavelengths of 250 nm or shorter, especially 220 nm or shorter, such as KrF excimer laser (248 nm), ArF excimer laser (193 mm) and $F_2$ excimer laser (157 mm), X-rays and electron beams. Of these actinic rays and radiation, ArF excimer laser, $F_2$ excimer laser, EUV (13 nm) and electron beams are preferred over the others.

In the development process, an alkali developer is used as follows. The alkali developer used for resist compositions can be an aqueous solution of alkali. Examples of an alkali usable therein include inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

To the aqueous solution of alkali, alcohol and a surfactant may further be added in appropriate amounts.

The alkali concentration of the alkali developer is generally from 0.1 to 20% by mass.

The pH of the alkali developer is generally from 10.0 to 15.0.

EXAMPLES

Now, the invention will be illustrated in more detail by reference to the following examples, but these examples should not be construed as limiting the scope of the invention.

<Synthesis Examples of Compound (A)>

Synthesis Example 1

Synthesis of Compound (I-1)

Into 200 ml of chloroform, 7.2 g of indole and 12.5 g of diphenyl sulfoxide were dissolved and cooled to −30° C. in a stream of nitrogen. To this solution, 25.8 g of trifluoroacetic anhydride was added dropwise over a 30-minute period. The temperature of the admixture was raised to room temperature, and reaction was run for 4 hours. To this reaction mixture was added a water solution containing 81 g of sodium tetrafluoroborate. The chloroform phase was washed with water, and concentrated to yield crude crystals. These crystals were washed with ethyl acetate to give 15.9 g of 3-indolyldiphenylsulfonium tetrafluoroborate.

A 10 g portion of the 3-indolyldiphenylsulfonium tetrafluoroborate was dissolved in 100 ml of acetonitrile, and thereto was added 9.1 g of potassium nonafluorobutanesulfonate dissolved in an acetonitrile/water mixture. Chloroform was added to the resulting reaction solution, and the chloroform phase was washed with water, and concentrated to yield 13 g of Compound (I-1).

NMR Spectrum of Compound (I-1)

300 MHz $^1$H-NMR (CDCl$_3$): δ 7.15 (s. 2H), δ 7.2 to 7.3 (m. 2H), δ 7.6 to 7.8 (m. 12H), δ 8.21 (s. 1H), δ 12.2 (bs. 1H)

Synthesis Example 2

Synthesis of Compound (I-17)

Into 150 ml of chloroform, 7.2 g of indole and 6.6 g of tetramethylene sulfoxide were dissolved and cooled to −30° C. in a stream of nitrogen. To this solution, 11.8 g of trifluoroacetic anhydride was added dropwise over a 30-minute period. The temperature of the admixture was raised to room temperature, and reaction was run for 4 hours. To this reaction mixture was added 20 g of potassium nonafluorobutanesulfonate dissolved in an acetonitrile/water mixture. The chloroform phase was washed with water, and concentrated to yield crude crystals. These crystals were washed with diisopropyl ether to give 14.8 g of Compound (I-17).

NMR Spectrum of Compound (I-17)

300 MHz $^1$H-NMR (DMSO-d$_6$): δ 2.2 to 2.5 (m. 4H), δ 3.6 to 4.0 (m. 4H), δ 7.2 to 7.4 (m. 2H), δ 7.61 (d. 1H), δ 7.78 (d. 1H), δ 8.34 (d. 1H), δ 12.58 (bs. 1H)

Synthesis Example 3

Synthesis of Compound (I-18)

Into 100 ml of chloroform, 5 g of 1-methylindole and 3.9 g of tetramethylene sulfoxide were dissolved and cooled to −30° C. in a stream of nitrogen. To this solution, 8 g of trifluoroacetic anhydride was added dropwise over a 30-minute period. The temperature of the admixture was raised to room temperature, and reaction was run for 4 hours. To this reaction mixture was added 13.5 g of potassium nonafluorobutanesulfonate dissolved in an acetonitrile/water mixture. The chloroform phase was washed with water, and concentrated to yield crude crystals. These crystals were recrystallized from a 1:5 mixture of ethyl acetate and diisopropyl ether to give 7.5 g of Compound (I-18).

NMR Spectrum of Compound (I-18)

300 MHz $^1$H-NMR (CDCl$_3$): δ 2.4 to 2.9 (m. 4H), δ 3.6 to 4.1 (m. 4H), δ 3.94 (s. 3H), δ 7.3 to 7.5 (m. 3H), δ 7.65 (d. 1H), δ 8.31 (d. 1H)

Other acid generators were synthesized similarly to the above.

<Resin (B)>

The structure and the molecular weight of Resin (B) used in each Example are shown below:

-continued

| | | Molecular weight |
|---|---|---|
| RA-3 | (structures) | 10300 |
| RA-4 | (structures) | 11300 |
| RA-5 | (structures) | 8900 |
| RA-6 | (structures) | 13400 |
| RA-7 | (structures) | 9600 |

-continued

| | | Molecular weight |
|---|---|---|
| RA-8 | (structures with ratios 20, 70, 10: spiro-lactone norbornyl, norbornyl-COO-tBu, norbornyl-COOH) | 5800 |
| RA-9 | (structures with ratios 30, 20, 50: norbornyl-COO-ethylcyclohexyl, norbornyl-COO-hydroxypropyl, maleic anhydride) | 4700 |
| RA-10 | (structures with ratios 32, 39, 19, 10: norbornyl, maleic anhydride, -CH$_2$-CH(COO-tBu)-, -CH$_2$-CH(COO-methylcyclohexyl)-) | 12100 |
| RA-11 | (structures with ratios 35, 35, 30: norbornyl-COO-butyrolactone, maleic anhydride, -CH$_2$-CH(COO-cyclopentyl-cyclohexyl)-) | 10800 |
| RA-12 | (structures with ratios 10, 20, 30, 40: methoxy-tetrahydropyran, norbornyl, maleic anhydride, -CH$_2$-C(CH$_3$)(COO-adamantyl)-) | 9300 |
| RA-13 | (structures with ratios 30, 20, 40, 40: -adamantyl ester, dihydroxyadamantyl ester, norbornyl-lactone ester, -COOH) | 7300 |

-continued
| | | Molecular weight |
|---|---|---|
| RA-14 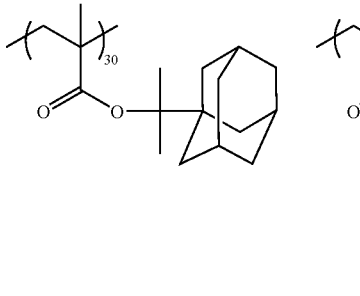 | | 7600 |
| RA-15 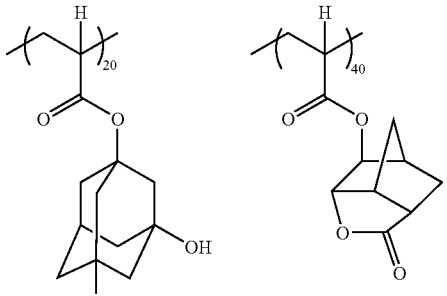 | | 8400 |
| RA-16 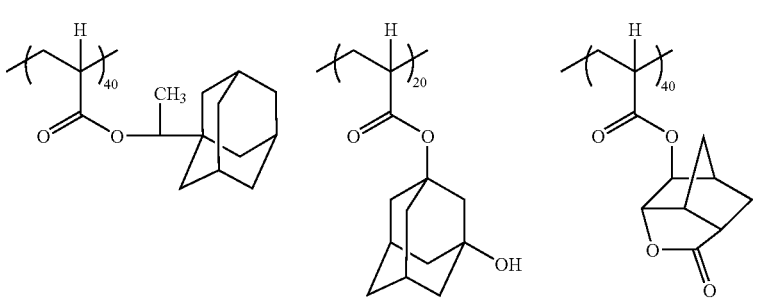 | | 6500 |

<Fluorinated Group-Containing Resin>

The structures of fluorinated group-containing resins (FII-1) to (FII-10) used in Examples are illustrated below.

In addition, the weight average molecular weight and other factors of each of the fluorinated group-containing resins (FII-1) to (FII-10) are shown in Table 1.

TABLE 1

(FII-1)

(FII-2)

(FII-3)

(FII-4)

(FII-5)

(FII-6)

(FII-7)

(FII-8)

(FII-9)

(FII-10)

| Resin | Weight average molecular weight Mw | Dispersion degree | Content of oligomer having molecular weight of 1,000 or below (%) |
|---|---|---|---|
| (FII-1) | 15,200 | 1.45 | 5 |
| (FII-2) | 24,000 | 1.75 | 8 |
| (FII-3) | 18,200 | 1.85 | 7 |
| (FII-4) | 16,500 | 1.46 | 6 |
| (FII-5) | 9,500 | 1.58 | 8 |
| (FII-6) | 19,500 | 2.02 | 8 |
| (FII-7) | 6,500 | 1.85 | 7 |
| (FII-8) | 28,400 | 1.68 | 9 |
| (FII-9) | 28,600 | 1.44 | 5 |
| (FII-10) | 12,800 | 1.65 | 8 |

Examples 1 to 27 and Comparative Examples 1 and 2

<Preparation of Resist>

The combinations of ingredients shown in Table 2 were dissolved in solvents shown in Table 2, respectively, to prepare solutions having a solids concentration of 12% by mass. Each of the solutions was filtered through a 0.1-μm polytetrafluoroethylene or polyethylene filter. Thus, positive resist solutions were prepared. The positive resist solutions thus prepared were evaluated by methods described hereinafter and evaluation results obtained are shown in Table 2.

TABLE 2

| | (A) Acid generator (g) | Other acid generator (g) | (B) Resin (g) | Basic Compound (g) | Surfactant (g) | Solvent (ratio by mass) | Exposure latitude (%) | Line-edge roughness (nm) |
|---|---|---|---|---|---|---|---|---|
| Example 1 | I-1 (0.3) | — | RA-1 (10) | DIA (0.03) | W-4 (0.01) | A1/B1 = 70/30 | 14.7 | 4.1 |
| Example 2 | I-17 (0.5) | — | RA-3 (10) | TPA (0.03) | W-2 (0.02) | A1/A3 = 40/60 | 14.8 | 4.0 |
| Example 3 | I-18 (0.2) | z6 (0.2) | RA-4 (10) | HAP (0.02) | W-1 (0.01) | A1/B1 = 50/50 | 15.4 | 3.8 |
| Example 4 | I-5 (0.3) | z8 (0.1) | RA-4 (10) | DIA (0.03) | W-4 (0.01) | A1/B1 = 60/40 | 15.6 | 3.9 |
| Example 5 | I-1 (0.4) | z12 (0.05) | RA-5 (10) | PEA (0.01) | W-4 (0.01) | A1/B1 = 60/40 | 15.1 | 3.7 |
| Example 6 | I-1 (0.2) I-35 (0.2) | z36 (0.1) | RA-5 (10) | DIA (0.02) PEA (0.02) | W-4 (0.01) | A1/A3 = 60/40 | 15.3 | 3.9 |
| Example 7 | I-11 (0.3) | z40 (0.1) | RA-7 (10) | TMEA (0.03) | W-3 (0.03) | A1/B2 = 80/20 | 14.3 | 4.5 |
| Example 8 | I-29 (0.6) | z41 (0.3) | RA-8 (10) | TBAH (0.04) | W-1 (0.005) | A2/B1 = 80/20 | 14.2 | 4.4 |
| Example 9 | I-24 (0.5) | z42 (0.3) | RA-9 (10) | HEP (0.03) | W-3 (0.02) | A3/B1 = 70/30 | 14.4 | 4.6 |
| Example 10 | I-1 (0.3) | z14 (0.1) | RA-11 (10) | TPSA (0.05) | W-3 (0.01) | A1/A3 = 60/40 | 14.1 | 4.4 |
| Example 11 | I-6 (0.2) | z25 (0.4) | RA-12 (10) | DCMA (0.03) | W-4 (0.01) | A1/A3 = 60/40 | 14.2 | 4.6 |
| Example 12 | I-13 (0.3) | — | RA-13 (10) | DIA (0.03) | W-4 (0.01) | A1/B1 = 60/40 | 15.6 | 3.5 |
| Example 13 | I-15 (0.7) | z4 (0.03) | RA-14 (10) | PEA (0.01) | W-2 (0.02) | A1/A3 = 60/40 | 15.3 | 3.6 |
| Example 14 | I-31 (0.5) | — | RA-15 (10) | PEA (0.04) | W-4 (0.01) | A1/A3 = 60/40 | 15.7 | 3.5 |
| Example 15 | I-18 (0.3) | z14 (0.2) | RA-16 (10) | DIA (0.03) | W-2 (0.02) | A1/A3 = 60/40 | 15.0 | 3.3 |
| Example 16 | I-27 (0.2) | z14 (0.2) | RA-4 (10) | DIA (0.03) | W-2 (0.01) | A1/A3 = 60/40 | 15.2 | 3.7 |
| Example 17 | I-2 (0.15) | z55 (0.2) | RA-5 (10) | DIA (0.02) | W-4 (0.01) | A1/A3 = 60/40 | 15.4 | 3.8 |
| Example 18 | I-1 (0.4) | z4 (0.02) | RA-13 (10) | PEA (0.02) | W-4 (0.01) | A1/B1 = 60/40 | 15.5 | 3.6 |
| Example 19 | I-18 (0.3) | z6 (0.1) z1 (0.1) | RA-13 (5) RA-10 (5) | DIA (0.02) DCMA (0.02) | W-4 (0.01) | A1/A3 = 60/40 | 15.2 | 3.3 |
| Example 20 | I-13 (0.3) I-18 (0.1) | z14 (0.2) | RA-3 (5) RA-5 (5) | TPA (0.02) PEA (0.02) | W-4 (0.01) | A1/B1 = 60/40 | 15.1 | 3.4 |
| Example 21 | I-2 (0.2) | z55 (0.1) z6 (0.1) | RA-13 (5) RA-6 (5) | DIA (0.02) TMEA (0.02) | W-4 (0.01) | A1/B1 = 60/40 | 15.7 | 3.8 |
| Example 22 | I-3 (0.2) | z58 (0.1) z44 (0.1) | RA-13 (5) RA-2 (5) | TPSA (0.02) PEA (0.02) | W-4 (0.01) | A1/A4 = 95/5 | 15.2 | 3.4 |
| Example 23 | I-44 (0.5) | — | RA-13 (10) | DIA (0.03) | W-4 (0.01) | A1/B1 = 60/40 | 14.8 | 4.5 |
| Example 24 | I-53 (0.5) | — | RA-13 (10) | DIA (0.03) | W-4 (0.01) | A1/B1 = 60/40 | 14.9 | 4.3 |
| Example 25 | I-57 (0.5) | — | RA-13 (10) | DIA (0.03) | W-4 (0.01) | A1/B1 = 60/40 | 14.6 | 4.5 |
| Example 26 | I-52 (0.3) | — | RA-13 (10) | DIA (0.03) | W-4 (0.01) | A1/B1 = 60/40 | 15.0 | 4.6 |
| Example 27 | I-57 (0.5) | — | RA-13 (10) | DIA (0.03) | W-4 (0.01) | A1/B1 = 60/40 | 14.8 | 4.2 |
| Comparative Example 1 | — | PAG-A (0.3) | RA-1 (10) | DIA (0.03) | W-4 (0.01) | A1/B1 = 70/30 | 9.2 | 6.7 |
| Comparative Example 2 | — | PAG-B (0.5) | RA-3 (10) | TPA (0.03) | W-2 (0.02) | A1/A3 = 40/60 | 10.1 | 9.4 |

The symbols in Table 2 and Tables 3, 4, 5 and 7 shown below stand for the following compounds, respectively.

[Acid Generators]

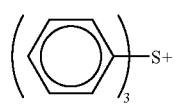

PAG-A

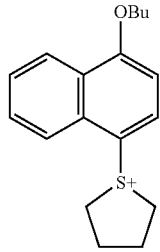

PAG-B

[Basic Compounds]
TPI: 2,4,5-Triphenylimidazole
TPSA: Triphenylsulfonium acetate
HEP: N-hydroxyethylpiperidine
DIA: 2,6-Diisopropylaniline
DCMA: Dicyclohexylmethylamine
TPA: Tripentylamine
HAP: Hydroxyantipyrine
TBAH: Tetrabutylammonium hydroxide
TMEA:Tris(methoxyethoxyethyl) amine
PEA: N-Phenyldiethanolamine

[Surfactants]
W-1: Megafac F176 (produced by Dainippon Ink & Chemicals, Inc.) (a surfactant containing fluorine atoms)
W-2: Megafac R08 (produced by Dainippon Ink & Chemicals, Inc.) (a surfactant containing fluorine and silicon atoms)
W-3: Organosiloxane polymer KP-341 (produced by Shin-Etsu Chemical Co., Ltd.)
W-4: Troysol S-366 (produced by Troy Chemical Industries, Inc.)

[Solvents]
A1: Propylene glycol methyl ether acetate
A2: 2-Heptanone
A3: Cyclohexanone
A4: γ-Butyrolactone
B1: Propylene glycol methyl ether
B2: Ethyl lactate <Resist Evaluation>

DUV-42 for an anti-reflective coating, a product of Brewer Science Ltd., was coated uniformly in a thickness of 600 angstrom on a hexamethyldisilazane-treated silicon substrate by means of a spin coater, and then dried for 90 seconds on a 100° C. hot plate and further dried by 240 seconds' heating at 190° C. On the thus dried coating, each of the positive resist solutions was further coated, and dried at 120° C. for 90 seconds. Thus, resist films having a thickness of 0.25 μm were formed. Each of the resist films formed was exposed by means of an ArF excimer laser stepper (NA=0.75, made by ASML Inc.) via a mask. Immediately after the exposure, each resist film was heated on a hot plate at 120° C. for 90 seconds. Subsequently thereto, the resist film was developed for 60 seconds at 23° C. with a 2.38% (by mass) aqueous solution of tetramethylammonium hydroxide, rinsed with purified water for 30 seconds, and then dried. Thus, line patterns were obtained.

Exposure Latitude:

An exposure amount required for reproducing the line-and-space mask pattern having a line width of 90 nm was taken as an optimum exposure amount, the range of exposure amounts allowing pattern sizes of 90 nm±10% when changes were made in exposure amount was determined, and the value determined was divided by the optimum exposure amount and expressed in percentage. The greater the value expressed in percentage, the smaller the performance change arising from changes in exposure amount, namely the better the exposure latitude.

Line-Edge Roughness:

In evaluation of line-edge roughness, observation of a 90-nm pattern was performed with a Critical Dimension scanning electron microscope (SEM). At 50 points within the range of 5 μm in the length direction of the line pattern, measurements were made on the distance between a line pattern edge and a base line on which the edge should be by means of the Critical Dimension SEM (Model S-8840, made by Hitachi Ltd.), the standard deviation of the distances measured was determined, and 3σ was calculated. The smaller the value 3σ, the better the performance.

As can be seen from the evaluation results shown in Table 2, the present photosensitive compositions were satisfactory in both exposure latitude and line-edge roughness in the case where they had undergone ArF exposure.

[Immersion Exposure Evaluation]

<Preparation of Resist>

The combinations of ingredients for Examples 1 to 27 shown in Table 2 were dissolved in solvents shown in Table 2, respectively, to prepare solutions having a solids concentration of 10% by mass. Each of the solutions was filtered through a 0.1-μm polyethylene filter. Thus, positive resist solutions were prepared. The positive resist solutions thus prepared were evaluated according to the following method.

<Evaluation of Resolution>

ARC29A for an organic anti-reflective coating, a product of Nissan Chemical Co., Ltd., was coated on a silicon wafer, and baked at 205° C. for 60 seconds to form a 78-nm anti-reflective coating. On the coating thus formed, each of the positive resist compositions prepared was coated, and baked at 115° C. for 60 seconds. Thus, a resist film having a thickness of 150 ml was formed. Each of the wafers thus obtained was subjected to two-flux interference exposure using purified water as immersion liquid (wet exposure). In the two-flux interference exposure (wet exposure), laser, a diaphragm, a shutter, three reflecting mirrors and a condenser were used, and each resist film was exposed via a prism and immersion liquid (purified water). Herein were used the laser with a wavelength of 193 nm and the prism for forming 65-nm line-and-space patterns. Immediately after the exposure, each resist film was heated at 115° C. for 90 seconds. Subsequently thereto, the resist film was developed for 60 seconds with an aqueous solution of tetramethylammonium hydroxide (2.38%), rinsed with purified water, and then underwent spin-drying. The thus obtained resist patterns were observed with a scanning electron microscope (Model S-9260, made by Hitachi Ltd.), and thereby resolution of the 65-nm line-and-space pattern was confirmed.

The compositions prepared in Examples 1 to 27 had excellent image-forming abilities in the application of the method of exposure via immersion liquid, too.

Examples 28 to 32 and Comparative Examples 3 and 4

(1) Formation of Lower Resist Layer:

FHi-028DD resist (i-ray resist manufactured by Fuji-Olin Co., Ltd.) was coated on a 6-inch silicon wafer with a spin coater, Mark 8 (made by Tokyo Electron Limited), and then baked at 90° C. for 90 seconds, thereby obtaining a uniform film having a thickness of 0.55 μm.

Further, this film was heated at 200° C. for 3 minutes to form a lower resist layer having a thickness of 0.40 μm.

(2) Formation of Upper Resist Layer

The combinations of ingredients shown in Table 3 were dissolved in solvents shown in Table 3, respectively, to prepare solutions having a solids concentration of 11% by mass. Each of the solutions obtained was finely filtered with a membrane filter having a pore diameter of 0.1 μm, thereby preparing each resist composition for an upper layer.

On the lower resist layer, the resist composition for a upper layer was coated in the same manner as the resist for the lower layer, and heated at 130° C. for 90 seconds, thereby forming the upper resist layer having a thickness of 0.20 μm.

The resins (SI-1) to (SI-5) in Table 3 are as follows:

|  | Molecular weight |
|---|---|
| (SI-1) | 15000 |
| (SI-2) | 14500 |
| (SI-3) | 9600 |
| (SI-4) | 8900 |

|  | Molecular weight |
|---|---|
| (SI-5) | 10800 |

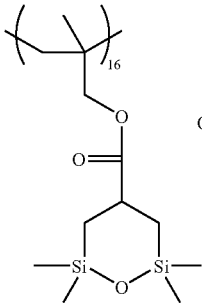

(3) Resist Evaluation

The thus obtained wafers each were exposed to light as the exposure amount was altered by use of a resolution mask-mounted ArF Excimer Stepper 9300 made by ISI.

Thereafter, each wafer was heated at 120° C. for 90 seconds, and then it was developed for 60 seconds with a tetrahydroammonium hydroxide developer (2.38% by mass), rinsed with distilled water, and followed by drying. Thus, upper-layer patterns were obtained.

The patterns obtained were evaluated on exposure latitude and line-edge roughness in accordance with the same methods as in Example 1, and the evaluation results are shown in Table 3.

TABLE 3

|  | (A) Acid generator (g) | Other acid generator (g) | (B) Resin (10 g) | Basic Compound (g) | Surfactant (g) | Solvent (ratio by mass) | Exposure latitude (%) | Line-edge roughness (nm) |
|---|---|---|---|---|---|---|---|---|
| Example 28 | I-1 (0.7) | — | SI-1 | DIA (0.03) | W-4 (0.01) | A1 = 100 | 14.5 | 4.3 |
| Example 29 | I-17 (0.9) | — | SI-2 | TPA (0.03) | W-2 (0.02) | A1/A3 = 40/60 | 15.2 | 4.2 |
| Example 30 | I-18 (0.4) | z6 (0.2) | SI-3 | HAP (0.02) | W-1 (0.01) | A1/B1 = 60/40 | 15.4 | 3.4 |
| Example 31 | I-5 (0.5) | z8 (0.1) | SI-4 | DIA (0.03) | W-4 (0.01) | A1/B1 = 60/40 | 16.6 | 3.2 |
| Example 32 | I-11 (0.7) | z12 (0.05) | SI-5 | PEA (0.01) | W-4 (0.01) | A1/A3 = 60/40 | 15.7 | 3.2 |
| Comparative Example 3 | — | PAG-A (0.7) | SI-1 | DIA (0.03) | W-4 (0.01) | A1 = 100 | 8.1 | 5.7 |
| Comparative Example 4 | — | PAG-B (0.9) | SI-2 | TPA (0.03) | W-2 (0.02) | A1/A3 = 40/60 | 11.2 | 7.3 |

As can be seen from the results shown in Table 3, the present photosensitive compositions were satisfactory in both exposure latitude and line-edge roughness even when they were used in two-layer resists.

Examples 33 to 42 and Comparative Examples 5 and 6

<Preparation and Evaluation of Resist>

The combinations of ingredients shown in Table 4 were dissolved in solvents shown in Table 4, respectively, to prepare solutions having a solids concentration of 5% by mass. Each of the solutions was filtered through a 0.1-μm polyethylene filter. Thus, resist solutions were prepared.

Each of the resist solutions was coated on a hexamethyldisilazane-treated silicon wafer by means of a spin coater, and then dried by 90 seconds' heating on a 120° C. vacuum-contact hot plate. Thus, resist films having a thickness of 120 nm were formed.

Each of the resist films formed was subjected to patterning with an $F_2$ excimer laser stepper (157 nm). Immediately thereafter, each resist film was heated on a hot plate at 120° C. for 90 seconds. Subsequently thereto, the resist film was developed for 60 seconds with a 2.38% (by mass) aqueous solution of tetramethylammonium hydroxide, and rinsed with purified water. Thus, sample wafers were prepared.

Exposure Latitude:

An exposure amount required for reproducing the line-and-space mask pattern having a line width of 80 nm was taken as an optimum exposure amount, the range of exposure amounts allowing pattern sizes of 80 nm±10% when changes were made in exposure amount was determined, and the value determined was divided by the optimum exposure amount and expressed in percentage. The greater the value expressed in percentage, the smaller the performance change arising from changes in exposure amount, namely the better the exposure latitude.

Line-Edge Roughness:

In evaluation of line-edge roughness, observation of a 80-nm pattern was performed with a Critical Dimension scanning electron microscope (SEM). At 50 points within the range of 5 μm in the length direction of the line pattern, measurements were made on the distance between a line pattern edge and a base line on which the edge should be by means of the Critical Dimension SEM (Model S-8840, made by Hitachi Ltd.), the standard deviation of the distances measured was determined, and 3σ was calculated. The smaller the value 3σ, the better the performance. The evaluation results obtained are shown in Table 4.

TABLE 4

|  | (A) Acid generator (g) | Other acid generator (g) | (B) Resin (10 g) | Basic Compound (g) | Surfactant (g) | Solvent (ratio by mass) | Exposure latitude (%) | Line-edge roughness (nm) |
|---|---|---|---|---|---|---|---|---|
| Example 33 | I-1 (0.3) | — | FII-1 | DIA (0.3) | W-4 (0.01) | A1/B1 = 70/30 | 13.2 | 5.2 |
| Example 34 | I-17 (0.5) | — | FII-2 | TPA (0.3) | W-2 (0.02) | A1/A3 = 40/60 | 13.5 | 4.7 |
| Example 35 | I-18 (0.2) | z6 (0.2) | FII-3 | HAP (0.02) | W-1 (0.01) | A1/B1 = 50/50 | 14.4 | 4.6 |
| Example 36 | I-5 (0.3) | z8 (0.1) | FII-4 | DIA (0.3) | W-4 (0.01) | A1/B1 = 60/40 | 15.2 | 4.9 |
| Example 37 | I-18 (0.3) | z14 (0.2) | FII-5 | PEA (0.3) | W-4 (0.01) | A1/B1 = 60/40 | 14.0 | 4.7 |
| Example 38 | I-27 (0.2) | z14 (0.2) | FII-6 | DIA (0.02) PEA (0.02) | W-4 (0.01) | A1/A3 = 60/40 | 13.4 | 4.3 |
| Example 39 | I-2 (0.15) | z55 (0.2) | FII-7 | TMEA (0.3) | W-3 (0.03) | A1/B2 = 80/20 | 12.3 | 4.8 |
| Example 40 | I-1 (0.4) | z4 (0.2) | FII-8 | TBAH (0.04) | W-1 (0.005) | A2/B1 = 80/20 | 14.7 | 4.6 |
| Example 41 | I-18 (0.3) | z6 (0.1) z1 (0.1) | FII-9 | HEP (0.3) | W-3 (0.02) | A3/B1 = 70/30 | 14.4 | 4.7 |
| Example 42 | I-13 (0.3) I-18 (0.1) | z14 (0.2) | FII-10 | TPSA (0.05) | W-3 (0.01) | A1/A3 = 60/40 | 13.3 | 4.2 |
| Comparative Example 5 | — | PAG-A (0.3) | FII-1 | DIA (0.3) | W-4 (0.01) | A1/B1 = 70/30 | 8.6 | 7.8 |
| Comparative Example 6 | — | PAG-B (0.5) | FII-2 | TPA (0.3) | W-2 (0.02) | A1/A3 = 40/60 | 8.2 | 8.0 |

As can be seen from the results shown in Table 4, the present photosensitive compositions were satisfactory in both exposure latitude and line-edge roughness in the case where they had undergone exposure to $Fe_2$ excimer laser, too.

Examples 43 to 55 and Comparative Examples 7 and 8

<Preparation of Resist>

The combinations of ingredients shown in Table 5 were dissolved in solvents shown in Table 5, respectively. The resulting solutions were each filtered through a 0.1-μm polytetrafluoroethylene filter to prepare positive resist solutions having a solids concentration of 14% by mass.

TABLE 5

|  | (A) Acid generator (g) | Other acid generator (g) | (B) Resin (g) | Basic Compound (g) | Surfactant (g) | Solvent (ratio by mass) | Exposure latitude (%) | Line-edge roughness (nm) |
|---|---|---|---|---|---|---|---|---|
| Example 43 | I-1 (0.3) | — | R-7 (10) | TPI (0.03) | W-4 (0.01) | A1/B1 = 70/30 | 14.3 | 4.6 |
| Example 44 | I-17 (0.5) | — | R-8 (10) | TPA (0.03) | W-2 (0.02) | A1/A3 = 40/60 | 14.2 | 4.7 |

TABLE 5-continued

| | (A) Acid generator (g) | Other acid generator (g) | (B) Resin (g) | Basic Compound (g) | Surfactant (g) | Solvent (ratio by mass) | Exposure latitude (%) | Line-edge roughness (nm) |
|---|---|---|---|---|---|---|---|---|
| Example 45 | I-18 (0.2) | z6 (0.2) | R-9 (10) | HAP (0.02) | W-1 (0.01) | A1/B1 = 50/50 | 13.5 | 4.5 |
| Example 46 | I-5 (0.3) | z8 (0.1) | R-14 (10) | DCMA (0.03) | W-4 (0.01) | A1/B1 = 60/40 | 14.5 | 4.5 |
| Example 47 | I-1 (0.4) | z12 (0.1) | R-17 (10) | PEA (0.01) | W-4 (0.01) | A1/B1 = 60/40 | 14.1 | 4.8 |
| Example 48 | I-1 (0.4) | z4 (0.2) | R-19 (5) R-27 (5) | DIA (0.02) PEA (0.02) | W-4 (0.01) | A1/A3 = 60/40 | 13.8 | 4.4 |
| Example 49 | I-18 (0.3) | z32 (0.1) z1 (0.1) | R-23 (10) | TMEA (0.03) | W-3 (0.03) | A1/B2 = 80/20 | 13.6 | 4.2 |
| Example 50 | I-13 (0.3) I-18 (0.1) | z31 (0.2) | R-24 (10) | TBAH (0.04) | W-1 (0.005) | A2/B1 = 80/20 | 15.7 | 3.4 |
| Example 51 | I-2 (0.2) | z55 (0.1) z34 (0.1) | R-25 (5) R-2 (5) | HEP (0.03) | W-3 (0.02) | A3/B1 = 70/30 | 15.3 | 3.7 |
| Example 52 | I-3 (0.2) | z58 (0.1) z44 (0.1) | R-27 (5) R-22 (5) | TPSA (0.05) | W-3 (0.01) | A1/A3 = 60/40 | 15.3 | 3.5 |
| Example 53 | I-61 (0.2) | z58 (0.1) z44 (0.1) | R-27 (5) R-22 (5) | TPSA (0.05) | W-3 (0.01) | A1/A3 = 60/40 | 14.1 | 4.0 |
| Example 54 | I-62 (0.2) | z58 (0.1) z44 (0.1) | R-27 (5) R-22 (5) | TPSA (0.05) | W-3 (0.01) | A1/A3 = 60/40 | 14.3 | 4.2 |
| Example 55 | I-58 (0.2) | z58 (0.1) z44 (0.1) | R-27 (5) R-22 (5) | TPSA (0.05) | W-3 (0.01) | A1/A3 = 60/40 | 14.6 | 4.2 |
| Comparative Example 7 | — | PAG-A (0.3) | R-7 (10) | TPI (0.03) | w-4 (0.01) | A1/B1 = 70/30 | 9.8 | 6.9 |
| Comparative Example 8 | — | PAG-B (0.5) | R-8 (10) | TPA (0.03) | W-2 (0.2) | A1/A3 = 40/60 | 10.3 | 8.6 |

Molar ratio between repeating units in each of the resins (R-2) to (R-27) in Table 5 and weight average molecular weight of each resin are set forth in Table 6.

TABLE 6

| Resin | Molar ratio between repeating units (corresponding to arranging order, the left first) | Weight average molecular weight |
|---|---|---|
| R-2 | 60/40 | 12,000 |
| R-7 | 60/30/10 | 18,000 |
| R-8 | 60/20/20 | 12,000 |
| R-9 | 10/50/40 | 13,000 |
| R-14 | 75/25 | 12,000 |
| R-17 | 10/70/20 | 15,000 |
| R-19 | 10/70/20 | 11,000 |
| R-22 | 70/30 | 12,000 |
| R-23 | 10/60/30 | 8,000 |
| R-24 | 50/20/30 | 16,000 |
| R-25 | 10/70/20 | 13,000 |
| R-27 | 70/10/20 | 12,000 |

<Resist Evaluation>

Each of the positive resist solutions prepared was coated uniformly on a hexamethyldisilazane-treated silicon substrate by means of a spin coater, and dried by heating on a hot plate at 120° C. for 90 seconds. Thus, resist films having a thickness of 0.4 µm were formed. Each of the resist films formed was exposed by means of a KrF excimer laser stepper (NA=0.63) via a mask for line-and-space patterns. Immediately after the exposure, each resist film was heated on a hot plate at 110° C. for 90 seconds. Subsequently thereto, the resist film was developed for 60 seconds at 23° C. with a 2.38% (by mass) aqueous solution of tetramethylammonium hydroxide, rinsed with purified water for 30 seconds, and then dried. Thus, line patterns were formed.

Exposure Latitude:

An exposure amount required for reproducing the line-and-space mask pattern having a line width of 130 nm was taken as an optimum exposure amount, the range of exposure amounts allowing pattern sizes of 130 nm±10% when changes were made in exposure amount was determined, and the value determined was divided by the optimum exposure amount and expressed in percentage. The greater the value expressed in percentage, the smaller the performance change arising from changes in exposure amount, namely the better the exposure latitude.

Line-Edge Roughness:

In evaluation of line-edge roughness, observation of a 130-nm pattern was performed with a Critical Dimension scanning electron microscope (SEM). At 50 points within the range of 5 µm in the length direction of the line pattern, measurements were made on the distance between a line pattern edge and a base line on which the edge should be by means of the Critical Dimension SEM (Model S-8840, made by Hitachi Ltd.), the standard deviation of the distances measured was determined, and 3σ was calculated. The smaller the value 3σ, the better the performance.

Evaluation results are shown in Table 5.

As can be seen from the results shown in Table 5, the present photosensitive compositions delivered satisfactory exposure latitude and line-edge roughness in the use as positive resist compositions for exposure to KrF excimer laser, too.

Examples 56 to 65 and Comparative Examples 9 and 10

<Preparation and Evaluation of Resist>

The combinations of ingredients shown in Table 7 were dissolved in solvents shown in Table 7, respectively. The resulting solutions were each filtered through a 0.1-µm polytetrafluoroethylene filter to prepare negative resist solutions having a solids concentration of 14% by mass.

Each of the negative resist solutions thus prepared was evaluated by the same methods as in Example 43, and results obtained are shown in Table 7.

TABLE 7

| | (A) Acid generator (g) | Other acid generator (g) | Resin (g) | Cross-linking agent (g) | Basic Compound (g) | Surfactant (g) | Solvent (ratio by mass) | Exposure latitude (%) | Line-edge roughness (nm) |
|---|---|---|---|---|---|---|---|---|---|
| Example 56 | I-1 (0.3) | — | P-1 (10) | CL-1 (2) | TPI (0.03) | W-4 (0.01) | A1/B1 = 70/30 | 14.6 | 4.4 |
| Example 57 | I-17 (0.5) | — | P-2 (10) | CL-2 (3) | TPA (0.03) | W-2 (0.02) | A1/A3 = 40/60 | 14.3 | 4.6 |
| Example 58 | I-18 (0.2) | z6 (0.2) | P-3 (10) | CL-3 (2.5) | HAP (0.02) | W-1 (0.01) | A1/B1 = 50/50 | 14.4 | 4.2 |
| Example 59 | I-5 (0.3) | z8 (0.1) | P-4 (10) | CL-4 (3) | DCMA (0.03) | W-4 (0.01) | A1/B1 = 60/40 | 14.2 | 4.3 |
| Example 60 | I-1 (0.4) | z12 (0.1) | P-5 (10) | CL-5 (1.5) | PEA (0.01) | W-4 (0.01) | A1/B1 = 60/40 | 15.1 | 4.7 |
| Example 61 | I-1 (0.4) | z4 (0.2) | P-2 (5) P-6 (5) | CL-1 (2) CL-5 (2) | DIA (0.02) PEA (0.02) | W-4 (0.01) | A1/A3 = 60/40 | 14.3 | 4.1 |
| Example 62 | I-18 (0.3) | z32 (0.1) z1 (0.1) | P-1 (10) | CL-6 (3) | TMEA (0.03) | W-3 (0.03) | A1/B2 = 80/20 | 14.7 | 4.5 |
| Example 63 | I-13 (0.3) I-18 (0.1) | z31 (0.2) | P-6 (10) | CL-1 (3) | TBAH (0.04) | W-1 (0.005) | A2/B1 = 80/20 | 14.5 | 4.3 |
| Example 64 | I-2 (0.2) | z55 (0.1) z34 (0.1) | P-3 (10) | CL-2 (3) | HEP (0.03) | W-3 (0.02) | A3/B1 = 70/30 | 14.3 | 4.2 |
| Example 65 | I-3 (0.2) | z58 (0.1) z44 (0.1) | P-4 (10) | CL-4 (2.5) | TPSA (0.05) | W-3 (0.01) | A1/A3 = 60/40 | 14.4 | 4.3 |
| Comparative Example 9 | — | PAG-A (0.3) | P-1 (10) | CL-1 (2) | TPI (0.03) | W-4 (0.01) | A1/B1 = 70/30 | 10.3 | 7.8 |
| Comparative Example 10 | — | PAG-B (0.5) | P-2 (10) | CL-2 (3) | TPA (0.03) | W-2 (0.02) | A1/A3 = 40/60 | 8.9 | 9.6 |

The structural formula, molecular weight and molecular weight distribution of each alkali-soluble resin in Table 7 and the structural formula of each cross-linking agent in Table 7 are shown below:

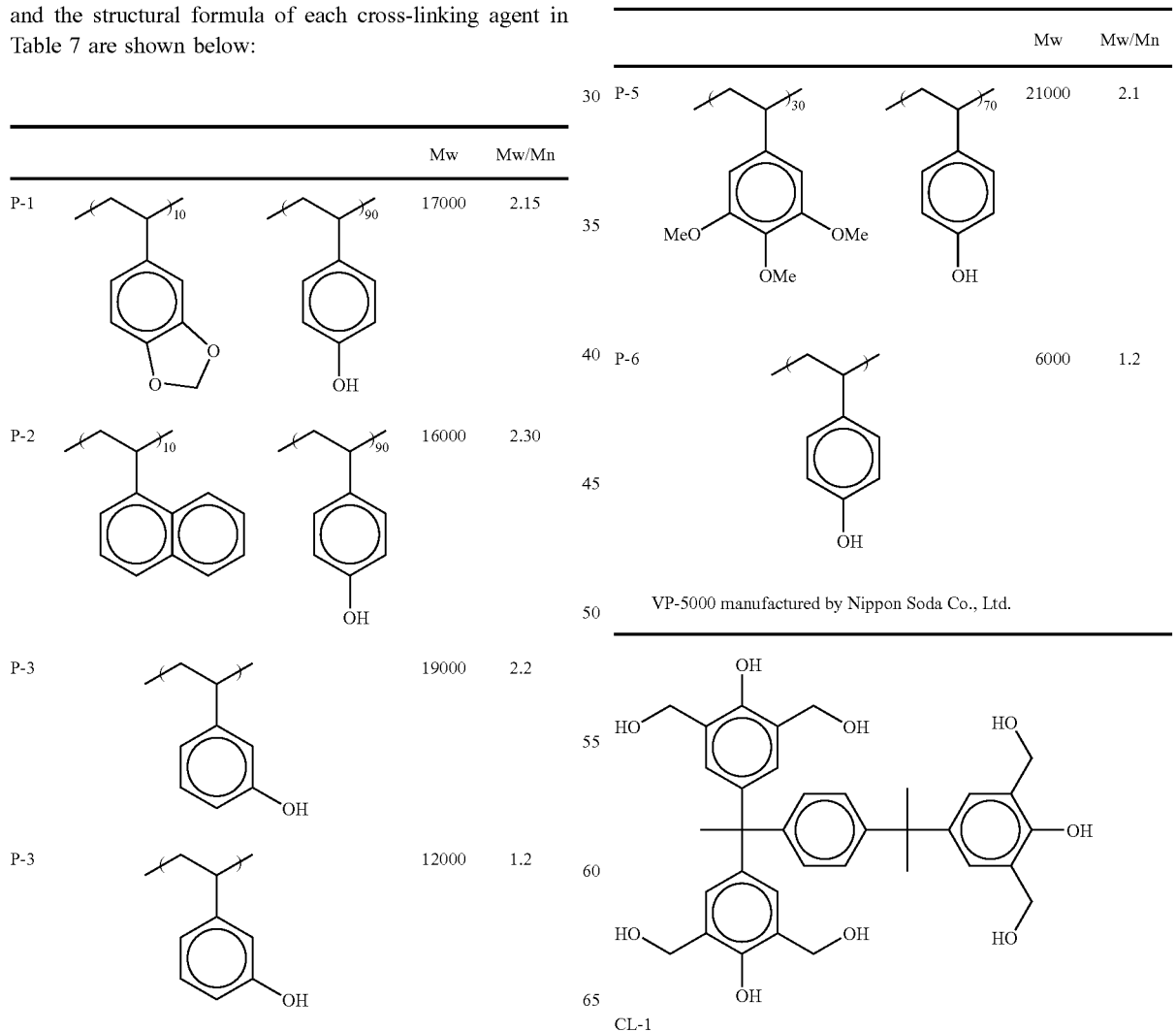

VP-5000 manufactured by Nippon Soda Co., Ltd.

-continued

| | Mw | Mw/Mn |
|---|---|---|

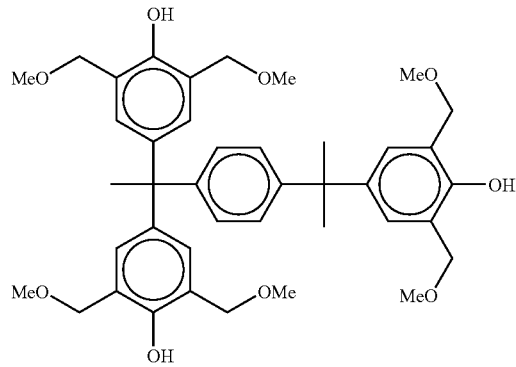
CL-2

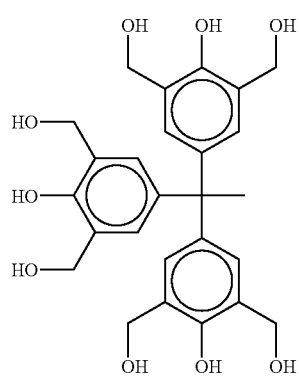
CL-3

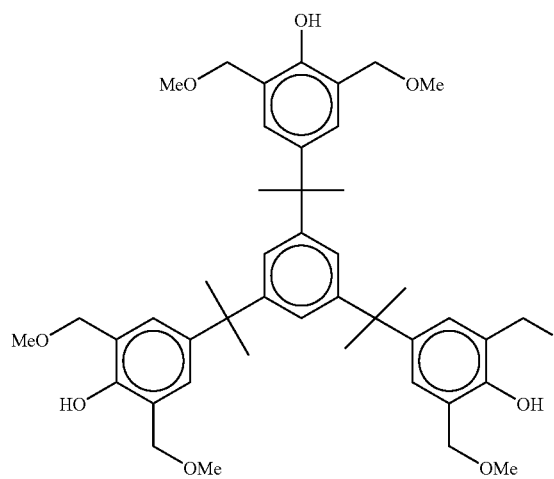
CL-4

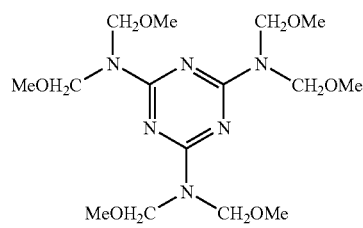
CL-5

-continued

| | Mw | Mw/Mn |
|---|---|---|

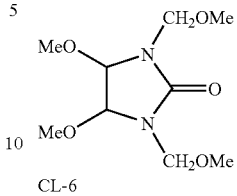
CL-6

As can be seen from the results shown in Table 7, the present photosensitive compositions had satisfactory exposure latitude and line-edge roughness in the use as negative resist compositions for exposure to KrF excimer laser.

Examples 66 to 75 and Comparative Examples 11 and 12

<Preparation of Resist>

The combinations of ingredients shown in Table 5 were dissolved in solvents shown in Table 5, respectively. The resulting solutions were each filtered through a 0.1 μm polytetrafluoroethylene filter to prepare positive resist solutions having a solids concentration of 12% by mass.

<Resist Evaluation>

Each of the positive resist solutions prepared was coated uniformly on a hexamethyldisilazane-treated silicon substrate by means of a spin coater, and dried by heating on a hot plate at 120° C. for 60 seconds. Thus, resist films having a thickness of 0.3 μm were formed. Each of the resist films formed was irradiated by means of electron-beam projection lithographic apparatus (acceleration voltage: 100 keV) made by Nikon Corporation. Immediately after the irradiation, each resist film was heated on a hot plate at 110° C. for 90 seconds. Subsequently thereto, the resist film was developed for 60 seconds at 23° C. with a 2.38% (by mass) aqueous solution of tetramethylammonium hydroxide, rinsed with purified water for 30 seconds, and then dried. Thus, line-and-space patterns were formed.

Exposure Latitude:

An exposure amount required for reproducing the line-and-space mask pattern having a line width of 100 nm was taken as an optimum exposure amount, the range of exposure amounts allowing pattern sizes of 100 nm±10% when changes were made in exposure amount was determined, and the value determined was divided by the optimum exposure amount and expressed in percentage. The greater the value expressed in percentage, the smaller the performance change arising from changes in exposure amount, namely the better the exposure latitude.

Line-Edge Roughness:

In evaluation of line-edge roughness, observation of a 100-nm pattern was performed with a Critical Dimension scanning electron microscope (SEM). At 50 points within the range of 5 μm in the length direction of the line pattern, measurements were made on the distance between a line pattern edge and a base line on which the edge should be by means of the Critical Dimension SEM (Model S-8840, made by Hitachi Ltd.), the standard deviation of the distances measured was determined, and 3σ was calculated. The smaller the value 3σ, the better the performance.

Evaluation results are shown in Table 8.

TABLE 8

|  | Exposure latitude (%) | Line-edge roughness (nm) |
|---|---|---|
| Example 66 | 13.2 | 4.8 |
| Example 67 | 13.7 | 4.4 |
| Example 68 | 14.4 | 4.3 |
| Example 69 | 13.5 | 4.4 |
| Example 70 | 14.1 | 4.2 |
| Example 71 | 13.5 | 4.6 |
| Example 72 | 13.7 | 4.1 |
| Example 73 | 13.6 | 3.6 |
| Example 74 | 14.4 | 3.8 |
| Example 75 | 13.5 | 3.5 |
| Comparative Example 11 | 7.3 | 6.9 |
| Comparative Example 12 | 8.4 | 8.2 |

As can be seen from the results shown in Table 8, the present photosensitive compositions had satisfactory exposure latitude and line-edge roughness in the use as positive resist compositions for electron-beam irradiation.

Examples 76 to 85 and Comparative Examples 13 and 14

<Preparation of Resist>

The combinations of ingredients shown in Table 7 were dissolved in solvents shown in Table 7, respectively. The resulting solutions were each filtered through a 0.1-μm polytetrafluoroethylene filter to prepare negative resist solutions having a solids concentration of 12% by mass.

<Resist Evaluation>

Each of the negative resist solutions prepared was coated uniformly on a hexamethyldisilazane-treated silicon substrate by means of a spin coater, and dried by heating on a hot plate at 120° C. for 60 seconds. Thus, resist films having a thickness of 0.3 μm were formed. Each of the resist films formed was irradiated by means of electron-beam projection lithographic apparatus (acceleration voltage: 100 keV) made by Nikon Corporation. Immediately after the irradiation, each resist film was heated on a hot plate at 110° C. for 90 seconds. Subsequently thereto, the resist film was developed for 60 seconds at 23° C. with a 2.38% (by mass) aqueous solution of tetramethylammonium hydroxide, rinsed with purified water for 30 seconds, and then dried. Thus, line-and-space patterns were formed.

The thus formed patterns were evaluated on exposure latitude and line-edge roughness in accordance with the same methods as in Example 66.

Evaluation results are shown in Table 9.

TABLE 9

|  | Exposure latitude (%) | Line-edge roughness (nm) |
|---|---|---|
| Example 76 | 14.3 | 4.6 |
| Example 77 | 14.7 | 4.6 |
| Example 78 | 14.8 | 4.3 |
| Example 79 | 14.6 | 4.8 |
| Example 80 | 14.3 | 4.3 |
| Example 81 | 13.8 | 4.3 |
| Example 82 | 13.9 | 4.4 |
| Example 83 | 14.6 | 4.4 |
| Example 84 | 14.5 | 4.8 |
| Example 85 | 14.6 | 4.8 |

TABLE 9-continued

|  | Exposure latitude (%) | Line-edge roughness (nm) |
|---|---|---|
| Comparative Example 13 | 8.3 | 7.8 |
| Comparative Example 14 | 9.2 | 10.1 |

As can be seen from the results shown in Table 9, the present photosensitive compositions had satisfactory exposure latitude and line-edge roughness in the use as negative resist compositions for electron-beam irradiation.

In accordance with the invention, it is possible to provide a photosensitive composition improved in exposure latitude and line-edge roughness, a compound usable in such a photosensitive composition, and a patterning method using such a photosensitive composition.

The entire disclosure of each and every foreign patent application from which the benefit of foreign priority has been claimed in the present application is incorporated herein by reference, as if fully set forth.

What is claimed is:

1. A photosensitive composition, comprising
(A) a sulfonium salt represented by formula (I);

$$\left[ Y_1 - \underset{+}{\overset{Y_3}{S}} - Y_2 \right]_n X^{n-} \tag{I}$$

wherein $Y_1$, $Y_2$ and $Y_3$ each independently represents a nitrogen-containing heteroaryl group, an alkyl group, a cycloalkyl group, an aryl group or an alkenyl group, at least one of $Y_1$, $Y_2$ and $Y_3$ represents a nitrogen-containing heteroaryl group, and at least two of $Y_1$, $Y_2$ and $Y_3$ may combine with each other to form a ring; $X^{n-}$ represents an n-valent non-nucleophilic anion; and n represents an integer of 1 to 3.

2. A photosensitive composition according to claim 1, wherein the nitrogen-containing heteroaryl group represented by $Y_1$, $Y_2$ or $Y_3$ is a group selected from a pyrrolyl group, an indolyl group and a carbazolyl group.

3. A photosensitive composition according to claim 1, wherein the sulfonium salt (A) represented by formula (I) is a sulfonium salt represented by formula (ID) or (IE);

(ID)

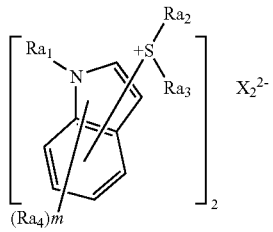

(IE)

wherein $Ra_1$ represents a hydrogen atom, an alkyl group, a cycloalkyl group, an aryl group or an acyl group; $Ra_2$ and $Ra_3$ each independently represents an alkyl group, a cycloalkyl group, an aryl group or an alkenyl group, and $Ra_2$ and $Ra_3$ may combine with each other to form a ring; $Ra_4$, or each of $Ra_4$'s when m is a plural number, independently represents an organic group; $X_1^-$ represents a univalent non-nucleophilic anion; $X_2^{2-}$ represents a divalent non-nucleophilic anion; and m represents an integer of 0 to 3.

4. A compound (A), represented by formula (I);

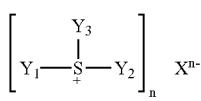

(I)

wherein $Y_1$, $Y_2$ and $Y_3$ each independently represents a nitrogen-containing heteroaryl group, an alkyl group, a cycloalkyl group, an aryl group or an alkenyl group, at least one of $Y_1$, $Y_2$ and $Y_3$ represents a nitrogen-containing heteroaryl group, and at least two of $Y_1$, $Y_2$ and $Y_3$ may combine with each other to form a ring; $X^{n-}$ represents an n-valent non-nucleophilic anion; and n represents an integer of 1 to 3.

5. A patterning method, comprising:
   forming a photosensitive film with a photosensitive composition according to claim 1;
   exposing the photosensitive film to light, so as to form a exposed photosensitive film; and
   developing the exposed photosensitive film.

6. A compound (A), represented by formula (ID) or (IE);

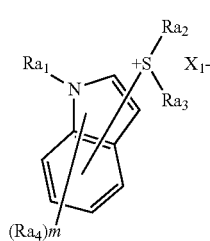

(ID)

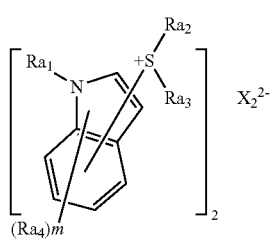

(IE)

wherein $Ra_1$ represents a hydrogen atom, an alkyl group, a cycloalkyl group, an aryl group or an acyl group; $Ra_2$ and $Ra_3$ each independently represents an alkyl group, a cycloalkyl group, an aryl group or an alkenyl group, and $Ra_2$ and $Ra_3$ may combine with each other to form a ring; $Ra_4$, or each of $Ra_4$'s when m is a plural number, independently represents an organic group; $X_1^-$ represents a univalent non-nucleophilic anion; $X_2^{2-}$ represents a divalent non-nucleophilic anion; and m represents an integer of 0 to 3.

7. A photosensitive composition according to claim 1, further comprising (B) a resin capable of decomposing under action of an acid to increase its solubility in an alkali developer.

8. A photosensitive composition according to claim 1, further comprising:
   (D) a resin soluble in an alkali developer; and
   (E) an acid cross-linking agent capable of forming cross-links between molecules of the alkali developer-soluble resin under action of an acid.

9. A photosensitive composition according to claim 7, wherein the resin (B) comprises hydroxystyrene structural units.

10. A photosensitive composition according to claim 7, wherein the resin (B) comprises repeating units having monocyclic or polycyclic hydrocarbon structures.

11. A photosensitive composition according to claim 7, wherein the resin (B) comprises repeating units having alcoholic hydroxyl groups.

12. A photosensitive composition according to claim 11, wherein the repeating units having alcoholic hydroxyl groups are repeating units which each contain at least one structure selected from monohydroxyadamantane structures, dihydroxyadamantane structures and trihydroxyadamantane structures.

13. A photosensitive composition according to claim 7, wherein the resin (B) comprises repeating units having lactone structures.

14. A photosensitive composition according to claim 7, wherein the resin (B) comprises: repeating units derived from methacrylic acid esters of at least one kind; and repeating units derived from acrylic acid esters of at least one kind.

15. A photosensitive composition according to claim 7, wherein the resin (B) comprises a fluorine atom.

16. A photosensitive composition according to claim 15, wherein the resin (B) comprises a hexafluoro-2-propanol structure.

17. A photosensitive composition according to claim 7, further comprising
(C) a dissolution-inhibiting compound having a molecular weight of 3,000 or below which can decompose under action of an acid to increase its solubility in an alkali developer.

18. A photosensitive composition according to claim 7, further comprising a compound selected from:
(F) a basic compound; and
(G) a surfactant containing at least one of a fluorine atom and a silicon atom.

19. A photosensitive composition according to claim 7, wherein the resin (B) comprises:
repeating units of at least one kind selected from 2-alkyl-2-adamantyl (meth)acrylates and dialkyl(1-adamantyl) methyl (meta)acrylates;
lactone structure-containing repeating units of at least one kind; and
repeating units of at least one kind which contain at least two hydroxyl groups per unit.

20. A photosensitive composition according to claim 7, wherein the resin (B) comprises repeating units containing carboxyl groups.

21. A photosensitive composition according to claim 7, wherein the resin (B) comprises:
repeating units of at least one kind selected from 2-alkyl-2-adamantyl (meth)acrylates and dialkyl(1-adamantyl) methyl (meta)acrylates; and
hydroxystyrene structure-containing repeating units of at least one kind.

* * * * *